(12) United States Patent
Lubomirsky

(10) Patent No.: US 11,049,698 B2
(45) Date of Patent: Jun. 29, 2021

(54) DUAL-CHANNEL SHOWERHEAD WITH IMPROVED PROFILE

(71) Applicant: Applied Materials, Inc., Santa Clara, CA (US)

(72) Inventor: Dmitry Lubomirsky, Cupertino, CA (US)

(73) Assignee: Applied Materials, Inc., Santa Clara, CA (US)

(*) Notice: Subject to any disclaimer, the term of this patent is extended or adjusted under 35 U.S.C. 154(b) by 566 days.

(21) Appl. No.: 15/581,635

(22) Filed: Apr. 28, 2017

(65) Prior Publication Data

US 2018/0096819 A1    Apr. 5, 2018

Related U.S. Application Data

(63) Continuation of application No. 15/285,331, filed on Oct. 4, 2016.

(51) Int. Cl.
*H01J 37/32* (2006.01)
*H01L 21/3065* (2006.01)
(Continued)

(52) U.S. Cl.
CPC .... *H01J 37/3244* (2013.01); *H01J 37/32091* (2013.01); *H01J 37/32532* (2013.01);
(Continued)

(58) Field of Classification Search
None
See application file for complete search history.

(56) References Cited

U.S. PATENT DOCUMENTS

| 2,369,620 A | 2/1945 | Sullivan et al. |
| 3,401,302 A | 9/1968 | Thorpe |

(Continued)

FOREIGN PATENT DOCUMENTS

| CN | 1124364 A | 6/1996 |
| CN | 1847450 A | 10/2006 |

(Continued)

OTHER PUBLICATIONS

International Search Report and Written Opinion of PCT/US2018/016261 dated May 21, 2018, all pages.

(Continued)

*Primary Examiner* — Jeffrie R Lund
*Assistant Examiner* — Stanislav Antolin
(74) *Attorney, Agent, or Firm* — Kilpatrick Townsend & Stockton LLP

(57) ABSTRACT

Described processing chambers may include a chamber housing at least partially defining an interior region of the semiconductor processing chamber. The cambers may include a pedestal. The chambers may include a first showerhead positioned between the lid and the processing region, and may include a faceplate positioned between the first showerhead and the processing region. The chambers may also include a second showerhead positioned within the chamber between the faceplate and the processing region of the semiconductor processing chamber. The second showerhead may include at least two plates coupled together to define a volume between the at least two plates. The at least two plates may at least partially define channels through the second showerhead, and each channel may be characterized by a first diameter at a first end of the channel and may be characterized by a plurality of ports at a second end of the channel.

20 Claims, 8 Drawing Sheets

(51) Int. Cl.
*H01L 21/67* (2006.01)
*C23C 16/455* (2006.01)
*C23C 16/50* (2006.01)
*C23C 16/503* (2006.01)
*C23C 16/505* (2006.01)

(52) U.S. Cl.
CPC .... *H01J 37/32715* (2013.01); *H01L 21/3065* (2013.01); *C23C 16/455* (2013.01); *C23C 16/45565* (2013.01); *C23C 16/50* (2013.01); *C23C 16/503* (2013.01); *C23C 16/505* (2013.01); *H01J 2237/334* (2013.01); *H01L 21/6719* (2013.01)

(56) References Cited

U.S. PATENT DOCUMENTS

| | | |
|---|---|---|
| 3,451,840 A | 6/1969 | Hough |
| 3,537,474 A | 11/1970 | Rohrer |
| 3,756,511 A | 9/1973 | Shinroku |
| 3,937,857 A | 2/1976 | Brummett et al. |
| 3,969,077 A | 7/1976 | Hill |
| 4,006,047 A | 2/1977 | Brummett et al. |
| 4,209,357 A | 6/1980 | Gorin et al. |
| 4,214,946 A | 7/1980 | Forget et al. |
| 4,232,060 A | 11/1980 | Mallory, Jr. |
| 4,234,628 A | 11/1980 | DuRose |
| 4,265,943 A | 5/1981 | Goldstein et al. |
| 4,340,462 A | 7/1982 | Koch |
| 4,341,592 A | 7/1982 | Shortes et al. |
| 4,361,418 A | 11/1982 | Tscheppe |
| 4,361,441 A | 11/1982 | Tylko |
| 4,364,803 A | 12/1982 | Nidola et al. |
| 4,368,223 A | 1/1983 | Kobayashi et al. |
| 4,374,698 A | 2/1983 | Sanders et al. |
| 4,397,812 A | 8/1983 | Mallory, Jr. |
| 4,468,413 A | 8/1984 | Bachmann |
| 4,503,807 A | 3/1985 | Nakayama et al. |
| 4,543,110 A | 9/1985 | Engelhardt et al. |
| 4,565,601 A | 1/1986 | Kakehi et al. |
| 4,579,618 A | 4/1986 | Celestino et al. |
| 4,585,920 A | 4/1986 | Hoog et al. |
| 4,600,464 A | 7/1986 | Desliets et al. |
| 4,610,775 A | 9/1986 | Phifer |
| 4,625,678 A | 12/1986 | Shloya et al. |
| 4,632,857 A | 12/1986 | Mallory, Jr. |
| 4,656,052 A | 4/1987 | Satou et al. |
| 4,656,076 A | 4/1987 | Vetanen et al. |
| 4,668,335 A | 5/1987 | Mockler |
| 4,690,746 A | 9/1987 | McInerney et al. |
| 4,715,937 A | 12/1987 | Moslehi et al. |
| 4,749,440 A | 6/1988 | Blackwood et al. |
| 4,753,898 A | 6/1988 | Parrillo et al. |
| 4,786,360 A | 11/1988 | Cote et al. |
| 4,792,378 A | 12/1988 | Rose et al. |
| 4,793,897 A | 12/1988 | Dunfield et al. |
| 4,807,016 A | 2/1989 | Douglas |
| 4,810,520 A | 3/1989 | Wu |
| 4,816,638 A | 3/1989 | Ukai et al. |
| 4,820,377 A | 4/1989 | Davis et al. |
| 4,828,649 A | 5/1989 | Davis |
| 4,857,140 A | 8/1989 | Loewenstein |
| 4,867,841 A | 9/1989 | Loewenstein et al. |
| 4,904,621 A | 2/1990 | Lowenstein et al. |
| 4,913,929 A | 4/1990 | Moslehi et al. |
| 4,919,750 A | 4/1990 | Bausmith et al. |
| 4,946,903 A | 8/1990 | Gardella et al. |
| 4,951,601 A | 8/1990 | Maydan et al. |
| 4,960,488 A | 10/1990 | Law et al. |
| 4,980,018 A | 12/1990 | Mu et al. |
| 4,981,551 A | 1/1991 | Palmour |
| 4,985,372 A | 1/1991 | Narita et al. |
| 4,987,856 A | 1/1991 | Hey et al. |
| 4,991,542 A | 2/1991 | Kohmura et al. |
| 4,992,136 A | 2/1991 | Tachi et al. |
| 4,993,358 A | 2/1991 | Mahawili |
| 4,994,404 A | 2/1991 | Sheng et al. |
| 5,000,113 A | 3/1991 | Wang et al. |
| 5,006,192 A | 4/1991 | Deguchi |
| 5,013,691 A | 5/1991 | Lory et al. |
| 5,028,565 A | 7/1991 | Chang |
| 5,030,319 A | 7/1991 | Nishino et al. |
| 5,038,713 A | 8/1991 | Kawakami et al. |
| 5,045,244 A | 9/1991 | Marlett |
| 5,061,838 A | 10/1991 | Lane et al. |
| 5,069,938 A | 12/1991 | Lorimer et al. |
| 5,074,456 A | 12/1991 | Degner et al. |
| 5,083,030 A | 1/1992 | Stavov |
| 5,089,441 A | 2/1992 | Moslehi |
| 5,089,442 A | 2/1992 | Olmer |
| 5,147,692 A | 9/1992 | Bengston |
| 5,156,881 A | 10/1992 | Okano et al. |
| 5,180,435 A | 1/1993 | Markunas et al. |
| 5,186,718 A | 2/1993 | Tepman et al. |
| 5,188,706 A | 2/1993 | Hori et al. |
| 5,198,034 A | 3/1993 | deBoer et al. |
| 5,200,016 A | 4/1993 | Namose |
| 5,203,911 A | 4/1993 | Sricharoenchalkit et al. |
| 5,215,787 A | 6/1993 | Homma |
| 5,217,559 A | 6/1993 | Moslehi et al. |
| 5,221,427 A | 6/1993 | Koinuma et al. |
| 5,228,501 A | 7/1993 | Tepman et al. |
| 5,231,690 A | 7/1993 | Soma et al. |
| 5,235,139 A | 8/1993 | Bengston et al. |
| 5,238,499 A | 8/1993 | van de Ven et al. |
| 5,240,497 A | 8/1993 | Shacham et al. |
| 5,248,371 A | 9/1993 | Maher et al. |
| 5,248,527 A | 9/1993 | Uchida et al. |
| 5,252,178 A | 10/1993 | Moslehi |
| 5,266,157 A | 11/1993 | Kadomura |
| 5,269,881 A | 12/1993 | Sekiya |
| 5,270,125 A | 12/1993 | America et al. |
| 5,271,972 A | 12/1993 | Kwok et al. |
| 5,274,917 A | 1/1994 | Corbett, III et al. |
| 5,275,977 A | 1/1994 | Otsubo et al. |
| 5,277,750 A | 1/1994 | Wolgang |
| 5,279,669 A | 1/1994 | Lee |
| 5,279,705 A | 1/1994 | Tanaka |
| 5,279,865 A | 1/1994 | Chebi et al. |
| 5,288,518 A | 2/1994 | Homma |
| 5,290,382 A | 3/1994 | Zarowin et al. |
| 5,290,383 A | 3/1994 | Koshimizu |
| 5,292,370 A | 3/1994 | Tsai et al. |
| 5,292,682 A | 3/1994 | Stevens et al. |
| 5,300,463 A | 4/1994 | Cathey et al. |
| 5,302,233 A | 4/1994 | Kim et al. |
| 5,304,250 A | 4/1994 | Sameshima et al. |
| 5,306,530 A | 4/1994 | Strongin et al. |
| 5,314,724 A | 5/1994 | Tsukune et al. |
| 5,318,668 A | 6/1994 | Tamaki et al. |
| 5,319,247 A | 6/1994 | Matsuura |
| 5,326,427 A | 7/1994 | Jerbic |
| 5,328,558 A | 7/1994 | Kawamura et al. |
| 5,328,810 A | 7/1994 | Lowrey et al. |
| 5,330,578 A | 7/1994 | Sakama |
| 5,334,552 A | 8/1994 | Homma |
| 5,345,999 A | 9/1994 | Hosokawa |
| 5,352,636 A | 10/1994 | Beinglass |
| 5,356,478 A | 10/1994 | Chen et al. |
| 5,362,526 A | 11/1994 | Wang et al. |
| 5,366,585 A | 11/1994 | Robertson et al. |
| 5,368,897 A | 11/1994 | Kurihara et al. |
| 5,378,316 A | 1/1995 | Franke et al. |
| 5,380,560 A | 1/1995 | Kaja et al. |
| 5,382,311 A | 1/1995 | Ishikawa et al. |
| 5,384,284 A | 1/1995 | Doan et al. |
| 5,385,763 A | 1/1995 | Okano et al. |
| 5,399,237 A | 3/1995 | Keswick et al. |
| 5,399,529 A | 3/1995 | Homma |
| 5,403,434 A | 4/1995 | Moslehi |
| 5,413,670 A | 5/1995 | Langan et al. |
| 5,413,967 A | 5/1995 | Matsuda et al. |
| 5,415,890 A | 5/1995 | Kloiber et al. |
| 5,416,048 A | 5/1995 | Blalock et al. |

(56) References Cited

U.S. PATENT DOCUMENTS

| | | |
|---|---|---|
| 5,420,075 A | 5/1995 | Homma et al. |
| 5,429,995 A | 7/1995 | Nishiyama et al. |
| 5,439,553 A | 8/1995 | Grant et al. |
| 5,451,169 A | 9/1995 | Corbett, III et al. |
| 5,451,259 A | 9/1995 | Krogh |
| 5,453,124 A * | 9/1995 | Moslehi ............ C23C 16/45561 118/715 |
| 5,454,170 A | 10/1995 | Cook |
| 5,464,499 A | 11/1995 | Moslehi |
| 5,468,342 A | 11/1995 | Nulty et al. |
| 5,474,589 A | 12/1995 | Ohga et al. |
| 5,478,403 A | 12/1995 | Shinigawa et al. |
| 5,478,462 A | 12/1995 | Walsh |
| 5,483,920 A | 1/1996 | Pryor |
| 5,494,494 A | 2/1996 | Mizuno et al. |
| 5,500,249 A | 3/1996 | Telford et al. |
| 5,505,816 A | 4/1996 | Barnes et al. |
| 5,510,216 A | 4/1996 | Calabrese et al. |
| 5,516,367 A | 5/1996 | Lei et al. |
| 5,518,962 A | 5/1996 | Murao |
| 5,531,835 A | 7/1996 | Fodor et al. |
| 5,534,070 A | 7/1996 | Okamura et al. |
| 5,536,360 A | 7/1996 | Nguyen et al. |
| 5,549,780 A | 8/1996 | Koinuma et al. |
| 5,556,521 A | 9/1996 | Ghanbari |
| 5,558,717 A | 9/1996 | Zhao et al. |
| 5,560,779 A | 10/1996 | Knowles et al. |
| 5,563,105 A | 10/1996 | Dobuzinsky et al. |
| 5,567,243 A | 10/1996 | Foster et al. |
| 5,571,576 A | 11/1996 | Qian et al. |
| 5,575,853 A | 11/1996 | Arami et al. |
| 5,578,130 A | 11/1996 | Hayashi et al. |
| 5,578,161 A | 11/1996 | Auda |
| 5,580,385 A | 12/1996 | Paranjpe et al. |
| 5,580,421 A | 12/1996 | Hiatt et al. |
| 5,591,269 A | 1/1997 | Arami et al. |
| 5,592,358 A | 1/1997 | Shamouilian |
| 5,595,606 A | 1/1997 | Fujikawa et al. |
| 5,597,439 A | 1/1997 | Salzman |
| 5,599,740 A | 2/1997 | Jang et al. |
| 5,605,637 A | 2/1997 | Shan et al. |
| 5,614,055 A | 3/1997 | Fairbairn et al. |
| 5,616,518 A | 4/1997 | Foo et al. |
| 5,624,582 A | 4/1997 | Cain |
| 5,626,922 A | 5/1997 | Miyanaga et al. |
| 5,628,829 A | 5/1997 | Foster et al. |
| 5,635,086 A | 6/1997 | Warren, Jr. |
| 5,645,645 A | 7/1997 | Zhang et al. |
| 5,648,125 A | 7/1997 | Cane |
| 5,648,175 A | 7/1997 | Russell et al. |
| 5,656,093 A | 8/1997 | Burkhart et al. |
| 5,660,957 A | 8/1997 | Chou et al. |
| 5,661,093 A | 8/1997 | Ravi et al. |
| 5,670,066 A | 9/1997 | Barnes et al. |
| 5,674,787 A | 10/1997 | Zhao et al. |
| 5,676,758 A | 10/1997 | Hasgawa et al. |
| 5,679,606 A | 10/1997 | Wang et al. |
| 5,685,946 A | 11/1997 | Fathauer et al. |
| 5,688,331 A | 11/1997 | Aruga et al. |
| 5,695,810 A | 12/1997 | Dubin et al. |
| 5,712,185 A | 1/1998 | Tsai et al. |
| 5,716,500 A | 2/1998 | Bardos et al. |
| 5,716,506 A | 2/1998 | Maclay et al. |
| 5,719,085 A | 2/1998 | Moon et al. |
| 5,733,816 A | 3/1998 | Iyer et al. |
| 5,747,373 A | 5/1998 | Yu |
| 5,753,886 A | 5/1998 | Iwamura et al. |
| 5,755,859 A | 5/1998 | Brusic et al. |
| 5,756,400 A | 5/1998 | Ye et al. |
| 5,756,402 A | 5/1998 | Jimbo et al. |
| 5,772,770 A | 6/1998 | Suda et al. |
| 5,781,693 A | 7/1998 | Ballance et al. |
| 5,786,276 A | 7/1998 | Brooks et al. |
| 5,788,825 A | 8/1998 | Park et al. |
| 5,789,300 A | 8/1998 | Fulford |
| 5,792,376 A | 8/1998 | Kanai et al. |
| 5,800,686 A | 9/1998 | Littau et al. |
| 5,804,259 A | 9/1998 | Robles |
| 5,812,403 A | 9/1998 | Fong et al. |
| 5,814,238 A | 9/1998 | Ashby et al. |
| 5,814,365 A | 9/1998 | Mahawill |
| 5,820,723 A | 10/1998 | Benjamin et al. |
| 5,824,599 A | 10/1998 | Schacham-Diamand et al. |
| 5,830,805 A | 11/1998 | Schacham-Diamand et al. |
| 5,835,334 A | 11/1998 | McMillin et al. |
| 5,843,538 A | 12/1998 | Ehrsam et al. |
| 5,843,847 A | 12/1998 | Pu et al. |
| 5,844,195 A | 12/1998 | Fairbairn et al. |
| 5,846,332 A | 12/1998 | Zhao et al. |
| 5,846,373 A | 12/1998 | Pirkle et al. |
| 5,846,375 A | 12/1998 | Gilchrist et al. |
| 5,846,598 A | 12/1998 | Semkow et al. |
| 5,849,639 A | 12/1998 | Molloy et al. |
| 5,850,105 A | 12/1998 | Dawson et al. |
| 5,855,681 A | 1/1999 | Maydan et al. |
| 5,855,685 A | 1/1999 | Tobe et al. |
| 5,856,240 A | 1/1999 | Sinha et al. |
| 5,858,876 A | 1/1999 | Chew |
| 5,863,376 A | 1/1999 | Wicker |
| 5,865,896 A | 2/1999 | Nowak |
| 5,866,483 A | 2/1999 | Shiau et al. |
| 5,868,897 A | 2/1999 | Ohkawa |
| 5,872,052 A | 2/1999 | Iyer |
| 5,872,058 A | 2/1999 | Van Cleemput et al. |
| 5,882,424 A | 3/1999 | Taylor et al. |
| 5,882,786 A | 3/1999 | Nassau et al. |
| 5,883,012 A | 3/1999 | Chiou |
| 5,885,358 A | 3/1999 | Maydan et al. |
| 5,885,404 A | 3/1999 | Kim et al. |
| 5,885,749 A | 3/1999 | Huggins et al. |
| 5,888,906 A | 3/1999 | Sandhu et al. |
| 5,891,349 A | 4/1999 | Tobe et al. |
| 5,891,513 A | 4/1999 | Dubin et al. |
| 5,897,751 A | 4/1999 | Makowiecki |
| 5,899,752 A | 5/1999 | Hey et al. |
| 5,900,163 A | 5/1999 | Yi et al. |
| 5,904,827 A | 5/1999 | Reynolds |
| 5,907,790 A | 5/1999 | Kellam |
| 5,910,340 A | 6/1999 | Uchida et al. |
| 5,913,147 A | 6/1999 | Dubin et al. |
| 5,913,978 A | 6/1999 | Kato et al. |
| 5,915,190 A | 6/1999 | Pirkle |
| 5,918,116 A | 6/1999 | Chittipeddi |
| 5,919,332 A | 7/1999 | Koshiishi et al. |
| 5,920,792 A | 7/1999 | Lin |
| 5,926,737 A | 7/1999 | Ameen et al. |
| 5,928,528 A | 7/1999 | Kubota et al. |
| 5,932,077 A | 8/1999 | Reynolds |
| 5,933,757 A | 8/1999 | Yoshikawa et al. |
| 5,935,334 A | 8/1999 | Fong et al. |
| 5,935,340 A | 8/1999 | Xia et al. |
| 5,937,323 A | 8/1999 | Orczyk et al. |
| 5,939,831 A | 8/1999 | Fong et al. |
| 5,942,075 A | 8/1999 | Nagahata et al. |
| 5,944,049 A | 8/1999 | Beyer et al. |
| 5,944,902 A | 8/1999 | Redeker et al. |
| 5,948,702 A | 9/1999 | Rotondaro |
| 5,951,601 A | 9/1999 | Lesinski et al. |
| 5,951,776 A | 9/1999 | Selyutin et al. |
| 5,951,896 A | 9/1999 | Mahawill |
| 5,953,591 A | 9/1999 | Ishihara et al. |
| 5,953,635 A | 9/1999 | Andideh |
| 5,963,840 A | 10/1999 | Xia et al. |
| 5,968,379 A | 10/1999 | Zhao et al. |
| 5,968,587 A | 10/1999 | Frankel et al. |
| 5,968,610 A | 10/1999 | Liu et al. |
| 5,969,422 A | 10/1999 | Ting et al. |
| 5,976,327 A | 11/1999 | Tanaka |
| 5,982,100 A | 11/1999 | Ghanbari |
| 5,990,000 A | 11/1999 | Hong et al. |
| 5,990,013 A | 11/1999 | Berenguer et al. |
| 5,993,916 A | 11/1999 | Zhao et al. |
| 5,994,209 A | 11/1999 | Yieh et al. |
| 5,997,721 A | 12/1999 | Limbach et al. |

(56) References Cited

U.S. PATENT DOCUMENTS

| | | |
|---|---|---|
| 5,997,962 A | 12/1999 | Ogasawara et al. |
| 6,004,884 A | 12/1999 | Abraham |
| 6,007,635 A | 12/1999 | Mahawill |
| 6,007,785 A | 12/1999 | Liou |
| 6,010,962 A | 1/2000 | Liu et al. |
| 6,013,191 A | 1/2000 | Nasser-Faili et al. |
| 6,013,584 A | 1/2000 | M'Saad |
| 6,015,724 A | 1/2000 | Yamazaki et al. |
| 6,015,747 A | 1/2000 | Lopatin et al. |
| 6,017,414 A | 1/2000 | Koemtzopoulos et al. |
| 6,143,158 A | 1/2000 | Nishino et al. |
| 6,019,848 A | 2/2000 | Kiyama et al. |
| 6,020,271 A | 2/2000 | Yanagida |
| 6,022,446 A | 2/2000 | Shan et al. |
| 6,030,666 A | 2/2000 | Lam et al. |
| 6,030,881 A | 2/2000 | Papasouliotis et al. |
| 6,035,101 A | 3/2000 | Sajoto et al. |
| 6,036,878 A | 3/2000 | Collins et al. |
| 6,037,018 A | 3/2000 | Jang et al. |
| 6,037,266 A | 3/2000 | Tao et al. |
| 6,039,834 A | 3/2000 | Tanaka et al. |
| 6,039,851 A | 3/2000 | Iyer |
| 6,050,085 A * | 4/2000 | Mayer ............... F02K 9/52 239/424 |
| 6,053,982 A | 4/2000 | Halpin et al. |
| 6,059,643 A | 5/2000 | Hu et al. |
| 6,063,683 A | 5/2000 | Wu et al. |
| 6,063,712 A | 5/2000 | Gilton et al. |
| 6,065,424 A | 5/2000 | Shacham-Diamand et al. |
| 6,065,425 A | 5/2000 | Takaki et al. |
| 6,072,147 A | 6/2000 | Koshiishi |
| 6,072,227 A | 6/2000 | Yau et al. |
| 6,074,512 A | 6/2000 | Collins et al. |
| 6,074,514 A | 6/2000 | Bjorkman et al. |
| 6,077,384 A | 6/2000 | Collins et al. |
| 6,077,386 A | 6/2000 | Smith, Jr. et al. |
| 6,077,780 A | 6/2000 | Dubin |
| 6,080,446 A * | 6/2000 | Tobe ............... C23C 16/34 257/E21.168 |
| 6,080,529 A | 6/2000 | Ye et al. |
| 6,081,414 A | 6/2000 | Flanigan et al. |
| 6,083,344 A | 7/2000 | Hanawa et al. |
| 6,083,844 A | 7/2000 | Bui-Le et al. |
| 6,086,677 A | 7/2000 | Umotoy et al. |
| 6,087,278 A | 7/2000 | Kim et al. |
| 6,090,212 A | 7/2000 | Mahawill |
| 6,093,457 A | 7/2000 | Okumura |
| 6,093,594 A | 7/2000 | Yeap et al. |
| 6,099,697 A | 8/2000 | Hausmann |
| 6,107,199 A | 8/2000 | Allen et al. |
| 6,110,530 A | 8/2000 | Chen et al. |
| 6,110,556 A | 8/2000 | Bang et al. |
| 6,110,832 A | 8/2000 | Morgan et al. |
| 6,110,836 A | 8/2000 | Cohen et al. |
| 6,110,838 A | 8/2000 | Loewenstein |
| 6,113,771 A | 9/2000 | Landau et al. |
| 6,114,216 A | 9/2000 | Yieh et al. |
| 6,117,245 A | 9/2000 | Mandrekar et al. |
| 6,120,640 A | 9/2000 | Shih et al. |
| 6,124,003 A | 9/2000 | Mikami et al. |
| 6,126,753 A | 10/2000 | Shinriki et al. |
| 6,132,512 A | 10/2000 | Horie et al. |
| 6,136,163 A | 10/2000 | Cheung et al. |
| 6,136,165 A | 10/2000 | Moslehi et al. |
| 6,136,685 A | 10/2000 | Narwankar et al. |
| 6,136,693 A | 10/2000 | Chan et al. |
| 6,140,234 A | 10/2000 | Uzoh et al. |
| 6,144,099 A | 11/2000 | Lopatin et al. |
| 6,147,009 A | 11/2000 | Grill et al. |
| 6,148,761 A | 11/2000 | Majewski et al. |
| 6,149,828 A | 11/2000 | Vaartstra |
| 6,150,628 A | 11/2000 | Smith et al. |
| 6,153,935 A | 11/2000 | Edelstein et al. |
| 6,161,500 A | 12/2000 | Kopacz et al. |
| 6,161,576 A | 12/2000 | Maher et al. |
| 6,162,302 A | 12/2000 | Raghavan et al. |
| 6,165,912 A | 12/2000 | McConnell et al. |
| 6,167,834 B1 | 1/2001 | Wang et al. |
| 6,169,021 B1 | 1/2001 | Akram et al. |
| 6,170,428 B1 | 1/2001 | Redeker et al. |
| 6,170,429 B1 | 1/2001 | Schoepp |
| 6,171,661 B1 | 1/2001 | Zheng et al. |
| 6,174,450 B1 | 1/2001 | Patrick et al. |
| 6,174,812 B1 | 1/2001 | Hsuing et al. |
| 6,176,198 B1 | 1/2001 | Kao et al. |
| 6,176,667 B1 | 1/2001 | Fairbairn |
| 6,177,245 B1 | 1/2001 | Ward et al. |
| 6,178,919 B1 | 1/2001 | Li et al. |
| 6,179,924 B1 | 1/2001 | Zhao et al. |
| 6,180,523 B1 | 1/2001 | Lee et al. |
| 6,182,602 B1 | 2/2001 | Redeker et al. |
| 6,182,603 B1 | 2/2001 | Shang et al. |
| 6,184,121 B1 | 2/2001 | Buchwalter et al. |
| 6,184,489 B1 | 2/2001 | Ito et al. |
| 6,186,091 B1 | 2/2001 | Chu et al. |
| 6,189,483 B1 | 2/2001 | Ishikawa et al. |
| 6,190,233 B1 | 2/2001 | Hong et al. |
| 6,194,038 B1 | 2/2001 | Rossman |
| 6,197,181 B1 | 3/2001 | Chen |
| 6,197,364 B1 | 3/2001 | Paunovic et al. |
| 6,197,680 B1 | 3/2001 | Lin et al. |
| 6,197,688 B1 | 3/2001 | Simpson |
| 6,197,705 B1 | 3/2001 | Vassiliev |
| 6,198,616 B1 | 3/2001 | Dahimene et al. |
| 6,200,412 B1 | 3/2001 | Kilgore et al. |
| 6,203,620 B1 | 3/2001 | Moslehi |
| 6,203,863 B1 | 3/2001 | Liu et al. |
| 6,204,200 B1 | 3/2001 | Shieh et al. |
| 6,210,486 B1 | 4/2001 | Mizukami et al. |
| 6,217,658 B1 | 4/2001 | Orczyk et al. |
| 6,220,201 B1 | 4/2001 | Nowak |
| 6,225,745 B1 | 5/2001 | Srivastava |
| 6,228,233 B1 | 5/2001 | Lakshmikanthan et al. |
| 6,228,751 B1 | 5/2001 | Yamazaki et al. |
| 6,228,758 B1 | 5/2001 | Pellerin et al. |
| 6,235,643 B1 | 5/2001 | Mui et al. |
| 6,237,527 B1 | 5/2001 | Kellerman et al. |
| 6,238,513 B1 | 5/2001 | Arnold et al. |
| 6,238,582 B1 | 5/2001 | Williams et al. |
| 6,197,151 B1 | 6/2001 | Kaji et al. |
| 6,241,845 B1 | 6/2001 | Gadgil et al. |
| 6,242,349 B1 | 6/2001 | Nogami et al. |
| 6,242,360 B1 | 6/2001 | Fischer et al. |
| 6,244,211 B1 | 6/2001 | Nishikawa et al. |
| 6,245,396 B1 | 6/2001 | Nogami |
| 6,245,670 B1 | 6/2001 | Cheung et al. |
| 6,251,236 B1 | 6/2001 | Stevens |
| 6,251,802 B1 | 6/2001 | Moore et al. |
| 6,258,170 B1 | 7/2001 | Somekh et al. |
| 6,258,220 B1 | 7/2001 | Dordi et al. |
| 6,258,223 B1 | 7/2001 | Cheung et al. |
| 6,258,270 B1 | 7/2001 | Hilgendorff et al. |
| 6,261,637 B1 | 7/2001 | Oberle |
| 6,267,074 B1 | 7/2001 | Okumura |
| 6,277,733 B1 | 8/2001 | Smith |
| 6,277,752 B1 | 8/2001 | Chen |
| 6,277,763 B1 | 8/2001 | Kugimiya et al. |
| 6,281,072 B1 | 8/2001 | Li et al. |
| 6,281,135 B1 | 8/2001 | Han et al. |
| 6,284,146 B1 | 9/2001 | Kim et al. |
| 6,287,643 B1 | 9/2001 | Powell et al. |
| 6,291,282 B1 | 9/2001 | Wilk et al. |
| 6,291,348 B1 | 9/2001 | Lopatin et al. |
| 6,302,964 B1 | 10/2001 | Umotoy et al. |
| 6,303,044 B1 | 10/2001 | Koemtzopoulos |
| 6,303,418 B1 | 10/2001 | Cha et al. |
| 6,306,246 B1 | 10/2001 | Melvin et al. |
| 6,306,772 B1 | 10/2001 | Lin |
| 6,308,654 B1 | 10/2001 | Schneider et al. |
| 6,308,776 B1 | 10/2001 | Sloan |
| 6,310,755 B1 | 10/2001 | Busato et al. |
| 6,312,554 B1 | 11/2001 | Ye |
| 6,312,995 B1 | 11/2001 | Yu |
| 6,319,387 B1 | 11/2001 | Krishnamoorthy et al. |

(56) References Cited

U.S. PATENT DOCUMENTS

| | | | |
|---|---|---|---|
| 6,321,587 B1 | 11/2001 | Laush |
| 6,322,716 B1 | 11/2001 | Qiao et al. |
| 6,323,128 B1 | 11/2001 | Sambucetti et al. |
| 6,329,297 B1 | 12/2001 | Balish et al. |
| 6,335,288 B1 | 1/2002 | Kwan et al. |
| 6,340,435 B1 | 1/2002 | Bjorkman et al. |
| 6,342,733 B1 | 1/2002 | Hu et al. |
| RE37,546 E | 2/2002 | Mahawili |
| 6,344,410 B1 | 2/2002 | Lopatin et al. |
| 6,348,407 B1 | 2/2002 | Gupta et al. |
| 6,350,320 B1 | 2/2002 | Sherstinsky et al. |
| 6,350,697 B1 | 2/2002 | Richardson |
| 6,351,013 B1 | 2/2002 | Luning et al. |
| 6,352,081 B1 | 3/2002 | Lu et al. |
| 6,355,573 B1 | 3/2002 | Okumura |
| 6,358,827 B1 | 3/2002 | Chen et al. |
| 6,364,949 B1 | 4/2002 | Or et al. |
| 6,364,954 B2 | 4/2002 | Umotoy et al. |
| 6,364,957 B1 | 4/2002 | Schneider et al. |
| 6,364,958 B1 | 4/2002 | Lai et al. |
| 6,372,657 B1 | 4/2002 | Hineman et al. |
| 6,375,748 B1 | 4/2002 | Yudovsky et al. |
| 6,376,386 B1 | 4/2002 | Oshima |
| 6,379,575 B1 | 4/2002 | Yin et al. |
| 6,383,896 B1 | 5/2002 | Kirimura et al. |
| 6,383,951 B1 | 5/2002 | Li |
| 6,387,182 B1 | 5/2002 | Horie et al. |
| 6,387,207 B1 | 5/2002 | Janakiraman et al. |
| 6,391,753 B1 | 5/2002 | Yu |
| 6,395,150 B1 | 5/2002 | Van Cleemput et al. |
| 6,403,491 B1 | 6/2002 | Liu et al. |
| 6,415,736 B1 | 7/2002 | Hao et al. |
| 6,416,647 B1 | 7/2002 | Dordi et al. |
| 6,418,874 B1 | 7/2002 | Cox et al. |
| 6,423,284 B1 | 7/2002 | Arno |
| 6,427,623 B2 | 8/2002 | Ko |
| 6,429,465 B1 | 8/2002 | Yagi et al. |
| 6,432,819 B1 | 8/2002 | Pavate et al. |
| 6,432,831 B2 | 8/2002 | Dhindsa et al. |
| 6,436,193 B1 | 8/2002 | Kasai et al. |
| 6,436,816 B1 | 8/2002 | Lee et al. |
| 6,437,512 B1 | 8/2002 | Chen et al. |
| 6,440,863 B1 | 8/2002 | Tsai et al. |
| 6,441,492 B1 | 8/2002 | Cunningham |
| 6,444,083 B1 | 9/2002 | Steger et al. |
| 6,446,572 B1 | 9/2002 | Brcka |
| 6,447,636 B1 | 9/2002 | Qian et al. |
| 6,448,537 B1 | 9/2002 | Nering |
| 6,458,718 B1 | 10/2002 | Todd |
| 6,461,974 B1 | 10/2002 | Ni et al. |
| 6,462,371 B1 | 10/2002 | Weimer et al. |
| 6,463,782 B1 | 10/2002 | Shen et al. |
| 6,464,795 B1 | 10/2002 | Sherstinsky et al. |
| 6,465,051 B1 | 10/2002 | Sahin et al. |
| 6,465,366 B1 | 10/2002 | Nemani et al. |
| 6,471,779 B1 * | 10/2002 | Nishio ............ C23C 16/455 118/715 |
| 6,477,980 B1 | 11/2002 | White et al. |
| 6,479,373 B2 | 11/2002 | Dreybrodt et al. |
| 6,488,984 B1 | 12/2002 | Wada et al. |
| 6,494,959 B1 | 12/2002 | Samoilov et al. |
| 6,499,425 B1 * | 12/2002 | Sandhu ............ C23C 16/34 118/723 E |
| 6,500,728 B1 | 12/2002 | Wang |
| 6,503,843 B1 | 1/2003 | Xia et al. |
| 6,506,291 B2 | 1/2003 | Tsai et al. |
| 6,509,283 B1 | 1/2003 | Thomas |
| 6,509,623 B2 | 1/2003 | Zhao |
| 6,514,377 B1 | 2/2003 | Morimoto et al. |
| 6,516,815 B1 | 2/2003 | Stevens et al. |
| 6,518,548 B2 | 2/2003 | Sugaya et al. |
| 6,527,968 B1 | 3/2003 | Wang et al. |
| 6,528,409 B1 | 3/2003 | Lopatin et al. |
| 6,528,751 B1 | 3/2003 | Hoffman et al. |
| 6,531,069 B1 | 3/2003 | Srivastava et al. |
| 6,537,707 B1 | 3/2003 | Lee |
| 6,537,733 B2 | 3/2003 | Campana et al. |
| 6,541,397 B1 | 4/2003 | Bencher |
| 6,541,671 B1 | 4/2003 | Martinez et al. |
| 6,544,340 B2 | 4/2003 | Yudovsky |
| 6,547,977 B1 | 4/2003 | Yan et al. |
| 6,551,924 B1 | 4/2003 | Dalton et al. |
| 6,558,564 B1 | 5/2003 | Loewenhardt |
| 6,565,661 B1 * | 5/2003 | Nguyen ............ C23C 16/45565 118/715 |
| 6,565,729 B2 | 5/2003 | Chen et al. |
| 6,569,773 B1 | 5/2003 | Gellrich et al. |
| 6,572,937 B2 | 6/2003 | Hakovirta et al. |
| 6,573,030 B1 | 6/2003 | Fairbairn et al. |
| 6,573,606 B2 | 6/2003 | Sambucetti et al. |
| 6,576,151 B1 | 6/2003 | Vereecke et al. |
| 6,585,851 B1 | 7/2003 | Ohmi et al. |
| 6,586,163 B1 | 7/2003 | Okabe et al. |
| 6,596,599 B1 | 7/2003 | Guo |
| 6,596,654 B1 | 7/2003 | Bayman et al. |
| 6,602,434 B1 | 8/2003 | Hung et al. |
| 6,603,269 B1 | 8/2003 | Vo et al. |
| 6,605,874 B2 | 8/2003 | Leu et al. |
| 6,616,967 B1 | 9/2003 | Test |
| 6,627,532 B1 | 9/2003 | Gaillard et al. |
| 6,635,578 B1 | 10/2003 | Xu et al. |
| 6,638,810 B2 | 10/2003 | Bakli et al. |
| 6,638,855 B1 | 10/2003 | Chang et al. |
| 6,645,301 B2 | 11/2003 | Sainty et al. |
| 6,645,550 B1 | 11/2003 | Cheung et al. |
| 6,656,831 B1 | 12/2003 | Lee et al. |
| 6,656,837 B2 | 12/2003 | Xu et al. |
| 6,656,848 B1 | 12/2003 | Scanlan et al. |
| 6,663,715 B1 | 12/2003 | Yuda et al. |
| 6,673,200 B1 | 1/2004 | Gu et al. |
| 6,677,242 B1 | 1/2004 | Liu et al. |
| 6,679,981 B1 | 1/2004 | Pan et al. |
| 6,688,375 B1 | 2/2004 | Turner |
| 6,692,903 B2 | 2/2004 | Chen et al. |
| 6,713,356 B1 | 3/2004 | Skotnicki et al. |
| 6,713,835 B1 | 3/2004 | Horak et al. |
| 6,717,189 B2 | 4/2004 | Inoue et al. |
| 6,720,213 B1 | 4/2004 | Gambino et al. |
| 6,733,620 B1 | 5/2004 | Sugiyama et al. |
| 6,736,147 B2 | 5/2004 | Satoh et al. |
| 6,740,247 B1 | 5/2004 | Han et al. |
| 6,740,585 B2 | 5/2004 | Yoon et al. |
| 6,740,977 B2 | 5/2004 | Ahn et al. |
| 6,743,473 B1 | 6/2004 | Parkhe et al. |
| 6,743,732 B1 | 6/2004 | Lin et al. |
| 6,756,235 B1 | 6/2004 | Liu et al. |
| 6,759,261 B2 | 7/2004 | Shimokohbe et al. |
| 6,762,127 B2 | 7/2004 | Boiteux et al. |
| 6,762,435 B2 | 7/2004 | Towle |
| 6,764,958 B1 | 7/2004 | Nemani et al. |
| 6,765,273 B1 | 7/2004 | Chau et al. |
| 6,767,834 B2 | 7/2004 | Chung et al. |
| 6,768,079 B2 | 7/2004 | Kosakai |
| 6,770,166 B1 | 8/2004 | Fisher |
| 6,772,827 B2 | 8/2004 | Keller et al. |
| 6,779,481 B2 | 8/2004 | Kent et al. |
| 6,792,889 B2 | 9/2004 | Nakano et al. |
| 6,794,290 B1 | 9/2004 | Papasouliotis et al. |
| 6,794,311 B2 | 9/2004 | Huang et al. |
| 6,796,314 B1 | 9/2004 | Graff et al. |
| 6,797,189 B2 | 9/2004 | Hung et al. |
| 6,797,634 B2 | 9/2004 | Suzuki |
| 6,800,336 B1 | 10/2004 | Fornsel et al. |
| 6,800,830 B2 | 10/2004 | Mahawili |
| 6,802,944 B2 | 10/2004 | Ahmad et al. |
| 6,808,564 B2 | 10/2004 | Dietze |
| 6,808,747 B1 | 10/2004 | Shih et al. |
| 6,808,748 B2 | 10/2004 | Kapoor et al. |
| 6,818,561 B1 | 11/2004 | Sonderman |
| 6,821,571 B2 | 11/2004 | Huang |
| 6,823,589 B2 | 11/2004 | White et al. |
| 6,826,451 B2 | 11/2004 | del Puerto et al. |
| 6,828,241 B2 | 12/2004 | Kholodenko et al. |
| 6,830,624 B2 | 12/2004 | Janakiraman et al. |

(56) References Cited

U.S. PATENT DOCUMENTS

| | | |
|---|---|---|
| 6,835,995 B2 | 12/2004 | Li |
| 6,838,684 B2 | 1/2005 | Bakker et al. |
| 6,846,401 B2 | 1/2005 | Wijenberg et al. |
| 6,846,745 B1 | 1/2005 | Papasouliotis et al. |
| 6,849,854 B2 | 2/2005 | Sainty |
| 6,852,550 B2 | 2/2005 | Tuttle et al. |
| 6,853,533 B2 | 2/2005 | Parkhe et al. |
| 6,858,153 B2 | 2/2005 | Bjorkman et al. |
| 6,861,097 B1 | 3/2005 | Goosey et al. |
| 6,861,332 B2 | 3/2005 | Park et al. |
| 6,869,880 B2 | 3/2005 | Krishnaraj et al. |
| 6,872,909 B2 | 3/2005 | Holber et al. |
| 6,875,280 B2 | 4/2005 | Ikeda et al. |
| 6,878,206 B2 | 4/2005 | Tzu et al. |
| 6,879,981 B2 | 4/2005 | Rothschild et al. |
| 6,883,733 B1 * | 4/2005 | Lind ............... C23C 16/45565 239/423 |
| 6,886,491 B2 | 5/2005 | Kim et al. |
| 6,892,669 B2 | 5/2005 | Xu et al. |
| 6,893,967 B1 | 5/2005 | Wright et al. |
| 6,897,532 B1 | 5/2005 | Schwarz et al. |
| 6,900,596 B2 | 5/2005 | Yang et al. |
| 6,903,511 B2 | 6/2005 | Chistyakov |
| 6,908,862 B2 | 6/2005 | Li et al. |
| 6,911,112 B2 | 6/2005 | An |
| 6,911,401 B2 | 6/2005 | Khandan et al. |
| 6,916,399 B1 | 7/2005 | Rozenzon et al. |
| 6,921,556 B2 | 7/2005 | Shimizu et al. |
| 6,924,191 B2 | 8/2005 | Liu et al. |
| 6,930,047 B2 | 8/2005 | Yamazaki |
| 6,935,269 B2 | 8/2005 | Lee et al. |
| 6,942,753 B2 | 9/2005 | Choi et al. |
| 6,946,033 B2 | 9/2005 | Tsuei et al. |
| 6,951,821 B2 | 10/2005 | Hamelin et al. |
| 6,958,175 B2 | 10/2005 | Sakamoto et al. |
| 6,958,286 B2 | 10/2005 | Chen et al. |
| 6,969,619 B1 | 11/2005 | Winniczek |
| 6,972,840 B1 | 12/2005 | Gu et al. |
| 6,974,523 B2 | 12/2005 | Benzing et al. |
| 6,995,073 B2 | 2/2006 | Liou |
| 7,017,269 B2 | 3/2006 | White et al. |
| 7,017,514 B1 | 3/2006 | Shepherd |
| 7,018,941 B2 | 3/2006 | Cui et al. |
| 7,030,034 B2 | 4/2006 | Fucsko et al. |
| 7,037,846 B2 | 5/2006 | Srivastava et al. |
| 7,049,200 B2 | 5/2006 | Arghavani et al. |
| 7,049,244 B2 | 5/2006 | Becker et al. |
| 7,052,553 B1 | 5/2006 | Shih et al. |
| 7,071,532 B2 | 7/2006 | Geffken et al. |
| 7,084,070 B1 | 8/2006 | Lee et al. |
| 7,115,525 B2 | 10/2006 | Abatchev et al. |
| 7,122,949 B2 | 10/2006 | Strikovski |
| 7,138,767 B2 | 11/2006 | Chen et al. |
| 7,145,725 B2 | 12/2006 | Hasel et al. |
| 7,148,155 B1 | 12/2006 | Tarafdar et al. |
| 7,153,779 B2 | 12/2006 | Trapp |
| 7,166,233 B2 | 1/2007 | Johnson et al. |
| 7,183,214 B2 | 2/2007 | Nam et al. |
| 7,196,342 B2 | 3/2007 | Ershov et al. |
| 7,226,805 B2 | 6/2007 | Hallin et al. |
| 7,235,137 B2 | 6/2007 | Kitayama et al. |
| 7,244,474 B2 | 7/2007 | Hanawa et al. |
| 7,252,011 B2 | 8/2007 | Traverso |
| 7,252,716 B2 | 8/2007 | Kim et al. |
| 7,253,123 B2 | 8/2007 | Arghavani et al. |
| 7,255,773 B2 | 8/2007 | Ogasawara et al. |
| 7,256,370 B2 | 8/2007 | Guiver |
| 7,274,004 B2 | 9/2007 | Benjamin et al. |
| 7,288,482 B2 | 10/2007 | Panda et al. |
| 7,291,360 B2 | 11/2007 | Hanawa et al. |
| 7,297,894 B1 | 11/2007 | Tsukamoto |
| 7,316,761 B2 | 1/2008 | Doan et al. |
| 7,329,608 B2 | 2/2008 | Babayan et al. |
| 7,341,633 B2 | 3/2008 | Lubomirsky et al. |
| 7,344,912 B1 | 3/2008 | Okoroanyanwu |
| 7,358,192 B2 | 4/2008 | Merry et al. |
| 7,361,865 B2 | 4/2008 | Maki et al. |
| 7,364,956 B2 | 4/2008 | Saito |
| 7,365,016 B2 | 4/2008 | Ouellet et al. |
| 7,396,480 B2 | 7/2008 | Kao et al. |
| 7,396,773 B1 | 7/2008 | Blosse et al. |
| 7,416,989 B1 | 8/2008 | Liu et al. |
| 7,465,358 B2 | 12/2008 | Weidman et al. |
| 7,465,953 B1 | 12/2008 | Koh et al. |
| 7,468,319 B2 | 12/2008 | Lee |
| 7,479,303 B2 | 1/2009 | Byun et al. |
| 7,484,473 B2 | 2/2009 | Keller et al. |
| 7,488,688 B2 | 2/2009 | Chung et al. |
| 7,494,545 B2 | 2/2009 | Lam et al. |
| 7,500,445 B2 | 3/2009 | Zhao et al. |
| 7,504,040 B2 | 3/2009 | Lijima et al. |
| 7,513,214 B2 | 4/2009 | Okumura et al. |
| 7,520,957 B2 | 4/2009 | Kao et al. |
| 7,543,546 B2 | 6/2009 | Shibata et al. |
| 7,553,756 B2 | 6/2009 | Hayashi et al. |
| 7,575,007 B2 | 8/2009 | Tang et al. |
| 7,581,511 B2 | 9/2009 | Mardian et al. |
| 7,604,708 B2 | 10/2009 | Wood et al. |
| 7,611,980 B2 | 11/2009 | Wells |
| 7,628,897 B2 | 12/2009 | Mungekar et al. |
| 7,658,799 B2 | 2/2010 | Ishikawa et al. |
| 7,682,518 B2 | 3/2010 | Chandrachood et al. |
| 7,695,590 B2 | 4/2010 | Hanawa et al. |
| 7,708,859 B2 | 5/2010 | Huang et al. |
| 7,722,925 B2 | 5/2010 | White et al. |
| 7,723,221 B2 | 5/2010 | Hayashi |
| 7,749,326 B2 | 7/2010 | Kim et al. |
| 7,780,790 B2 | 8/2010 | Nogami |
| 7,785,672 B2 | 8/2010 | Choi et al. |
| 7,790,634 B2 | 9/2010 | Munro et al. |
| 7,806,077 B2 | 10/2010 | Lee et al. |
| 7,806,078 B2 | 10/2010 | Yoshida |
| 7,807,578 B2 | 10/2010 | Bencher et al. |
| 7,825,038 B2 | 11/2010 | Ingle et al. |
| 7,837,828 B2 | 11/2010 | Ikeda et al. |
| 7,845,309 B2 | 12/2010 | Condrashoff et al. |
| 7,867,926 B2 | 1/2011 | Satoh et al. |
| 7,906,818 B2 | 3/2011 | Pekny |
| 7,915,139 B1 | 3/2011 | Lang et al. |
| 7,922,863 B2 | 4/2011 | Ripley |
| 7,932,181 B2 | 4/2011 | Singh et al. |
| 7,939,422 B2 | 5/2011 | Ingle et al. |
| 7,968,441 B2 | 6/2011 | Xu |
| 7,976,631 B2 | 7/2011 | Burrows |
| 7,981,806 B2 | 7/2011 | Jung |
| 7,989,365 B2 | 8/2011 | Park et al. |
| 8,008,166 B2 | 8/2011 | Sanchez et al. |
| 8,048,811 B2 | 11/2011 | Feustel et al. |
| 8,058,179 B1 | 11/2011 | Draeger et al. |
| 8,071,482 B2 | 12/2011 | Kawada |
| 8,074,599 B2 | 12/2011 | Choi et al. |
| 8,076,198 B2 | 12/2011 | Lee et al. |
| 8,083,853 B2 | 12/2011 | Choi et al. |
| 8,114,245 B2 | 2/2012 | Ohmi et al. |
| 8,119,530 B2 | 2/2012 | Hori et al. |
| 8,133,349 B1 | 3/2012 | Panagopoulos |
| 8,173,228 B2 | 5/2012 | Choi et al. |
| 8,183,134 B2 | 5/2012 | Wu |
| 8,187,486 B1 | 5/2012 | Liu et al. |
| 8,199,454 B2 | 6/2012 | Koyama et al. |
| 8,211,808 B2 | 7/2012 | Sapre et al. |
| 8,216,486 B2 | 7/2012 | Dhindsa |
| 8,222,128 B2 | 7/2012 | Sasaki et al. |
| 8,252,194 B2 | 8/2012 | Kiehlbauch et al. |
| 8,272,346 B2 | 9/2012 | Bettencourt et al. |
| 8,295,089 B2 | 10/2012 | Jeong et al. |
| 8,298,627 B2 | 10/2012 | Minami et al. |
| 8,309,440 B2 | 11/2012 | Sanchez et al. |
| 8,312,839 B2 | 11/2012 | Baek |
| 8,313,610 B2 | 11/2012 | Dhindsa |
| 8,328,939 B2 | 12/2012 | Choi et al. |
| 8,329,262 B2 | 12/2012 | Miller et al. |
| 8,336,188 B2 | 12/2012 | Monteen |
| 8,343,306 B2 | 1/2013 | Tanaka et al. |

(56) References Cited

U.S. PATENT DOCUMENTS

| | | |
|---|---|---|
| 8,357,435 B2 | 1/2013 | Lubomirsky |
| 8,361,892 B2 | 1/2013 | Tam et al. |
| 8,368,308 B2 | 2/2013 | Banna et al. |
| 8,390,980 B2 | 3/2013 | Sansoni et al. |
| 8,398,777 B2 | 3/2013 | Collins et al. |
| 8,427,067 B2 | 4/2013 | Espiau et al. |
| 8,435,902 B2 | 5/2013 | Tang et al. |
| 8,440,523 B1 | 5/2013 | Guillorn et al. |
| 8,466,073 B2 | 6/2013 | Wang et al. |
| 8,475,674 B2 | 7/2013 | Thadani et al. |
| 8,480,850 B2 | 7/2013 | Tyler et al. |
| 8,491,805 B2 | 7/2013 | Kushibiki et al. |
| 8,501,629 B2 | 8/2013 | Tang et al. |
| 8,506,713 B2 | 8/2013 | Takagi |
| 8,512,509 B2 | 8/2013 | Bera et al. |
| 8,528,889 B2 | 9/2013 | Sansoni et al. |
| 8,540,844 B2 | 9/2013 | Hudson et al. |
| 8,551,891 B2 | 10/2013 | Liang |
| 8,573,152 B2 | 11/2013 | De La Llera |
| 8,622,021 B2 | 1/2014 | Taylor et al. |
| 8,623,471 B2 | 1/2014 | Tyler et al. |
| 8,633,423 B2 | 1/2014 | Lin et al. |
| 8,642,481 B2 | 2/2014 | Wang et al. |
| 8,652,298 B2 | 2/2014 | Dhindsa et al. |
| 8,668,836 B2 | 3/2014 | Mizukami et al. |
| 8,679,354 B2 | 3/2014 | O'Hara |
| 8,679,982 B2 | 3/2014 | Wang et al. |
| 8,679,983 B2 | 3/2014 | Wang et al. |
| 8,691,023 B2 | 4/2014 | Bao et al. |
| 8,702,902 B2 | 4/2014 | Blom et al. |
| 8,741,778 B2 | 6/2014 | Yang et al. |
| 8,747,610 B2 | 6/2014 | Chen et al. |
| 8,747,680 B1 | 6/2014 | Deshpande |
| 8,748,322 B1 | 6/2014 | Fung et al. |
| 8,765,574 B2 | 7/2014 | Zhang et al. |
| 8,771,536 B2 | 7/2014 | Zhang et al. |
| 8,771,539 B2 | 7/2014 | Zhang et al. |
| 8,772,888 B2 | 7/2014 | Jung et al. |
| 8,778,079 B2 | 7/2014 | Begarney et al. |
| 8,801,952 B1 | 8/2014 | Wang et al. |
| 8,802,572 B2 | 8/2014 | Nemani et al. |
| 8,808,563 B2 | 8/2014 | Wang et al. |
| 8,815,720 B2 | 8/2014 | Godet et al. |
| 8,835,316 B2 | 9/2014 | Yin et al. |
| 8,846,163 B2 | 9/2014 | Kao et al. |
| 8,869,742 B2 | 10/2014 | Dhindsa |
| 8,871,651 B1 | 10/2014 | Choi et al. |
| 8,888,087 B2 | 11/2014 | Okabe et al. |
| 8,895,449 B1 | 11/2014 | Zhu et al. |
| 8,900,364 B2 | 12/2014 | Wright |
| 8,921,234 B2 | 12/2014 | Liu et al. |
| 8,927,390 B2 | 1/2015 | Sapre et al. |
| 8,932,947 B1 | 1/2015 | Han et al. |
| 8,945,414 B1 | 2/2015 | Su et al. |
| 8,946,665 B2 | 2/2015 | Shim et al. |
| 8,946,828 B2 | 2/2015 | Sun et al. |
| 8,951,429 B1 | 2/2015 | Liu et al. |
| 8,956,980 B1 | 2/2015 | Chen et al. |
| 8,969,212 B2 | 3/2015 | Ren et al. |
| 8,970,114 B2 | 3/2015 | Busche et al. |
| 8,980,005 B2 | 3/2015 | Carlson et al. |
| 8,980,758 B1 | 3/2015 | Ling et al. |
| 8,980,763 B2 | 3/2015 | Wang et al. |
| 8,992,723 B2 | 3/2015 | Sorensen et al. |
| 8,999,656 B2 | 4/2015 | Jirstrom et al. |
| 8,999,839 B2 | 4/2015 | Su et al. |
| 8,999,856 B2 | 4/2015 | Zhang et al. |
| 9,012,302 B2 | 4/2015 | Sapre et al. |
| 9,017,481 B1 | 4/2015 | Pettinger et al. |
| 9,023,732 B2 | 5/2015 | Wang et al. |
| 9,023,734 B2 | 5/2015 | Chen et al. |
| 9,034,770 B2 | 5/2015 | Park et al. |
| 9,039,911 B2 | 5/2015 | Hudson et al. |
| 9,040,422 B2 | 5/2015 | Wang et al. |
| 9,064,815 B2 | 6/2015 | Zhang et al. |
| 9,064,816 B2 | 6/2015 | Kim et al. |
| 9,068,265 B2* | 6/2015 | Lubomirsky ..... C23C 16/45563 |
| 9,072,158 B2 | 6/2015 | Ikeda et al. |
| 9,093,371 B2 | 7/2015 | Wang et al. |
| 9,093,390 B2 | 7/2015 | Wang et al. |
| 9,099,398 B2 | 8/2015 | Kang et al. |
| 9,111,877 B2 | 8/2015 | Chen et al. |
| 9,111,907 B2 | 8/2015 | Kamineni |
| 9,114,438 B2 | 8/2015 | Hoinkis et al. |
| 9,117,855 B2 | 8/2015 | Cho et al. |
| 9,132,436 B2 | 9/2015 | Liang et al. |
| 9,136,273 B1 | 9/2015 | Purayath et al. |
| 9,144,147 B2 | 9/2015 | Yang et al. |
| 9,153,442 B2 | 10/2015 | Wang et al. |
| 9,159,606 B1 | 10/2015 | Purayath et al. |
| 9,165,783 B2 | 10/2015 | Nemani et al. |
| 9,165,786 B1 | 10/2015 | Purayath et al. |
| 9,184,055 B2 | 11/2015 | Wang et al. |
| 9,190,290 B2 | 11/2015 | Xue et al. |
| 9,190,293 B2 | 11/2015 | Wang et al. |
| 9,190,302 B2 | 11/2015 | Ni |
| 9,202,708 B1 | 12/2015 | Chen et al. |
| 9,209,012 B2 | 12/2015 | Chen et al. |
| 9,236,265 B2 | 1/2016 | Korolik et al. |
| 9,236,266 B2 | 1/2016 | Zhang et al. |
| 9,240,315 B1 | 1/2016 | Hsieh et al. |
| 9,245,762 B2 | 1/2016 | Zhang et al. |
| 9,263,278 B2 | 2/2016 | Purayath et al. |
| 9,267,739 B2 | 2/2016 | Chen et al. |
| 9,269,590 B2 | 2/2016 | Luere et al. |
| 9,275,834 B1 | 3/2016 | Park et al. |
| 9,281,384 B2 | 3/2016 | Takeguchi |
| 9,287,095 B2 | 3/2016 | Nguyen et al. |
| 9,287,134 B2 | 3/2016 | Wang et al. |
| 9,293,568 B2 | 3/2016 | Ko |
| 9,299,537 B2 | 3/2016 | Kobayashi et al. |
| 9,299,538 B2 | 3/2016 | Kobayashi et al. |
| 9,299,539 B2 | 3/2016 | Makhratchev |
| 9,299,575 B2 | 3/2016 | Park et al. |
| 9,299,582 B2 | 3/2016 | Ingle et al. |
| 9,299,583 B1 | 3/2016 | Wang et al. |
| 9,309,598 B2 | 4/2016 | Wang et al. |
| 9,324,576 B2 | 4/2016 | Zhang et al. |
| 9,343,272 B1 | 5/2016 | Pandit et al. |
| 9,343,327 B2 | 5/2016 | Zhang et al. |
| 9,349,605 B1 | 5/2016 | Xu et al. |
| 9,355,856 B2 | 5/2016 | Wang et al. |
| 9,355,862 B2 | 5/2016 | Pandit et al. |
| 9,355,863 B2 | 5/2016 | Chen et al. |
| 9,355,922 B2 | 5/2016 | Park et al. |
| 9,362,130 B2 | 6/2016 | Ingle et al. |
| 9,368,364 B2 | 6/2016 | Park et al. |
| 9,373,517 B2 | 6/2016 | Yang et al. |
| 9,373,522 B1 | 6/2016 | Wang et al. |
| 9,378,969 B2 | 6/2016 | Hsu et al. |
| 9,378,978 B2 | 6/2016 | Purayath et al. |
| 9,384,997 B2 | 7/2016 | Ren et al. |
| 9,385,028 B2 | 7/2016 | Nemani et al. |
| 9,390,937 B2 | 7/2016 | Chen et al. |
| 9,396,989 B2 | 7/2016 | Purayath et al. |
| 9,406,523 B2 | 8/2016 | Chen et al. |
| 9,412,608 B2 | 8/2016 | Wang et al. |
| 9,412,752 B1 | 8/2016 | Yeh et al. |
| 9,418,858 B2 | 8/2016 | Wang et al. |
| 9,425,041 B2 | 8/2016 | Berry et al. |
| 9,425,057 B2 | 8/2016 | Cho et al. |
| 9,425,058 B2 | 8/2016 | Kim et al. |
| 9,431,268 B2 | 8/2016 | Lill et al. |
| 9,431,414 B2 | 8/2016 | Jang et al. |
| 9,343,358 B1 | 9/2016 | Montgomery |
| 9,437,451 B2 | 9/2016 | Chen et al. |
| 9,443,749 B2 | 9/2016 | Smith |
| 9,449,795 B2 | 9/2016 | Sabri et al. |
| 9,449,843 B1* | 9/2016 | Korolik ............ H01L 21/32135 |
| 9,449,845 B2 | 9/2016 | Liu et al. |
| 9,449,846 B2 | 9/2016 | Liu et al. |
| 9,449,850 B2 | 9/2016 | Wang et al. |
| 9,460,959 B1 | 10/2016 | Xie et al. |
| 9,466,469 B2 | 10/2016 | Khaja |

(56) References Cited

U.S. PATENT DOCUMENTS

| | | |
|---|---|---|
| 9,472,412 B2 | 10/2016 | Zhang et al. |
| 9,472,417 B2 | 10/2016 | Ingle et al. |
| 9,478,432 B2 | 10/2016 | Chen et al. |
| 9,478,434 B2 | 10/2016 | Wang et al. |
| 9,493,879 B2 | 11/2016 | Hoinkis et al. |
| 9,496,167 B2 | 11/2016 | Purayath et al. |
| 9,499,898 B2 | 11/2016 | Nguyen et al. |
| 9,502,258 B2 | 11/2016 | Xue et al. |
| 9,508,529 B2 | 11/2016 | Valcore et al. |
| 9,520,303 B2 | 12/2016 | Wang et al. |
| 9,534,724 B2 | 1/2017 | Jiang et al. |
| 9,543,163 B2 | 1/2017 | Ling et al. |
| 9,564,296 B2 | 2/2017 | Kobayashi et al. |
| 9,564,338 B1 | 2/2017 | Zhang et al. |
| 9,576,788 B2 | 2/2017 | Liu et al. |
| 9,576,809 B2 | 2/2017 | Korolik et al. |
| 9,576,815 B2 | 2/2017 | Xu et al. |
| 9,583,399 B1 | 2/2017 | Chen et al. |
| 9,607,856 B2 | 3/2017 | Wang et al. |
| 9,613,822 B2 | 4/2017 | Chen et al. |
| 9,659,753 B2 | 5/2017 | Cho et al. |
| 9,659,792 B2 | 5/2017 | Wang et al. |
| 9,666,449 B2 | 5/2017 | Koval et al. |
| 9,691,645 B2 | 6/2017 | Ayers |
| 9,704,723 B2 | 7/2017 | Wang et al. |
| 9,711,366 B2 | 7/2017 | Ingle et al. |
| 9,721,789 B1 | 8/2017 | Yang et al. |
| 9,728,437 B2 | 8/2017 | Tran et al. |
| 9,741,593 B2 | 8/2017 | Benjaminson et al. |
| 9,754,800 B2 | 9/2017 | Zhang et al. |
| 9,768,034 B1 | 9/2017 | Xu et al. |
| 9,773,648 B2 | 9/2017 | Cho et al. |
| 9,773,695 B2 | 9/2017 | Purayath et al. |
| 9,779,956 B1 | 10/2017 | Zhang et al. |
| 9,812,462 B1 | 11/2017 | Pang et al. |
| 9,831,097 B2 | 11/2017 | Ingle et al. |
| 9,837,249 B2 | 12/2017 | Kobayashi et al. |
| 9,837,284 B2 | 12/2017 | Chen et al. |
| 9,837,286 B2 | 12/2017 | Yang et al. |
| 9,842,744 B2 | 12/2017 | Zhang et al. |
| 9,865,484 B1 | 1/2018 | Citla et al. |
| 9,881,805 B2 | 1/2018 | Li et al. |
| 9,885,117 B2 | 2/2018 | Lubomirsky et al. |
| 9,887,096 B2 | 2/2018 | Park et al. |
| 9,903,020 B2 | 2/2018 | Kim et al. |
| 9,941,097 B2 | 4/2018 | Yamazawa |
| 9,960,045 B1 | 5/2018 | Purayath et al. |
| 9,966,240 B2 | 5/2018 | Park et al. |
| 9,978,564 B2 | 5/2018 | Liang et al. |
| 9,991,134 B2 | 6/2018 | Wang et al. |
| 10,026,621 B2 | 7/2018 | Ko et al. |
| 10,032,606 B2 | 7/2018 | Yang et al. |
| 10,043,674 B1 | 8/2018 | Korolik et al. |
| 10,043,684 B1 | 8/2018 | Arnepalli et al. |
| 10,049,891 B1 | 8/2018 | Wang et al. |
| 10,062,578 B2 | 8/2018 | Zhang et al. |
| 10,062,579 B2 | 8/2018 | Chen et al. |
| 10,062,585 B2 * | 8/2018 | Lubomirsky ..... H01L 21/67069 |
| 10,062,587 B2 | 8/2018 | Chen et al. |
| 10,083,830 B2 | 9/2018 | Seino et al. |
| 10,121,689 B2 | 11/2018 | Konkola et al. |
| 10,147,620 B2 | 12/2018 | Benjaminson et al. |
| 10,147,736 B2 | 12/2018 | Linuma |
| 10,217,614 B2 | 2/2019 | Tucker et al. |
| 10,256,079 B2 | 4/2019 | Lubomirsky et al. |
| 10,269,541 B2 | 4/2019 | Stowell et al. |
| 10,319,600 B1 | 6/2019 | Li et al. |
| 10,319,739 B2 | 6/2019 | Purayath |
| 10,354,843 B2 | 7/2019 | Liang et al. |
| 10,465,294 B2 | 11/2019 | Wang et al. |
| 10,619,245 B2 | 4/2020 | Tucker et al. |
| 10,622,189 B2 | 4/2020 | Bravo et al. |
| 10,679,870 B2 | 6/2020 | Samir et al. |
| 10,699,921 B2 | 6/2020 | Samir |
| 2001/0003014 A1* | 6/2001 | Yuda ..................... C23C 16/452 427/562 |
| 2001/0006093 A1 | 7/2001 | Tabuchi |
| 2001/0008803 A1 | 7/2001 | Takamatsu et al. |
| 2001/0015175 A1 | 8/2001 | Masuda et al. |
| 2001/0015261 A1 | 8/2001 | Kobayashi et al. |
| 2001/0023741 A1* | 9/2001 | Collison ............... H01J 37/321 156/345.35 |
| 2001/0028093 A1 | 10/2001 | Yamazaki et al. |
| 2001/0028922 A1 | 10/2001 | Sandhu |
| 2001/0029112 A1 | 10/2001 | Toyoda et al. |
| 2001/0029891 A1 | 10/2001 | Oh et al. |
| 2001/0030366 A1 | 10/2001 | Nakano et al. |
| 2001/0034106 A1 | 10/2001 | Moise et al. |
| 2001/0034121 A1 | 10/2001 | Fu et al. |
| 2001/0035124 A1 | 11/2001 | Okayama et al. |
| 2001/0035127 A1 | 11/2001 | Metzner |
| 2001/0036706 A1 | 11/2001 | Kitamura |
| 2001/0037856 A1 | 11/2001 | Park |
| 2001/0037941 A1 | 11/2001 | Thompson |
| 2001/0039921 A1 | 11/2001 | Rolfson et al. |
| 2001/0042512 A1 | 11/2001 | Xu et al. |
| 2001/0045269 A1 | 11/2001 | Yamada |
| 2001/0047760 A1 | 12/2001 | Moslehi |
| 2001/0053585 A1 | 12/2001 | Kikuchi et al. |
| 2001/0053610 A1 | 12/2001 | Athavale |
| 2001/0054381 A1 | 12/2001 | Umotoy et al. |
| 2001/0054387 A1 | 12/2001 | Frankel et al. |
| 2002/0000202 A1* | 1/2002 | Yuda ................ C23C 16/45574 118/723 ER |
| 2002/0001778 A1 | 1/2002 | Latchford et al. |
| 2002/0009560 A1 | 1/2002 | Ozono |
| 2002/0011210 A1 | 1/2002 | Satoh et al. |
| 2002/0011214 A1 | 1/2002 | Kamarehi et al. |
| 2002/0015791 A1* | 2/2002 | Tobe ..................... C23C 16/34 427/255.394 |
| 2002/0016080 A1 | 2/2002 | Khan et al. |
| 2002/0016085 A1 | 2/2002 | Huang et al. |
| 2002/0017243 A1 | 2/2002 | Pyo |
| 2002/0020429 A1 | 2/2002 | Selbrede et al. |
| 2002/0023899 A1 | 2/2002 | Khater et al. |
| 2002/0028582 A1 | 3/2002 | Nallan et al. |
| 2002/0028585 A1 | 3/2002 | Chung et al. |
| 2002/0029747 A1 | 3/2002 | Powell et al. |
| 2002/0033233 A1 | 3/2002 | Savas |
| 2002/0036143 A1 | 3/2002 | Segawa et al. |
| 2002/0038791 A1 | 4/2002 | Okumura et al. |
| 2002/0040764 A1 | 4/2002 | Kwan et al. |
| 2002/0040766 A1 | 4/2002 | Takahashi |
| 2002/0042192 A1 | 4/2002 | Tanaka et al. |
| 2002/0043690 A1 | 4/2002 | Doyle et al. |
| 2002/0045966 A1 | 4/2002 | Lee et al. |
| 2002/0046991 A1 | 4/2002 | Smith et al. |
| 2002/0048963 A1 | 4/2002 | Campbell et al. |
| 2002/0050246 A1 | 5/2002 | Parkhe |
| 2002/0054962 A1 | 5/2002 | Huang |
| 2002/0062954 A1 | 5/2002 | Getchel et al. |
| 2002/0069820 A1 | 6/2002 | Yudovsky |
| 2002/0070414 A1 | 6/2002 | Drescher et al. |
| 2002/0073925 A1 | 6/2002 | Noble et al. |
| 2002/0074573 A1 | 6/2002 | Takeuchi et al. |
| 2002/0075624 A1 | 6/2002 | Wang et al. |
| 2002/0086501 A1 | 7/2002 | O'Donnell et al. |
| 2002/0090781 A1 | 7/2002 | Skotnicki et al. |
| 2002/0090835 A1 | 7/2002 | Chakravarti et al. |
| 2002/0094378 A1 | 7/2002 | O-Donnell |
| 2002/0094591 A1 | 7/2002 | Sill et al. |
| 2002/0096493 A1 | 7/2002 | Hattori |
| 2002/0098681 A1 | 7/2002 | Hu et al. |
| 2002/0106845 A1 | 8/2002 | Chao et al. |
| 2002/0112819 A1 | 8/2002 | Kamarehi et al. |
| 2002/0124867 A1 | 9/2002 | Kim et al. |
| 2002/0129769 A1 | 9/2002 | Kim et al. |
| 2002/0129902 A1 | 9/2002 | Babayan et al. |
| 2002/0144657 A1 | 10/2002 | Chiang et al. |
| 2002/0153808 A1 | 10/2002 | Skotnicki et al. |
| 2002/0164885 A1 | 11/2002 | Lill et al. |
| 2002/0170678 A1 | 11/2002 | Hayashi et al. |
| 2002/0177322 A1 | 11/2002 | Li et al. |

(56) References Cited

U.S. PATENT DOCUMENTS

| | | |
|---|---|---|
| 2002/0179248 A1 | 12/2002 | Kabansky et al. |
| 2002/0182878 A1 | 12/2002 | Hirose et al. |
| 2002/0185226 A1 | 12/2002 | Lea et al. |
| 2002/0187280 A1 | 12/2002 | Johnson et al. |
| 2002/0187655 A1 | 12/2002 | Tan et al. |
| 2002/0197823 A1 | 12/2002 | Yoo et al. |
| 2003/0000473 A1* | 1/2003 | Chae ............... C23C 16/45548 118/715 |
| 2003/0000647 A1 | 1/2003 | Yudovsky et al. |
| 2003/0003757 A1 | 1/2003 | Nallan et al. |
| 2003/0007910 A1 | 1/2003 | Lazarovich et al. |
| 2003/0010452 A1 | 1/2003 | Park et al. |
| 2003/0010645 A1 | 1/2003 | Ting et al. |
| 2003/0015515 A1 | 1/2003 | Ito et al. |
| 2003/0019428 A1 | 1/2003 | Ku et al. |
| 2003/0019580 A1 | 1/2003 | Strang |
| 2003/0026060 A1 | 2/2003 | Hiramatsu et al. |
| 2003/0029566 A1 | 2/2003 | Roth |
| 2003/0029567 A1 | 2/2003 | Dhindsa et al. |
| 2003/0029715 A1 | 2/2003 | Yu et al. |
| 2003/0031905 A1 | 2/2003 | Saito et al. |
| 2003/0032284 A1 | 2/2003 | Enomoto et al. |
| 2003/0038127 A1 | 2/2003 | Liu et al. |
| 2003/0038305 A1 | 2/2003 | Wasshuber |
| 2003/0054608 A1 | 3/2003 | Tseng et al. |
| 2003/0066607 A1 | 4/2003 | White et al. |
| 2003/0070761 A1* | 4/2003 | Turlot ............... C23C 16/5096 156/345.47 |
| 2003/0071035 A1 | 4/2003 | Brailove |
| 2003/0072639 A1 | 4/2003 | White et al. |
| 2003/0075808 A1 | 4/2003 | Inoue et al. |
| 2003/0077909 A1 | 4/2003 | Jiwari |
| 2003/0079686 A1 | 5/2003 | Chen et al. |
| 2003/0087488 A1 | 5/2003 | Fink |
| 2003/0087531 A1 | 5/2003 | Kang et al. |
| 2003/0091938 A1 | 5/2003 | Fairbairn et al. |
| 2003/0094134 A1 | 5/2003 | Minami et al. |
| 2003/0098125 A1 | 5/2003 | An |
| 2003/0101938 A1 | 6/2003 | Ronsse et al. |
| 2003/0109143 A1 | 6/2003 | Hsieh et al. |
| 2003/0116087 A1 | 6/2003 | Nguyen et al. |
| 2003/0116439 A1 | 6/2003 | Seo et al. |
| 2003/0119328 A1 | 6/2003 | Fujisato |
| 2003/0121608 A1 | 7/2003 | Chen et al. |
| 2003/0121609 A1 | 7/2003 | Ohmi et al. |
| 2003/0124465 A1 | 7/2003 | Lee et al. |
| 2003/0124842 A1 | 7/2003 | Hytros et al. |
| 2003/0127049 A1 | 7/2003 | Han et al. |
| 2003/0127740 A1 | 7/2003 | Hsu et al. |
| 2003/0129106 A1 | 7/2003 | Sorensen et al. |
| 2003/0129827 A1 | 7/2003 | Lee et al. |
| 2003/0132319 A1 | 7/2003 | Hytros et al. |
| 2003/0136520 A1 | 7/2003 | Yudovsky et al. |
| 2003/0140844 A1 | 7/2003 | Maa et al. |
| 2003/0143328 A1 | 7/2003 | Chen et al. |
| 2003/0148035 A1 | 8/2003 | Lingampalli |
| 2003/0152691 A1 | 8/2003 | Baude |
| 2003/0159307 A1 | 8/2003 | Sago et al. |
| 2003/0164226 A1 | 9/2003 | Kanno et al. |
| 2003/0168439 A1 | 9/2003 | Kanno et al. |
| 2003/0170945 A1 | 9/2003 | Igeta et al. |
| 2003/0173333 A1 | 9/2003 | Wang et al. |
| 2003/0173347 A1 | 9/2003 | Guiver |
| 2003/0173675 A1 | 9/2003 | Watanabe |
| 2003/0181040 A1 | 9/2003 | Ivanov et al. |
| 2003/0183244 A1 | 10/2003 | Rossman |
| 2003/0190426 A1 | 10/2003 | Padhi et al. |
| 2003/0196757 A1 | 10/2003 | Todorow et al. |
| 2003/0196760 A1 | 10/2003 | Tyler et al. |
| 2003/0199170 A1 | 10/2003 | Li |
| 2003/0200929 A1 | 10/2003 | Otsuki |
| 2003/0201764 A1 | 10/2003 | Jafari et al. |
| 2003/0205329 A1 | 11/2003 | Gujer et al. |
| 2003/0209323 A1 | 11/2003 | Yokogaki et al. |
| 2003/0215570 A1 | 11/2003 | Seutter et al. |
| 2003/0215963 A1 | 11/2003 | AmRhein et al. |
| 2003/0216044 A1 | 11/2003 | Lin et al. |
| 2003/0217810 A1 | 11/2003 | Chen et al. |
| 2003/0217812 A1 | 11/2003 | Yoshiki et al. |
| 2003/0221780 A1 | 12/2003 | Lei et al. |
| 2003/0224217 A1 | 12/2003 | Byun et al. |
| 2003/0224617 A1 | 12/2003 | Baek et al. |
| 2003/0230385 A1 | 12/2003 | Bach et al. |
| 2004/0002221 A1 | 1/2004 | O'Donnell et al. |
| 2004/0003828 A1 | 1/2004 | Jackson |
| 2004/0005726 A1 | 1/2004 | Huang |
| 2004/0018304 A1 | 1/2004 | Chung et al. |
| 2004/0020801 A1 | 2/2004 | Solling |
| 2004/0025788 A1 | 2/2004 | Ogasawara et al. |
| 2004/0026371 A1 | 2/2004 | Nguyen et al. |
| 2004/0033678 A1 | 2/2004 | Arghavani et al. |
| 2004/0033684 A1 | 2/2004 | Li |
| 2004/0035364 A1 | 2/2004 | Tomoyoshi et al. |
| 2004/0050328 A1 | 3/2004 | Kumagai et al. |
| 2004/0058070 A1 | 3/2004 | Takeuchi et al. |
| 2004/0058293 A1 | 3/2004 | Nguyen et al. |
| 2004/0061447 A1 | 4/2004 | Saigusa et al. |
| 2004/0069225 A1 | 4/2004 | Fairbairn et al. |
| 2004/0070346 A1 | 4/2004 | Choi |
| 2004/0072446 A1 | 4/2004 | Liu et al. |
| 2004/0076529 A1 | 4/2004 | Gnauck et al. |
| 2004/0083962 A1 | 5/2004 | Bang |
| 2004/0083967 A1 | 5/2004 | Yuda et al. |
| 2004/0087139 A1 | 5/2004 | Yeh et al. |
| 2004/0092063 A1 | 5/2004 | Okumura |
| 2004/0099285 A1 | 5/2004 | Wang et al. |
| 2004/0099378 A1 | 5/2004 | Kim et al. |
| 2004/0101667 A1 | 5/2004 | O'Loughlin et al. |
| 2004/0103844 A1* | 6/2004 | Chou ............... C23C 16/455 118/715 |
| 2004/0107908 A1 | 6/2004 | Collins et al. |
| 2004/0108067 A1 | 6/2004 | Fischione et al. |
| 2004/0108068 A1 | 6/2004 | Senzaki et al. |
| 2004/0115876 A1 | 6/2004 | Goundar et al. |
| 2004/0115947 A1 | 6/2004 | Fink et al. |
| 2004/0118519 A1 | 6/2004 | Sen et al. |
| 2004/0129671 A1 | 7/2004 | Ji et al. |
| 2004/0137161 A1 | 7/2004 | Segawa et al. |
| 2004/0140053 A1 | 7/2004 | Srivastava et al. |
| 2004/0144490 A1 | 7/2004 | Zhao et al. |
| 2004/0147126 A1 | 7/2004 | Yamashita et al. |
| 2004/0149223 A1 | 8/2004 | Collison et al. |
| 2004/0149387 A1 | 8/2004 | Kim et al. |
| 2004/0149394 A1 | 8/2004 | Doan et al. |
| 2004/0149699 A1 | 8/2004 | Hofman et al. |
| 2004/0152342 A1 | 8/2004 | Li |
| 2004/0154535 A1 | 8/2004 | Chen et al. |
| 2004/0157444 A1 | 8/2004 | Chiu |
| 2004/0161921 A1 | 8/2004 | Ryu |
| 2004/0163590 A1 | 8/2004 | Tran et al. |
| 2004/0163594 A1 | 8/2004 | Windhorn |
| 2004/0163601 A1 | 8/2004 | Kadotani et al. |
| 2004/0175913 A1 | 9/2004 | Johnson et al. |
| 2004/0175929 A1 | 9/2004 | Schmitt et al. |
| 2004/0182315 A1 | 9/2004 | Laflamme et al. |
| 2004/0187787 A1 | 9/2004 | Dawson |
| 2004/0192032 A1 | 9/2004 | Ohmori et al. |
| 2004/0194799 A1 | 10/2004 | Kim et al. |
| 2004/0195208 A1 | 10/2004 | Pavel et al. |
| 2004/0195216 A1 | 10/2004 | Strang |
| 2004/0200499 A1 | 10/2004 | Harvey |
| 2004/0201843 A1 | 10/2004 | Glenn et al. |
| 2004/0206730 A1 | 10/2004 | Holber et al. |
| 2004/0211357 A1 | 10/2004 | Gadgil et al. |
| 2004/0219737 A1 | 11/2004 | Quon |
| 2004/0219789 A1 | 11/2004 | Wood et al. |
| 2004/0231706 A1 | 11/2004 | Bhatnagar et al. |
| 2004/0237897 A1 | 12/2004 | Hanawa et al. |
| 2004/0238123 A1 | 12/2004 | Becknell et al. |
| 2004/0259367 A1 | 12/2004 | Constantine et al. |
| 2004/0263827 A1 | 12/2004 | Xu |
| 2005/0000430 A1* | 1/2005 | Jang ............... C23C 16/45565 118/715 |
| 2005/0000432 A1 | 1/2005 | Keller et al. |

(56) References Cited

U.S. PATENT DOCUMENTS

| | | |
|---|---|---|
| 2005/0001276 A1 | 1/2005 | Gao et al. |
| 2005/0003676 A1 | 1/2005 | Ho et al. |
| 2005/0009340 A1 | 1/2005 | Saijo et al. |
| 2005/0009358 A1 | 1/2005 | Choi et al. |
| 2005/0026430 A1 | 2/2005 | Kim et al. |
| 2005/0026431 A1 | 2/2005 | Kazumi et al. |
| 2005/0035455 A1 | 2/2005 | Hu et al. |
| 2005/0039679 A1 | 2/2005 | Kleshock |
| 2005/0051094 A1 | 3/2005 | Schaepkens et al. |
| 2005/0054167 A1 | 3/2005 | Choi et al. |
| 2005/0056218 A1 | 3/2005 | Sun et al. |
| 2005/0073051 A1 | 4/2005 | Yamamoto et al. |
| 2005/0077284 A1 | 4/2005 | Natsuhara et al. |
| 2005/0079706 A1 | 4/2005 | Kumar et al. |
| 2005/0087517 A1 | 4/2005 | Ott et al. |
| 2005/0090078 A1 | 4/2005 | Ishihara |
| 2005/0090120 A1 | 4/2005 | Hasegawa et al. |
| 2005/0098111 A1 | 5/2005 | Shimizu et al. |
| 2005/0098265 A1 | 5/2005 | Fink et al. |
| 2005/0103267 A1 | 5/2005 | Hur et al. |
| 2005/0103440 A1 | 5/2005 | Sato et al. |
| 2005/0105991 A1 | 5/2005 | Hofmeister et al. |
| 2005/0109279 A1 | 5/2005 | Suzuki |
| 2005/0112876 A1 | 5/2005 | Wu |
| 2005/0112901 A1 | 5/2005 | Ji et al. |
| 2005/0123690 A1 | 6/2005 | Derderian et al. |
| 2005/0133849 A1 | 6/2005 | Jeon et al. |
| 2005/0136188 A1 | 6/2005 | Chang |
| 2005/0139578 A1 | 6/2005 | Fukuda et al. |
| 2005/0145173 A1 | 7/2005 | Holber et al. |
| 2005/0145341 A1 | 7/2005 | Suzuki |
| 2005/0164479 A1 | 7/2005 | Perng et al. |
| 2005/0167052 A1 | 8/2005 | Ishihara et al. |
| 2005/0167394 A1 | 8/2005 | Liu et al. |
| 2005/0176258 A1 | 8/2005 | Hirose et al. |
| 2005/0178746 A1 | 8/2005 | Gorin |
| 2005/0178748 A1 | 8/2005 | Buchberger et al. |
| 2005/0181588 A1 | 8/2005 | Kim |
| 2005/0183666 A1 | 8/2005 | Tsuji et al. |
| 2005/0183827 A1 | 8/2005 | White et al. |
| 2005/0194094 A1 | 9/2005 | Yasaka |
| 2005/0196967 A1 | 9/2005 | Savas et al. |
| 2005/0199489 A1 | 9/2005 | Stevens et al. |
| 2005/0205110 A1 | 9/2005 | Kao et al. |
| 2005/0205862 A1 | 9/2005 | Koemtzopoulos et al. |
| 2005/0208215 A1 | 9/2005 | Eguchi et al. |
| 2005/0214477 A1 | 9/2005 | Hanawa et al. |
| 2005/0217582 A1 | 10/2005 | Kim et al. |
| 2005/0218507 A1 | 10/2005 | Kao et al. |
| 2005/0219786 A1 | 10/2005 | Brown et al. |
| 2005/0221552 A1 | 10/2005 | Kao et al. |
| 2005/0224181 A1 | 10/2005 | Merry et al. |
| 2005/0229848 A1 | 10/2005 | Shinriki et al. |
| 2005/0230350 A1* | 10/2005 | Kao ............... H01J 37/32082 216/67 |
| 2005/0236694 A1 | 10/2005 | Wu et al. |
| 2005/0238807 A1 | 10/2005 | Lin et al. |
| 2005/0239282 A1 | 10/2005 | Chen et al. |
| 2005/0241579 A1 | 11/2005 | Kidd |
| 2005/0241583 A1 | 11/2005 | Buechel et al. |
| 2005/0241763 A1 | 11/2005 | Huang et al. |
| 2005/0247672 A1 | 11/2005 | Tatsumi |
| 2005/0251990 A1 | 11/2005 | Choi et al. |
| 2005/0257890 A1 | 11/2005 | Park et al. |
| 2005/0258160 A1 | 11/2005 | Goto et al. |
| 2005/0266622 A1 | 12/2005 | Arghavani et al. |
| 2005/0266650 A1 | 12/2005 | Ahn et al. |
| 2005/0266691 A1 | 12/2005 | Gu et al. |
| 2005/0268856 A1* | 12/2005 | Miller ............... C23C 16/45544 118/729 |
| 2005/0269030 A1 | 12/2005 | Kent et al. |
| 2005/0271812 A1 | 12/2005 | Myo et al. |
| 2005/0274324 A1 | 12/2005 | Takahashi et al. |
| 2005/0274396 A1 | 12/2005 | Shih et al. |
| 2005/0279454 A1 | 12/2005 | Snijders |
| 2005/0283321 A1 | 12/2005 | Yue et al. |
| 2005/0287688 A1 | 12/2005 | Won et al. |
| 2005/0287755 A1 | 12/2005 | Bachmann |
| 2005/0287771 A1 | 12/2005 | Seamons et al. |
| 2006/0000802 A1 | 1/2006 | Kumar et al. |
| 2006/0000805 A1 | 1/2006 | Todorow et al. |
| 2006/0005856 A1 | 1/2006 | Sun et al. |
| 2006/0005930 A1 | 1/2006 | Ikeda et al. |
| 2006/0006057 A1 | 1/2006 | Laermer |
| 2006/0008676 A1 | 1/2006 | Ebata et al. |
| 2006/0011298 A1 | 1/2006 | Lim et al. |
| 2006/0011299 A1 | 1/2006 | Condrashoff et al. |
| 2006/0016783 A1 | 1/2006 | Wu et al. |
| 2006/0019456 A1 | 1/2006 | Bu et al. |
| 2006/0019477 A1 | 1/2006 | Hanawa et al. |
| 2006/0019486 A1 | 1/2006 | Yu et al. |
| 2006/0021574 A1* | 2/2006 | Armour ............ C23C 16/45565 118/715 |
| 2006/0021701 A1 | 2/2006 | Tobe et al. |
| 2006/0021703 A1 | 2/2006 | Umotoy et al. |
| 2006/0024954 A1 | 2/2006 | Wu et al. |
| 2006/0024956 A1 | 2/2006 | Zhijian et al. |
| 2006/0032833 A1 | 2/2006 | Kawaguchi et al. |
| 2006/0033678 A1 | 2/2006 | Lubomirsky et al. |
| 2006/0040055 A1 | 2/2006 | Nguyen et al. |
| 2006/0042545 A1 | 3/2006 | Shibata et al. |
| 2006/0043066 A1 | 3/2006 | Kamp |
| 2006/0046412 A1 | 3/2006 | Nguyen et al. |
| 2006/0046419 A1 | 3/2006 | Sandhu et al. |
| 2006/0046470 A1 | 3/2006 | Becknell |
| 2006/0051966 A1 | 3/2006 | Or et al. |
| 2006/0051968 A1 | 3/2006 | Joshi et al. |
| 2006/0054184 A1 | 3/2006 | Mozetic et al. |
| 2006/0054280 A1* | 3/2006 | Jang ................. C23C 16/45565 156/345.34 |
| 2006/0060942 A1 | 3/2006 | Minixhofer et al. |
| 2006/0065629 A1 | 3/2006 | Chen et al. |
| 2006/0073349 A1 | 4/2006 | Aihara et al. |
| 2006/0076108 A1 | 4/2006 | Holland et al. |
| 2006/0081337 A1 | 4/2006 | Himori et al. |
| 2006/0087644 A1 | 4/2006 | McMillin et al. |
| 2006/0090700 A1 | 5/2006 | Satoh et al. |
| 2006/0093756 A1 | 5/2006 | Rajagopalan et al. |
| 2006/0097397 A1 | 5/2006 | Russell et al. |
| 2006/0102076 A1 | 5/2006 | Smith et al. |
| 2006/0102587 A1 | 5/2006 | Kimura |
| 2006/0113038 A1 | 6/2006 | Gondhalekar et al. |
| 2006/0118178 A1 | 6/2006 | Desbiolles et al. |
| 2006/0118240 A1 | 6/2006 | Holber et al. |
| 2006/0121724 A1 | 6/2006 | Yue et al. |
| 2006/0124151 A1 | 6/2006 | Yamasaki et al. |
| 2006/0124242 A1 | 6/2006 | Kanarik et al. |
| 2006/0130971 A1 | 6/2006 | Chang et al. |
| 2006/0137613 A1 | 6/2006 | Kasai |
| 2006/0157449 A1 | 7/2006 | Takahashi et al. |
| 2006/0162661 A1 | 7/2006 | Jung et al. |
| 2006/0166107 A1 | 7/2006 | Chen et al. |
| 2006/0166515 A1 | 7/2006 | Karim et al. |
| 2006/0169327 A1 | 8/2006 | Shajii et al. |
| 2006/0169410 A1 | 8/2006 | Maeda et al. |
| 2006/0178008 A1 | 8/2006 | Yeh et al. |
| 2006/0185592 A1 | 8/2006 | Matsuura |
| 2006/0191479 A1 | 8/2006 | Mizukami et al. |
| 2006/0191637 A1 | 8/2006 | Zajac et al. |
| 2006/0207504 A1 | 9/2006 | Hasebe et al. |
| 2006/0207595 A1 | 9/2006 | Ohmi et al. |
| 2006/0207971 A1 | 9/2006 | Moriya et al. |
| 2006/0210713 A1 | 9/2006 | Brcka |
| 2006/0210723 A1 | 9/2006 | Ishizaka |
| 2006/0211163 A1 | 9/2006 | Ouellet et al. |
| 2006/0215347 A1 | 9/2006 | Wakabayashi et al. |
| 2006/0216878 A1 | 9/2006 | Lee |
| 2006/0219360 A1 | 10/2006 | Iwasaki |
| 2006/0222481 A1 | 10/2006 | Foree |
| 2006/0226121 A1 | 10/2006 | Aoi |
| 2006/0228496 A1 | 10/2006 | Choi et al. |
| 2006/0228889 A1 | 10/2006 | Edelberg et al. |
| 2006/0236932 A1 | 10/2006 | Yokogawa et al. |
| 2006/0240661 A1 | 10/2006 | Annapragada et al. |

(56) References Cited

U.S. PATENT DOCUMENTS

| | | |
|---|---|---|
| 2006/0244107 A1 | 11/2006 | Sugihara |
| 2006/0245852 A1 | 11/2006 | Iwabuchi |
| 2006/0246217 A1 | 11/2006 | Weidman et al. |
| 2006/0251800 A1 | 11/2006 | Weidman et al. |
| 2006/0251801 A1 | 11/2006 | Weidman et al. |
| 2006/0252252 A1 | 11/2006 | Zhu et al. |
| 2006/0252265 A1 | 11/2006 | Jin et al. |
| 2006/0254716 A1 | 11/2006 | Mosden et al. |
| 2006/0260750 A1 | 11/2006 | Rueger |
| 2006/0261490 A1 | 11/2006 | Su et al. |
| 2006/0264043 A1 | 11/2006 | Stewart et al. |
| 2006/0266288 A1 | 11/2006 | Choi |
| 2006/0285270 A1 | 12/2006 | Lee |
| 2006/0286774 A1 | 12/2006 | Singh et al. |
| 2006/0289384 A1 | 12/2006 | Pavel et al. |
| 2006/0292846 A1 | 12/2006 | Pinto et al. |
| 2007/0022952 A1 | 2/2007 | Ritchie et al. |
| 2007/0022954 A1 | 2/2007 | Iizuka et al. |
| 2007/0023320 A1 | 2/2007 | Itakura et al. |
| 2007/0025907 A1 | 2/2007 | Rezeq |
| 2007/0039548 A1 | 2/2007 | Johnson |
| 2007/0048977 A1 | 3/2007 | Lee et al. |
| 2007/0051471 A1 | 3/2007 | Kawaguchi et al. |
| 2007/0056925 A1 | 3/2007 | Liu et al. |
| 2007/0062453 A1 | 3/2007 | Ishikawa |
| 2007/0066084 A1 | 3/2007 | Wajda et al. |
| 2007/0068625 A1* | 3/2007 | Funk .................. C23C 16/45565 156/345.29 |
| 2007/0071888 A1 | 3/2007 | Shanmugasundram et al. |
| 2007/0072408 A1 | 3/2007 | Enomoto et al. |
| 2007/0077737 A1 | 4/2007 | Kobayashi |
| 2007/0079758 A1 | 4/2007 | Holland et al. |
| 2007/0090325 A1 | 4/2007 | Hwang et al. |
| 2007/0096658 A1 | 5/2007 | Saigusa et al. |
| 2007/0099428 A1 | 5/2007 | Shamiryan et al. |
| 2007/0099431 A1 | 5/2007 | Li |
| 2007/0099438 A1 | 5/2007 | Ye et al. |
| 2007/0107750 A1 | 5/2007 | Sawin et al. |
| 2007/0108404 A1 | 5/2007 | Stewart et al. |
| 2007/0111519 A1 | 5/2007 | Lubomirsky et al. |
| 2007/0117396 A1 | 5/2007 | Wu et al. |
| 2007/0119370 A1 | 5/2007 | Ma et al. |
| 2007/0119371 A1 | 5/2007 | Ma et al. |
| 2007/0123051 A1 | 5/2007 | Arghavani et al. |
| 2007/0128864 A1 | 6/2007 | Ma |
| 2007/0128876 A1 | 6/2007 | Fukiage |
| 2007/0131274 A1 | 6/2007 | Stollwerck et al. |
| 2007/0145023 A1 | 6/2007 | Holber et al. |
| 2007/0148349 A1 | 6/2007 | Fukada |
| 2007/0154838 A1 | 7/2007 | Lee |
| 2007/0163440 A1 | 7/2007 | Kim et al. |
| 2007/0169703 A1 | 7/2007 | Elliot et al. |
| 2007/0175861 A1 | 8/2007 | Hwang et al. |
| 2007/0181057 A1 | 8/2007 | Lam et al. |
| 2007/0193515 A1 | 8/2007 | Jeon et al. |
| 2007/0197028 A1 | 8/2007 | Byun et al. |
| 2007/0207275 A1 | 9/2007 | Nowak et al. |
| 2007/0209931 A1 | 9/2007 | Miller |
| 2007/0212288 A1 | 9/2007 | Holst |
| 2007/0221620 A1 | 9/2007 | Sakthivel et al. |
| 2007/0227554 A1 | 10/2007 | Satoh et al. |
| 2007/0231109 A1 | 10/2007 | Pak et al. |
| 2007/0235134 A1 | 10/2007 | Limuro |
| 2007/0235136 A1* | 10/2007 | Enomoto ............ H01J 37/3244 156/345.34 |
| 2007/0238199 A1 | 10/2007 | Yamashita |
| 2007/0238321 A1 | 10/2007 | Futase et al. |
| 2007/0243685 A1 | 10/2007 | Jiang et al. |
| 2007/0243714 A1 | 10/2007 | Shin et al. |
| 2007/0254169 A1 | 11/2007 | Kamins et al. |
| 2007/0258186 A1 | 11/2007 | Matyushkin et al. |
| 2007/0259467 A1 | 11/2007 | Tweet et al. |
| 2007/0264820 A1 | 11/2007 | Liu |
| 2007/0266946 A1 | 11/2007 | Choi |
| 2007/0272154 A1* | 11/2007 | Amikura ........... C23C 16/45565 118/719 |
| 2007/0277734 A1 | 12/2007 | Lubomirsky et al. |
| 2007/0280816 A1 | 12/2007 | Kurita et al. |
| 2007/0281106 A1* | 12/2007 | Lubomirsky ...... C23C 16/45502 427/569 |
| 2007/0284044 A1 | 12/2007 | Matsumoto et al. |
| 2007/0284344 A1 | 12/2007 | Todorov et al. |
| 2007/0287292 A1 | 12/2007 | Li et al. |
| 2007/0296967 A1 | 12/2007 | Gupta et al. |
| 2008/0011424 A1 | 1/2008 | Yin et al. |
| 2008/0017104 A1 | 1/2008 | Matyushkin et al. |
| 2008/0020570 A1 | 1/2008 | Naik |
| 2008/0029032 A1 | 2/2008 | Sun et al. |
| 2008/0044593 A1 | 2/2008 | Seo et al. |
| 2008/0044990 A1 | 2/2008 | Lee |
| 2008/0050538 A1 | 2/2008 | Hirata |
| 2008/0063798 A1 | 3/2008 | Kher et al. |
| 2008/0063810 A1 | 3/2008 | Park et al. |
| 2008/0075668 A1 | 3/2008 | Goldstein |
| 2008/0081483 A1 | 4/2008 | Wu |
| 2008/0085604 A1 | 4/2008 | Hoshino et al. |
| 2008/0089001 A1 | 4/2008 | Parkhe et al. |
| 2008/0099147 A1 | 5/2008 | Myo et al. |
| 2008/0099426 A1 | 5/2008 | Kumar et al. |
| 2008/0099431 A1 | 5/2008 | Kumar et al. |
| 2008/0099876 A1 | 5/2008 | Seto |
| 2008/0100222 A1 | 5/2008 | Lewington et al. |
| 2008/0102203 A1 | 5/2008 | Wu et al. |
| 2008/0102570 A1 | 5/2008 | Fischer et al. |
| 2008/0102640 A1 | 5/2008 | Hassan et al. |
| 2008/0102646 A1 | 5/2008 | Kawaguchi et al. |
| 2008/0104782 A1 | 5/2008 | Hughes |
| 2008/0105555 A1 | 5/2008 | Iwazaki et al. |
| 2008/0115726 A1 | 5/2008 | Ingle et al. |
| 2008/0121970 A1 | 5/2008 | Aritome |
| 2008/0124937 A1 | 5/2008 | Xu et al. |
| 2008/0141941 A1* | 6/2008 | Augustino ........ C23C 16/45565 118/723 R |
| 2008/0142831 A1 | 6/2008 | Su |
| 2008/0149596 A1 | 6/2008 | Dhindsa et al. |
| 2008/0153306 A1 | 6/2008 | Cho et al. |
| 2008/0156631 A1 | 7/2008 | Fair et al. |
| 2008/0156771 A1 | 7/2008 | Jeon et al. |
| 2008/0157225 A1 | 7/2008 | Datta et al. |
| 2008/0160210 A1 | 7/2008 | Yang et al. |
| 2008/0169588 A1 | 7/2008 | Shih et al. |
| 2008/0171407 A1 | 7/2008 | Nakabayashi et al. |
| 2008/0173906 A1 | 7/2008 | Zhu |
| 2008/0176412 A1 | 7/2008 | Komeda |
| 2008/0178797 A1 | 7/2008 | Fodor et al. |
| 2008/0178805 A1* | 7/2008 | Paterson ........... H01J 37/32091 118/723 I |
| 2008/0182381 A1 | 7/2008 | Kiyotoshi |
| 2008/0182382 A1 | 7/2008 | Ingle et al. |
| 2008/0182383 A1 | 7/2008 | Lee et al. |
| 2008/0193673 A1 | 8/2008 | Paterson et al. |
| 2008/0202688 A1 | 8/2008 | Wu et al. |
| 2008/0202892 A1 | 8/2008 | Smith et al. |
| 2008/0213496 A1 | 9/2008 | Sun et al. |
| 2008/0216901 A1 | 9/2008 | Chamberlain et al. |
| 2008/0216958 A1 | 9/2008 | Goto et al. |
| 2008/0230519 A1 | 9/2008 | Takahashi |
| 2008/0233709 A1 | 9/2008 | Conti et al. |
| 2008/0236751 A1 | 10/2008 | Aramaki et al. |
| 2008/0254635 A1 | 10/2008 | Benzel et al. |
| 2008/0261404 A1 | 10/2008 | Kozuka et al. |
| 2008/0264337 A1 | 10/2008 | Sano et al. |
| 2008/0268171 A1 | 10/2008 | Ma et al. |
| 2008/0268645 A1 | 10/2008 | Kao et al. |
| 2008/0292798 A1 | 11/2008 | Huh et al. |
| 2008/0293248 A1 | 11/2008 | Park et al. |
| 2008/0317965 A1 | 12/2008 | Son et al. |
| 2009/0000743 A1 | 1/2009 | Iizuka |
| 2009/0001480 A1 | 1/2009 | Cheng |
| 2009/0004849 A1 | 1/2009 | Eun |
| 2009/0004873 A1 | 1/2009 | Yang |
| 2009/0014127 A1 | 1/2009 | Shah et al. |
| 2009/0014323 A1 | 1/2009 | Yendler et al. |

(56) References Cited

U.S. PATENT DOCUMENTS

| | | | |
|---|---|---|---|
| 2009/0014324 A1 | 1/2009 | Kawaguchi et al. |
| 2009/0017227 A1 | 1/2009 | Fu et al. |
| 2009/0022633 A1 | 1/2009 | Tomosue et al. |
| 2009/0034148 A1 | 2/2009 | Lubomirsky et al. |
| 2009/0036292 A1 | 2/2009 | Sun et al. |
| 2009/0045167 A1 | 2/2009 | Maruyama |
| 2009/0047793 A1 | 2/2009 | Fukasawa |
| 2009/0061640 A1 | 3/2009 | Wong et al. |
| 2009/0065480 A1 | 3/2009 | Ohmi et al. |
| 2009/0072401 A1 | 3/2009 | Arnold et al. |
| 2009/0075409 A1 | 3/2009 | Ueno et al. |
| 2009/0081878 A1 | 3/2009 | Dhindsa |
| 2009/0084317 A1 | 4/2009 | Wu et al. |
| 2009/0087960 A1 | 4/2009 | Cho et al. |
| 2009/0087979 A1 | 4/2009 | Raghuram |
| 2009/0095221 A1 | 4/2009 | Tam et al. |
| 2009/0095222 A1 | 4/2009 | Tam et al. |
| 2009/0095621 A1 | 4/2009 | Kao et al. |
| 2009/0098276 A1* | 4/2009 | Burrows ............ C23C 16/45565 427/8 |
| 2009/0098706 A1 | 4/2009 | Kim et al. |
| 2009/0104738 A1 | 4/2009 | Ring et al. |
| 2009/0104782 A1 | 4/2009 | Lu et al. |
| 2009/0111280 A1 | 4/2009 | Kao et al. |
| 2009/0117270 A1 | 5/2009 | Yamasaki et al. |
| 2009/0120364 A1 | 5/2009 | Suarez et al. |
| 2009/0120464 A1 | 5/2009 | Rasheed et al. |
| 2009/0120582 A1 | 5/2009 | Koshimizu |
| 2009/0140738 A1 | 6/2009 | Desvaux et al. |
| 2009/0159213 A1 | 6/2009 | Bera et al. |
| 2009/0159566 A1 | 6/2009 | Brillhart et al. |
| 2009/0159588 A1 | 6/2009 | Morioka et al. |
| 2009/0162647 A1 | 6/2009 | Sun et al. |
| 2009/0169744 A1* | 7/2009 | Byun ............... C23C 16/45565 427/255.28 |
| 2009/0170221 A1 | 7/2009 | Jacques et al. |
| 2009/0170331 A1 | 7/2009 | Cheng et al. |
| 2009/0178764 A1 | 7/2009 | Kanno et al. |
| 2009/0179300 A1 | 7/2009 | Arai |
| 2009/0189246 A1 | 7/2009 | Wu et al. |
| 2009/0191711 A1 | 7/2009 | Rui et al. |
| 2009/0194233 A1 | 8/2009 | Tamura |
| 2009/0194508 A1 | 8/2009 | Ui et al. |
| 2009/0194810 A1 | 8/2009 | Kiyotoshi et al. |
| 2009/0197418 A1 | 8/2009 | Sago |
| 2009/0202721 A1 | 8/2009 | Nogami et al. |
| 2009/0212804 A1 | 8/2009 | Yamada et al. |
| 2009/0214825 A1 | 8/2009 | Sun et al. |
| 2009/0218043 A1 | 9/2009 | Balakrishna et al. |
| 2009/0218317 A1 | 9/2009 | Belen et al. |
| 2009/0223928 A1 | 9/2009 | Colpo |
| 2009/0226633 A1 | 9/2009 | Laflamme et al. |
| 2009/0230636 A1* | 9/2009 | Goto ............... H01L 21/6831 279/128 |
| 2009/0236043 A1 | 9/2009 | Matsudo et al. |
| 2009/0236314 A1 | 9/2009 | Chen |
| 2009/0236547 A1 | 9/2009 | Huang et al. |
| 2009/0253222 A1 | 10/2009 | Morisawa et al. |
| 2009/0255902 A1 | 10/2009 | Satoh et al. |
| 2009/0258162 A1 | 10/2009 | Furuta et al. |
| 2009/0269934 A1 | 10/2009 | Kao et al. |
| 2009/0274590 A1 | 11/2009 | Willwerth et al. |
| 2009/0275146 A1 | 11/2009 | Takano et al. |
| 2009/0275205 A1 | 11/2009 | Kiehlbauch et al. |
| 2009/0275206 A1 | 11/2009 | Katz et al. |
| 2009/0277587 A1 | 11/2009 | Lubomirsky et al. |
| 2009/0277874 A1 | 11/2009 | Rui et al. |
| 2009/0280650 A1 | 11/2009 | Lubomirsky et al. |
| 2009/0286400 A1 | 11/2009 | Heo et al. |
| 2009/0286405 A1 | 11/2009 | Okesaku et al. |
| 2009/0291027 A1 | 11/2009 | Choi |
| 2009/0293809 A1 | 12/2009 | Cho et al. |
| 2009/0294898 A1 | 12/2009 | Feustel et al. |
| 2009/0298256 A1 | 12/2009 | Chen et al. |
| 2009/0302005 A1 | 12/2009 | Kool et al. |
| 2009/0314309 A1 | 12/2009 | Sankarakrishnan et al. |
| 2009/0314433 A1 | 12/2009 | Hoffman et al. |
| 2009/0317978 A1 | 12/2009 | Higashi |
| 2009/0320756 A1 | 12/2009 | Tanaka |
| 2010/0000683 A1 | 1/2010 | Kadkhodayan et al. |
| 2010/0003406 A1* | 1/2010 | Lam ................. C23C 16/4412 427/255.391 |
| 2010/0003824 A1 | 1/2010 | Kadkhodayan et al. |
| 2010/0006032 A1 | 1/2010 | Hinckley et al. |
| 2010/0006543 A1 | 1/2010 | Sawada et al. |
| 2010/0018648 A1 | 1/2010 | Collins et al. |
| 2010/0022030 A1 | 1/2010 | Ditizio |
| 2010/0025370 A1 | 2/2010 | Dieguez-Campo et al. |
| 2010/0037821 A1* | 2/2010 | Nogami ............ C23C 16/45565 118/723 E |
| 2010/0039747 A1 | 2/2010 | Sansoni |
| 2010/0043726 A1 | 2/2010 | Kosanke |
| 2010/0047080 A1 | 2/2010 | Bruce |
| 2010/0048022 A1 | 2/2010 | Kubota |
| 2010/0048027 A1 | 2/2010 | Cheng et al. |
| 2010/0055408 A1 | 3/2010 | Lee et al. |
| 2010/0055917 A1 | 3/2010 | Kim |
| 2010/0059889 A1 | 3/2010 | Gosset et al. |
| 2010/0062603 A1 | 3/2010 | Ganguly et al. |
| 2010/0072172 A1 | 3/2010 | Ui et al. |
| 2010/0075503 A1 | 3/2010 | Bencher |
| 2010/0081285 A1 | 4/2010 | Chen et al. |
| 2010/0089533 A1 | 4/2010 | Ueda et al. |
| 2010/0093151 A1 | 4/2010 | Arghavani et al. |
| 2010/0093168 A1 | 4/2010 | Naik |
| 2010/0096367 A1 | 4/2010 | Jeon et al. |
| 2010/0098882 A1 | 4/2010 | Lubomirsky et al. |
| 2010/0099236 A1 | 4/2010 | Kwon et al. |
| 2010/0099263 A1 | 4/2010 | Kao et al. |
| 2010/0101727 A1 | 4/2010 | Ji |
| 2010/0105209 A1 | 4/2010 | Winniczek et al. |
| 2010/0116788 A1 | 5/2010 | Singh et al. |
| 2010/0119843 A1 | 5/2010 | Sun et al. |
| 2010/0129974 A1 | 5/2010 | Futase et al. |
| 2010/0129982 A1* | 5/2010 | Kao ................. H01L 21/76232 438/430 |
| 2010/0130001 A1 | 5/2010 | Noguchi |
| 2010/0139889 A1 | 6/2010 | Kurita et al. |
| 2010/0144140 A1 | 6/2010 | Chandrashekar et al. |
| 2010/0147219 A1 | 6/2010 | Hsieh et al. |
| 2010/0151149 A1 | 6/2010 | Ovshinsky |
| 2010/0154835 A1 | 6/2010 | Dimeo et al. |
| 2010/0159703 A1 | 6/2010 | Fischer et al. |
| 2010/0164422 A1 | 7/2010 | Shu et al. |
| 2010/0173499 A1 | 7/2010 | Tao et al. |
| 2010/0178748 A1 | 7/2010 | Subramanian |
| 2010/0178755 A1 | 7/2010 | Lee et al. |
| 2010/0180819 A1 | 7/2010 | Hatanaka et al. |
| 2010/0183825 A1 | 7/2010 | Becker et al. |
| 2010/0187534 A1 | 7/2010 | Nishi et al. |
| 2010/0187588 A1 | 7/2010 | Kim et al. |
| 2010/0187694 A1 | 7/2010 | Yu et al. |
| 2010/0190352 A1 | 7/2010 | Jaiswal |
| 2010/0197143 A1 | 8/2010 | Nishimura |
| 2010/0203739 A1 | 8/2010 | Becker et al. |
| 2010/0206483 A1* | 8/2010 | Sorensen .......... H01J 37/32091 156/345.34 |
| 2010/0207195 A1 | 8/2010 | Fukuzumi et al. |
| 2010/0207205 A1 | 8/2010 | Grebs et al. |
| 2010/0212594 A1 | 8/2010 | Hara et al. |
| 2010/0213172 A1 | 8/2010 | Wilson |
| 2010/0221895 A1* | 9/2010 | Seino ................. H01L 21/02532 438/478 |
| 2010/0224322 A1 | 9/2010 | Sui et al. |
| 2010/0224324 A1 | 9/2010 | Kasai |
| 2010/0240205 A1 | 9/2010 | Son |
| 2010/0243606 A1 | 9/2010 | Koshimizu |
| 2010/0248488 A1 | 9/2010 | Agarwal et al. |
| 2010/0252068 A1 | 10/2010 | Kannan et al. |
| 2010/0255667 A1* | 10/2010 | Seino ................. H01L 21/28194 438/585 |
| 2010/0258913 A1 | 10/2010 | Lue |
| 2010/0263588 A1 | 10/2010 | Zhiyin |
| 2010/0267224 A1 | 10/2010 | Choi et al. |

(56) References Cited

U.S. PATENT DOCUMENTS

| | | |
|---|---|---|
| 2010/0267248 A1 | 10/2010 | Ma et al. |
| 2010/0272895 A1* | 10/2010 | Tsuda ............... C23C 16/45514 427/255.32 |
| 2010/0273290 A1 | 10/2010 | Kryliouk |
| 2010/0273291 A1 | 10/2010 | Kryliouk et al. |
| 2010/0288369 A1 | 11/2010 | Chang et al. |
| 2010/0294199 A1 | 11/2010 | Tran et al. |
| 2010/0310785 A1 | 12/2010 | Sasakawa et al. |
| 2010/0317197 A1 | 12/2010 | Lind et al. |
| 2010/0330814 A1 | 12/2010 | Yokota et al. |
| 2011/0005607 A1 | 1/2011 | Desbiolles et al. |
| 2011/0005684 A1 | 1/2011 | Hayami et al. |
| 2011/0008950 A1 | 1/2011 | Xu |
| 2011/0011338 A1* | 1/2011 | Chuc ............... H01J 37/32449 118/715 |
| 2011/0011341 A1 | 1/2011 | Nishimoto |
| 2011/0034035 A1 | 2/2011 | Liang et al. |
| 2011/0039407 A1 | 2/2011 | Nishizuka |
| 2011/0042799 A1 | 2/2011 | Kang et al. |
| 2011/0043228 A1 | 2/2011 | Makhratchev et al. |
| 2011/0045676 A1 | 2/2011 | Park |
| 2011/0048325 A1* | 3/2011 | Choi ............... C23C 16/452 118/712 |
| 2011/0049102 A1 | 3/2011 | Kroll et al. |
| 2011/0053380 A1 | 3/2011 | Sapre et al. |
| 2011/0058303 A1 | 3/2011 | Migita |
| 2011/0061810 A1 | 3/2011 | Ganguly et al. |
| 2011/0061812 A1 | 3/2011 | Ganguly et al. |
| 2011/0065276 A1 | 3/2011 | Ganguly et al. |
| 2011/0076401 A1 | 3/2011 | Chao et al. |
| 2011/0081782 A1 | 4/2011 | Liang et al. |
| 2011/0088847 A1 | 4/2011 | Law et al. |
| 2011/0100489 A1 | 5/2011 | Orito |
| 2011/0101335 A1 | 5/2011 | Yamazaki et al. |
| 2011/0104393 A1 | 5/2011 | Hilkene et al. |
| 2011/0111596 A1 | 5/2011 | Kanakasabapathy |
| 2011/0114601 A1 | 5/2011 | Lubomirsky et al. |
| 2011/0115378 A1 | 5/2011 | Lubomirsky et al. |
| 2011/0124144 A1 | 5/2011 | Schlemm et al. |
| 2011/0127156 A1 | 6/2011 | Foad et al. |
| 2011/0133650 A1 | 6/2011 | Kim |
| 2011/0139748 A1 | 6/2011 | Donnelly et al. |
| 2011/0140229 A1 | 6/2011 | Rachmady et al. |
| 2011/0143542 A1 | 6/2011 | Feurprier et al. |
| 2011/0146909 A1 | 6/2011 | Shih et al. |
| 2011/0147363 A1 | 6/2011 | Yap et al. |
| 2011/0151674 A1 | 6/2011 | Tang et al. |
| 2011/0151677 A1 | 6/2011 | Wang et al. |
| 2011/0151678 A1 | 6/2011 | Ashtiani et al. |
| 2011/0155181 A1 | 6/2011 | Inatomi |
| 2011/0159690 A1 | 6/2011 | Chandrashekar et al. |
| 2011/0165057 A1 | 7/2011 | Honda et al. |
| 2011/0165347 A1 | 7/2011 | Miller et al. |
| 2011/0165771 A1 | 7/2011 | Ring et al. |
| 2011/0174778 A1 | 7/2011 | Sawada et al. |
| 2011/0180847 A1 | 7/2011 | Ikeda et al. |
| 2011/0195575 A1 | 8/2011 | Wang |
| 2011/0198034 A1 | 8/2011 | Sun et al. |
| 2011/0207332 A1 | 8/2011 | Liu et al. |
| 2011/0217851 A1 | 9/2011 | Liang et al. |
| 2011/0223334 A1 | 9/2011 | Yudovsky et al. |
| 2011/0226734 A1 | 9/2011 | Sumiya et al. |
| 2011/0227028 A1 | 9/2011 | Sekar et al. |
| 2011/0230008 A1 | 9/2011 | Lakshmanan et al. |
| 2011/0230052 A1 | 9/2011 | Tang et al. |
| 2011/0232737 A1 | 9/2011 | Ruletzki et al. |
| 2011/0232845 A1 | 9/2011 | Riker et al. |
| 2011/0244686 A1 | 10/2011 | Aso et al. |
| 2011/0244693 A1 | 10/2011 | Tamura et al. |
| 2011/0253044 A1* | 10/2011 | Tam ............... B05B 1/18 118/666 |
| 2011/0256421 A1 | 10/2011 | Bose et al. |
| 2011/0265884 A1 | 11/2011 | Xu et al. |
| 2011/0265887 A1 | 11/2011 | Lee et al. |
| 2011/0265951 A1 | 11/2011 | Xu |
| 2011/0266252 A1 | 11/2011 | Thadani et al. |
| 2011/0266256 A1 | 11/2011 | Cruse et al. |
| 2011/0266682 A1 | 11/2011 | Edelstein et al. |
| 2011/0278260 A1* | 11/2011 | Lai ............... C23C 16/45565 216/68 |
| 2011/0287633 A1 | 11/2011 | Lee et al. |
| 2011/0290419 A1 | 12/2011 | Horiguchi et al. |
| 2011/0294300 A1 | 12/2011 | Zhang et al. |
| 2011/0298061 A1 | 12/2011 | Siddiqui et al. |
| 2011/0303146 A1 | 12/2011 | Nishijima |
| 2011/0304078 A1 | 12/2011 | Lee et al. |
| 2011/0308453 A1 | 12/2011 | Su et al. |
| 2012/0003782 A1 | 1/2012 | Byun et al. |
| 2012/0009796 A1 | 1/2012 | Cui et al. |
| 2012/0012848 A1 | 1/2012 | Suh |
| 2012/0017989 A1 | 1/2012 | Chang et al. |
| 2012/0025289 A1 | 2/2012 | Liang et al. |
| 2012/0031559 A1 | 2/2012 | Dhindsa et al. |
| 2012/0034786 A1 | 2/2012 | Dhindsa et al. |
| 2012/0035766 A1 | 2/2012 | Shajii et al. |
| 2012/0037596 A1 | 2/2012 | Eto et al. |
| 2012/0040492 A1 | 2/2012 | Ovshinsky et al. |
| 2012/0052683 A1 | 3/2012 | Kim et al. |
| 2012/0055402 A1 | 3/2012 | Moriya et al. |
| 2012/0068242 A1 | 3/2012 | Shin et al. |
| 2012/0070982 A1 | 3/2012 | Yu et al. |
| 2012/0073501 A1 | 3/2012 | Lubomirsky et al. |
| 2012/0088356 A1 | 4/2012 | Santhanam et al. |
| 2012/0091108 A1 | 4/2012 | Lin et al. |
| 2012/0097330 A1 | 4/2012 | Iyengar et al. |
| 2012/0100720 A1 | 4/2012 | Winniczek et al. |
| 2012/0103518 A1 | 5/2012 | Kakimoto |
| 2012/0104564 A1 | 5/2012 | Won et al. |
| 2012/0119225 A1 | 5/2012 | Shiomi et al. |
| 2012/0122302 A1 | 5/2012 | Weidman et al. |
| 2012/0122319 A1 | 5/2012 | Shimizu |
| 2012/0129354 A1 | 5/2012 | Luong |
| 2012/0135576 A1 | 5/2012 | Lee et al. |
| 2012/0148369 A1 | 6/2012 | Michalski et al. |
| 2012/0149200 A1 | 6/2012 | Culp et al. |
| 2012/0161405 A1 | 6/2012 | Mohn et al. |
| 2012/0164839 A1 | 6/2012 | Nishimura |
| 2012/0171852 A1 | 7/2012 | Yuan et al. |
| 2012/0180954 A1* | 7/2012 | Yang ............... C23C 16/45565 156/345.34 |
| 2012/0181599 A1 | 7/2012 | Lung |
| 2012/0182808 A1 | 7/2012 | Lue et al. |
| 2012/0187844 A1 | 7/2012 | Hoffman et al. |
| 2012/0196447 A1 | 8/2012 | Yang et al. |
| 2012/0196451 A1 | 8/2012 | Mallick |
| 2012/0202408 A1 | 8/2012 | Shajii et al. |
| 2012/0208361 A1 | 8/2012 | Ha |
| 2012/0211462 A1 | 8/2012 | Zhang et al. |
| 2012/0211722 A1 | 8/2012 | Kellam et al. |
| 2012/0216955 A1 | 8/2012 | Eto et al. |
| 2012/0222616 A1 | 9/2012 | Han et al. |
| 2012/0222815 A1 | 9/2012 | Sabri et al. |
| 2012/0223048 A1 | 9/2012 | Paranjpe et al. |
| 2012/0223418 A1 | 9/2012 | Stowers et al. |
| 2012/0225557 A1 | 9/2012 | Serry et al. |
| 2012/0228642 A1 | 9/2012 | Aube et al. |
| 2012/0234945 A1 | 9/2012 | Olgado |
| 2012/0238102 A1* | 9/2012 | Zhang ............... H01J 37/32422 438/718 |
| 2012/0238103 A1 | 9/2012 | Zhang et al. |
| 2012/0238108 A1 | 9/2012 | Chen et al. |
| 2012/0241411 A1 | 9/2012 | Darling et al. |
| 2012/0247390 A1 | 10/2012 | Sawada et al. |
| 2012/0247670 A1 | 10/2012 | Dobashi et al. |
| 2012/0247671 A1 | 10/2012 | Sugawara |
| 2012/0247677 A1 | 10/2012 | Himori et al. |
| 2012/0255491 A1 | 10/2012 | Hadidi |
| 2012/0258600 A1 | 10/2012 | Godet et al. |
| 2012/0258607 A1 | 10/2012 | Holland et al. |
| 2012/0267346 A1 | 10/2012 | Kao et al. |
| 2012/0269968 A1 | 10/2012 | Rayner |
| 2012/0282779 A1 | 11/2012 | Arnold et al. |
| 2012/0285619 A1 | 11/2012 | Matyushkin et al. |
| 2012/0285621 A1 | 11/2012 | Tan |

(56) References Cited

U.S. PATENT DOCUMENTS

| | | | |
|---|---|---|---|
| 2012/0292664 A1 | 11/2012 | Kanike | |
| 2012/0304933 A1* | 12/2012 | Mai | C23C 16/45565 118/723 I |
| 2012/0305184 A1 | 12/2012 | Singh et al. | |
| 2012/0309204 A1 | 12/2012 | Kang et al. | |
| 2012/0309205 A1 | 12/2012 | Wang et al. | |
| 2012/0322015 A1 | 12/2012 | Kim | |
| 2012/0323008 A1 | 12/2012 | Barry et al. | |
| 2013/0001899 A1 | 1/2013 | Hwang et al. | |
| 2013/0005103 A1 | 1/2013 | Liu et al. | |
| 2013/0005140 A1 | 1/2013 | Jeng et al. | |
| 2013/0012030 A1 | 1/2013 | Lakshmanan et al. | |
| 2013/0012032 A1 | 1/2013 | Liu et al. | |
| 2013/0023094 A1 | 1/2013 | Yeh et al. | |
| 2013/0023124 A1 | 1/2013 | Nemani et al. | |
| 2013/0023125 A1 | 1/2013 | Singh | |
| 2013/0026135 A1 | 1/2013 | Kim | |
| 2013/0032574 A1 | 2/2013 | Liu et al. | |
| 2013/0034666 A1 | 2/2013 | Liang et al. | |
| 2013/0034968 A1 | 2/2013 | Zhang et al. | |
| 2013/0037919 A1 | 2/2013 | Sapra et al. | |
| 2013/0045605 A1* | 2/2013 | Wang | H01L 21/31116 438/723 |
| 2013/0049592 A1 | 2/2013 | Yeom et al. | |
| 2013/0052804 A1 | 2/2013 | Song | |
| 2013/0052827 A1 | 2/2013 | Wang et al. | |
| 2013/0052833 A1 | 2/2013 | Ranjan et al. | |
| 2013/0059440 A1 | 3/2013 | Wang et al. | |
| 2013/0059448 A1 | 3/2013 | Marakhtanov et al. | |
| 2013/0062675 A1 | 3/2013 | Thomas | |
| 2013/0065398 A1 | 3/2013 | Ohsawa et al. | |
| 2013/0065403 A1 | 3/2013 | Paranjpe et al. | |
| 2013/0082197 A1* | 4/2013 | Yang | H01J 37/32422 250/505.1 |
| 2013/0084654 A1 | 4/2013 | Gaylord et al. | |
| 2013/0087309 A1 | 4/2013 | Volfovski | |
| 2013/0089988 A1 | 4/2013 | Wang et al. | |
| 2013/0095646 A1 | 4/2013 | Alsmeier et al. | |
| 2013/0098868 A1 | 4/2013 | Nishimura et al. | |
| 2013/0105303 A1* | 5/2013 | Lubomirsky | H01J 37/32357 204/192.34 |
| 2013/0105948 A1 | 5/2013 | Kewley | |
| 2013/0107415 A1 | 5/2013 | Banna et al. | |
| 2013/0112383 A1* | 5/2013 | Hanamachi | C23C 24/04 165/170 |
| 2013/0115372 A1 | 5/2013 | Pavol et al. | |
| 2013/0118686 A1 | 5/2013 | Carducci et al. | |
| 2013/0119016 A1 | 5/2013 | Kagoshima | |
| 2013/0119457 A1 | 5/2013 | Lue et al. | |
| 2013/0119483 A1 | 5/2013 | Alptekin et al. | |
| 2013/0127124 A1 | 5/2013 | Nam et al. | |
| 2013/0130507 A1 | 5/2013 | Wang et al. | |
| 2013/0133578 A1 | 5/2013 | Hwang | |
| 2013/0133834 A1 | 5/2013 | Dhindsa et al. | |
| 2013/0149866 A1 | 6/2013 | Shriner | |
| 2013/0150303 A1 | 6/2013 | Kungl et al. | |
| 2013/0152859 A1 | 6/2013 | Collins et al. | |
| 2013/0155568 A1 | 6/2013 | Todorow et al. | |
| 2013/0161726 A1 | 6/2013 | Kim et al. | |
| 2013/0171810 A1 | 7/2013 | Sun et al. | |
| 2013/0171827 A1 | 7/2013 | Cho et al. | |
| 2013/0175654 A1 | 7/2013 | Muckenhirn et al. | |
| 2013/0187220 A1 | 7/2013 | Surthi | |
| 2013/0193108 A1 | 8/2013 | Zheng | |
| 2013/0213935 A1 | 8/2013 | Liao et al. | |
| 2013/0217243 A1 | 8/2013 | Underwood et al. | |
| 2013/0224953 A1* | 8/2013 | Salinas | H01L 21/02063 438/689 |
| 2013/0224960 A1 | 8/2013 | Payyapilly et al. | |
| 2013/0260533 A1 | 10/2013 | Sapre et al. | |
| 2013/0260564 A1 | 10/2013 | Sapre et al. | |
| 2013/0276983 A1 | 10/2013 | Park et al. | |
| 2013/0279066 A1 | 10/2013 | Lubomirsky et al. | |
| 2013/0284288 A1 | 10/2013 | Kim | |
| 2013/0284369 A1 | 10/2013 | Kobayashi et al. | |
| 2013/0284370 A1 | 10/2013 | Kobayashi et al. | |
| 2013/0284373 A1 | 10/2013 | Sun et al. | |
| 2013/0284374 A1 | 10/2013 | Lubomirsky et al. | |
| 2013/0284700 A1 | 10/2013 | Nangoy et al. | |
| 2013/0286530 A1 | 10/2013 | Lin et al. | |
| 2013/0286532 A1* | 10/2013 | Kataigi | H01L 21/6875 361/234 |
| 2013/0295297 A1 | 11/2013 | Chou et al. | |
| 2013/0298942 A1 | 11/2013 | Ren et al. | |
| 2013/0299009 A1* | 11/2013 | Jiang | C23C 16/45578 137/334 |
| 2013/0302980 A1 | 11/2013 | Chandrashekar et al. | |
| 2013/0306758 A1* | 11/2013 | Park | C23C 16/345 239/418 |
| 2013/0320550 A1 | 12/2013 | Kim | |
| 2013/0337655 A1 | 12/2013 | Lee et al. | |
| 2013/0343829 A1 | 12/2013 | Benedetti et al. | |
| 2014/0004707 A1 | 1/2014 | Thedjoisworo et al. | |
| 2014/0004708 A1 | 1/2014 | Thedjoisworo | |
| 2014/0008880 A1 | 1/2014 | Miura et al. | |
| 2014/0020708 A1 | 1/2014 | Kim et al. | |
| 2014/0021673 A1* | 1/2014 | Chen | F28D 15/00 269/289 R |
| 2014/0026813 A1 | 1/2014 | Wang et al. | |
| 2014/0034239 A1 | 2/2014 | Yang et al. | |
| 2014/0051253 A1 | 2/2014 | Guha | |
| 2014/0053866 A1 | 2/2014 | Baluja et al. | |
| 2014/0054269 A1 | 2/2014 | Hudson et al. | |
| 2014/0057447 A1* | 2/2014 | Yang | H01L 21/3065 438/711 |
| 2014/0061324 A1 | 3/2014 | Mohn et al. | |
| 2014/0062285 A1 | 3/2014 | Chen | |
| 2014/0065827 A1 | 3/2014 | Kang et al. | |
| 2014/0065842 A1 | 3/2014 | Anthis et al. | |
| 2014/0073143 A1* | 3/2014 | Alokozai | C23C 16/507 438/765 |
| 2014/0076234 A1 | 3/2014 | Kao et al. | |
| 2014/0080308 A1 | 3/2014 | Chen et al. | |
| 2014/0080309 A1 | 3/2014 | Park et al. | |
| 2014/0080310 A1 | 3/2014 | Chen et al. | |
| 2014/0083362 A1 | 3/2014 | Lubomirsky et al. | |
| 2014/0087488 A1 | 3/2014 | Nam et al. | |
| 2014/0087561 A1 | 3/2014 | Lee et al. | |
| 2014/0097270 A1* | 4/2014 | Liang | B05B 1/18 239/132.3 |
| 2014/0099794 A1* | 4/2014 | Ingle | H01J 37/32357 438/710 |
| 2014/0102367 A1 | 4/2014 | Ishibashi | |
| 2014/0110061 A1 | 4/2014 | Okunishi | |
| 2014/0116338 A1 | 5/2014 | He et al. | |
| 2014/0124364 A1 | 5/2014 | Yoo et al. | |
| 2014/0134842 A1 | 5/2014 | Zhang et al. | |
| 2014/0134847 A1 | 5/2014 | Seya | |
| 2014/0141621 A1 | 5/2014 | Ren et al. | |
| 2014/0144876 A1 | 5/2014 | Nakagawa et al. | |
| 2014/0147126 A1 | 5/2014 | Yamashita et al. | |
| 2014/0148015 A1 | 5/2014 | Larson | |
| 2014/0152312 A1 | 6/2014 | Snow et al. | |
| 2014/0154668 A1 | 6/2014 | Chou et al. | |
| 2014/0154889 A1 | 6/2014 | Wang et al. | |
| 2014/0165912 A1 | 6/2014 | Kao et al. | |
| 2014/0166617 A1 | 6/2014 | Chen | |
| 2014/0166618 A1 | 6/2014 | Tadigadapa et al. | |
| 2014/0175530 A1 | 6/2014 | Chien et al. | |
| 2014/0175534 A1 | 6/2014 | Kofuji et al. | |
| 2014/0186772 A1 | 7/2014 | Pohlers et al. | |
| 2014/0190410 A1 | 7/2014 | Kim | |
| 2014/0190632 A1 | 7/2014 | Kumar et al. | |
| 2014/0191388 A1 | 7/2014 | Chen | |
| 2014/0199851 A1 | 7/2014 | Nemani et al. | |
| 2014/0209245 A1 | 7/2014 | Yamamoto et al. | |
| 2014/0216337 A1 | 8/2014 | Swaminathan et al. | |
| 2014/0225504 A1 | 8/2014 | Kaneko et al. | |
| 2014/0227881 A1 | 8/2014 | Lubomirsky et al. | |
| 2014/0234466 A1 | 8/2014 | Gao et al. | |
| 2014/0248773 A1 | 9/2014 | Tsai et al. | |
| 2014/0248780 A1 | 9/2014 | Ingle et al. | |

(56) References Cited

U.S. PATENT DOCUMENTS

| | | |
|---|---|---|
| 2014/0251956 A1 | 9/2014 | Jeon et al. |
| 2014/0252134 A1 | 9/2014 | Chen et al. |
| 2014/0253900 A1 | 9/2014 | Cornelissen et al. |
| 2014/0256131 A1 | 9/2014 | Wang et al. |
| 2014/0256145 A1 | 9/2014 | Abdallah et al. |
| 2014/0262031 A1 | 9/2014 | Belostotskiy et al. |
| 2014/0262038 A1 | 9/2014 | Wang et al. |
| 2014/0263172 A1 | 9/2014 | Xie et al. |
| 2014/0263177 A1 | 9/2014 | Povolny et al. |
| 2014/0263272 A1 | 9/2014 | Duan et al. |
| 2014/0264507 A1 | 9/2014 | Lee et al. |
| 2014/0264533 A1 | 9/2014 | Simsek-Ege |
| 2014/0271097 A1* | 9/2014 | Wang ............... H01L 21/6708 414/805 |
| 2014/0273373 A1 | 9/2014 | Makala et al. |
| 2014/0273406 A1 | 9/2014 | Wang et al. |
| 2014/0273410 A1 | 9/2014 | Abedijaberi et al. |
| 2014/0273451 A1 | 9/2014 | Wang et al. |
| 2014/0273462 A1 | 9/2014 | Simsek-Ege et al. |
| 2014/0273487 A1 | 9/2014 | Deshmukh et al. |
| 2014/0273489 A1 | 9/2014 | Wang et al. |
| 2014/0273491 A1 | 9/2014 | Zhang et al. |
| 2014/0273492 A1 | 9/2014 | Anthis et al. |
| 2014/0273496 A1 | 9/2014 | Kao |
| 2014/0288528 A1 | 9/2014 | Py et al. |
| 2014/0302256 A1 | 10/2014 | Chen et al. |
| 2014/0302678 A1 | 10/2014 | Paterson et al. |
| 2014/0302680 A1 | 10/2014 | Singh |
| 2014/0308758 A1 | 10/2014 | Nemani et al. |
| 2014/0308816 A1 | 10/2014 | Wang et al. |
| 2014/0311581 A1 | 10/2014 | Belostotskiy et al. |
| 2014/0342532 A1 | 11/2014 | Zhu |
| 2014/0342569 A1 | 11/2014 | Zhu et al. |
| 2014/0349477 A1 | 11/2014 | Chandrashekar et al. |
| 2014/0357083 A1 | 12/2014 | Ling et al. |
| 2014/0361684 A1 | 12/2014 | Ikeda et al. |
| 2014/0363977 A1 | 12/2014 | Morimoto et al. |
| 2014/0373782 A1 | 12/2014 | Park et al. |
| 2015/0007770 A1 | 1/2015 | Chandrasekharan et al. |
| 2015/0011096 A1 | 1/2015 | Chandrasekharan et al. |
| 2015/0013793 A1 | 1/2015 | Chuc et al. |
| 2015/0014152 A1 | 1/2015 | Hoinkis et al. |
| 2015/0031211 A1 | 1/2015 | Sapre et al. |
| 2015/0037980 A1 | 2/2015 | Rha |
| 2015/0041430 A1 | 2/2015 | Yoshino et al. |
| 2015/0056814 A1* | 2/2015 | Ling ............... H01L 21/31116 438/705 |
| 2015/0060265 A1* | 3/2015 | Cho ............... H01J 37/32018 204/192.32 |
| 2015/0064918 A1 | 3/2015 | Ranjan et al. |
| 2015/0072508 A1 | 3/2015 | Or et al. |
| 2015/0076110 A1 | 3/2015 | Wu et al. |
| 2015/0076586 A1 | 3/2015 | Rabkin et al. |
| 2015/0079797 A1 | 3/2015 | Chen et al. |
| 2015/0093891 A1 | 4/2015 | Zope |
| 2015/0118822 A1 | 4/2015 | Zhang et al. |
| 2015/0118858 A1 | 4/2015 | Takaba |
| 2015/0123541 A1* | 5/2015 | Baek ............... C23C 16/503 315/111.21 |
| 2015/0126035 A1 | 5/2015 | Diao et al. |
| 2015/0126039 A1 | 5/2015 | Korolik et al. |
| 2015/0126040 A1 | 5/2015 | Korolik et al. |
| 2015/0129541 A1 | 5/2015 | Wang et al. |
| 2015/0129545 A1 | 5/2015 | Ingle et al. |
| 2015/0129546 A1 | 5/2015 | Ingle et al. |
| 2015/0132953 A1 | 5/2015 | Nowling |
| 2015/0132968 A1 | 5/2015 | Ren et al. |
| 2015/0140827 A1 | 5/2015 | Kao et al. |
| 2015/0152072 A1 | 6/2015 | Cantat et al. |
| 2015/0155177 A1 | 6/2015 | Zhang et al. |
| 2015/0155189 A1 | 6/2015 | Cho et al. |
| 2015/0167705 A1 | 6/2015 | Lee et al. |
| 2015/0170811 A1 | 6/2015 | Tanigawa et al. |
| 2015/0170879 A1 | 6/2015 | Nguyen et al. |
| 2015/0170920 A1 | 6/2015 | Purayath et al. |
| 2015/0170924 A1 | 6/2015 | Nguyen et al. |
| 2015/0170926 A1 | 6/2015 | Michalak |
| 2015/0170935 A1 | 6/2015 | Wang et al. |
| 2015/0170943 A1 | 6/2015 | Nguyen et al. |
| 2015/0170956 A1 | 6/2015 | Naik |
| 2015/0171008 A1 | 6/2015 | Luo |
| 2015/0179464 A1 | 6/2015 | Wang et al. |
| 2015/0187625 A1 | 7/2015 | Busche et al. |
| 2015/0191823 A1 | 7/2015 | Banna et al. |
| 2015/0194435 A1 | 7/2015 | Lee |
| 2015/0200042 A1 | 7/2015 | Ling et al. |
| 2015/0206764 A1 | 7/2015 | Wang et al. |
| 2015/0214066 A1 | 7/2015 | Luere et al. |
| 2015/0214067 A1 | 7/2015 | Zhang et al. |
| 2015/0214092 A1 | 7/2015 | Purayath et al. |
| 2015/0214101 A1 | 7/2015 | Ren et al. |
| 2015/0214337 A1 | 7/2015 | Ko et al. |
| 2015/0214653 A1 | 7/2015 | Sakane et al. |
| 2015/0221479 A1 | 8/2015 | Chen et al. |
| 2015/0221541 A1 | 8/2015 | Nemani et al. |
| 2015/0235809 A1 | 8/2015 | Ito et al. |
| 2015/0235860 A1 | 8/2015 | Tomura et al. |
| 2015/0235863 A1 | 8/2015 | Chen |
| 2015/0235865 A1 | 8/2015 | Wang et al. |
| 2015/0235867 A1 | 8/2015 | Nishizuka |
| 2015/0240359 A1 | 8/2015 | Jdira et al. |
| 2015/0247231 A1 | 9/2015 | Nguyen et al. |
| 2015/0249018 A1 | 9/2015 | Park et al. |
| 2015/0255481 A1 | 9/2015 | Baenninger et al. |
| 2015/0270105 A1 | 9/2015 | Kobayashi et al. |
| 2015/0270135 A1 | 9/2015 | Tabat |
| 2015/0270140 A1 | 9/2015 | Gupta et al. |
| 2015/0275361 A1 | 10/2015 | Lubomirsky et al. |
| 2015/0275375 A1 | 10/2015 | Kim et al. |
| 2015/0279687 A1 | 10/2015 | Xue et al. |
| 2015/0294980 A1 | 10/2015 | Lee et al. |
| 2015/0303031 A1 | 10/2015 | Choi |
| 2015/0332930 A1 | 11/2015 | Wang et al. |
| 2015/0332953 A1 | 11/2015 | Futase et al. |
| 2015/0340225 A1 | 11/2015 | Kim et al. |
| 2015/0340371 A1 | 11/2015 | Lue |
| 2015/0345029 A1 | 12/2015 | Wang et al. |
| 2015/0357201 A1 | 12/2015 | Chen et al. |
| 2015/0357205 A1 | 12/2015 | Wang et al. |
| 2015/0371861 A1 | 12/2015 | Li et al. |
| 2015/0371864 A1 | 12/2015 | Hsu et al. |
| 2015/0371865 A1 | 12/2015 | Chen et al. |
| 2015/0371866 A1 | 12/2015 | Chen et al. |
| 2015/0371869 A1 | 12/2015 | Surla et al. |
| 2015/0371877 A1 | 12/2015 | Lin et al. |
| 2015/0372104 A1 | 12/2015 | Liu et al. |
| 2015/0376782 A1 | 12/2015 | Griffin et al. |
| 2015/0376784 A1 | 12/2015 | Wu et al. |
| 2015/0380419 A1 | 12/2015 | Gunji-Yoneoka et al. |
| 2015/0380431 A1 | 12/2015 | Kanamori et al. |
| 2016/0002779 A1 | 1/2016 | Lin et al. |
| 2016/0005571 A1 | 1/2016 | Rosa et al. |
| 2016/0005572 A1 | 1/2016 | Liang et al. |
| 2016/0005833 A1 | 1/2016 | Collins et al. |
| 2016/0020071 A1 | 1/2016 | Khaja et al. |
| 2016/0027654 A1 | 1/2016 | Kim et al. |
| 2016/0027673 A1 | 1/2016 | Wang et al. |
| 2016/0035586 A1 | 2/2016 | Purayath et al. |
| 2016/0035614 A1 | 2/2016 | Purayath et al. |
| 2016/0042920 A1* | 2/2016 | Cho ............... H01J 37/3255 315/111.21 |
| 2016/0042924 A1 | 2/2016 | Kim et al. |
| 2016/0042968 A1 | 2/2016 | Purayath et al. |
| 2016/0043099 A1 | 2/2016 | Purayath et al. |
| 2016/0056167 A1 | 2/2016 | Wang et al. |
| 2016/0056235 A1 | 2/2016 | Lee et al. |
| 2016/0064212 A1 | 3/2016 | Thedjoisworo et al. |
| 2016/0064233 A1 | 3/2016 | Wang et al. |
| 2016/0064247 A1 | 3/2016 | Tomura et al. |
| 2016/0079062 A1 | 3/2016 | Zheng et al. |
| 2016/0079072 A1 | 3/2016 | Wang et al. |
| 2016/0083844 A1 | 3/2016 | Nishitani et al. |
| 2016/0086772 A1 | 3/2016 | Khaja |
| 2016/0086807 A1 | 3/2016 | Park et al. |

(56) References Cited

U.S. PATENT DOCUMENTS

| | | |
|---|---|---|
| 2016/0086808 A1 | 3/2016 | Zhang et al. |
| 2016/0086815 A1 | 3/2016 | Pandit et al. |
| 2016/0086816 A1 | 3/2016 | Wang et al. |
| 2016/0093505 A1 | 3/2016 | Chen et al. |
| 2016/0093506 A1 | 3/2016 | Chen et al. |
| 2016/0093737 A1 | 3/2016 | Li et al. |
| 2016/0097119 A1 | 4/2016 | Cui et al. |
| 2016/0099173 A1 | 4/2016 | Agarwal et al. |
| 2016/0104606 A1* | 4/2016 | Park .................. H01J 37/32082 |
| | | 156/345.38 |
| 2016/0104648 A1* | 4/2016 | Park ...................... C23C 16/505 |
| | | 438/9 |
| 2016/0109863 A1 | 4/2016 | Valcore et al. |
| 2016/0111258 A1 | 4/2016 | Taskar |
| 2016/0111315 A1 | 4/2016 | Parkhe |
| 2016/0117425 A1 | 4/2016 | Povolny et al. |
| 2016/0118227 A1 | 4/2016 | Valcore et al. |
| 2016/0118268 A1 | 4/2016 | Ingle et al. |
| 2016/0118396 A1 | 4/2016 | Rabkin et al. |
| 2016/0126118 A1 | 5/2016 | Chen et al. |
| 2016/0133480 A1 | 5/2016 | Ko et al. |
| 2016/0136660 A1 | 5/2016 | Song |
| 2016/0141179 A1 | 5/2016 | Wu et al. |
| 2016/0141419 A1 | 5/2016 | Baenninger et al. |
| 2016/0148805 A1 | 5/2016 | Jongbloed et al. |
| 2016/0148821 A1 | 5/2016 | Singh et al. |
| 2016/0163512 A1 | 6/2016 | Lubomirsky |
| 2016/0163513 A1 | 6/2016 | Lubomirsky |
| 2016/0172216 A1 | 6/2016 | Marakhtanov et al. |
| 2016/0172226 A1 | 6/2016 | West et al. |
| 2016/0181112 A1 | 6/2016 | Xue et al. |
| 2016/0181116 A1 | 6/2016 | Berry et al. |
| 2016/0189933 A1 | 6/2016 | Kobayashi et al. |
| 2016/0190147 A1 | 6/2016 | Kato et al. |
| 2016/0196969 A1 | 7/2016 | Berry et al. |
| 2016/0196984 A1 | 7/2016 | Lill et al. |
| 2016/0203952 A1 | 7/2016 | Tucker et al. |
| 2016/0203958 A1 | 7/2016 | Arase et al. |
| 2016/0204009 A1 | 7/2016 | Nguyen et al. |
| 2016/0208395 A1 | 7/2016 | Ooshima |
| 2016/0217013 A1 | 7/2016 | Song et al. |
| 2016/0218018 A1 | 7/2016 | Lieu et al. |
| 2016/0222522 A1 | 8/2016 | Wang et al. |
| 2016/0225616 A1 | 8/2016 | Li et al. |
| 2016/0225651 A1* | 8/2016 | Tran .................... H01L 21/6833 |
| 2016/0225652 A1 | 8/2016 | Tran et al. |
| 2016/0237570 A1 | 8/2016 | Tan et al. |
| 2016/0240344 A1 | 8/2016 | Kemen et al. |
| 2016/0240353 A1 | 8/2016 | Nagami |
| 2016/0240389 A1 | 8/2016 | Zhang et al. |
| 2016/0240402 A1 | 8/2016 | Park et al. |
| 2016/0254165 A1 | 9/2016 | Posseme |
| 2016/0260588 A1 | 9/2016 | Park et al. |
| 2016/0260616 A1 | 9/2016 | Li et al. |
| 2016/0260619 A1 | 9/2016 | Zhang et al. |
| 2016/0284556 A1 | 9/2016 | Ingle et al. |
| 2016/0293388 A1 | 10/2016 | Chen et al. |
| 2016/0293398 A1 | 10/2016 | Danek et al. |
| 2016/0293438 A1 | 10/2016 | Zhou et al. |
| 2016/0300694 A1 | 10/2016 | Yang et al. |
| 2016/0307743 A1 | 10/2016 | Brown et al. |
| 2016/0307771 A1* | 10/2016 | Xu ..................... H01L 21/31116 |
| 2016/0307772 A1 | 10/2016 | Choi et al. |
| 2016/0314961 A1 | 10/2016 | Liu et al. |
| 2016/0314985 A1 | 10/2016 | Yang et al. |
| 2016/0319452 A1 | 11/2016 | Eidschun et al. |
| 2016/0340781 A1* | 11/2016 | Thomas .............. C23C 16/4408 |
| 2016/0343548 A1 | 11/2016 | Howald et al. |
| 2016/0348244 A1 | 12/2016 | Sabri et al. |
| 2016/0351377 A1 | 12/2016 | Okamoto et al. |
| 2016/0358793 A1 | 12/2016 | Okumura et al. |
| 2016/0365228 A1 | 12/2016 | Singh et al. |
| 2017/0011922 A1 | 1/2017 | Tanimura et al. |
| 2017/0030626 A1 | 2/2017 | Closs et al. |
| 2017/0040175 A1 | 2/2017 | Xu et al. |
| 2017/0040180 A1 | 2/2017 | Xu et al. |
| 2017/0040190 A1 | 2/2017 | Benjaminson et al. |
| 2017/0040191 A1 | 2/2017 | Benjaminson et al. |
| 2017/0040207 A1 | 2/2017 | Purayath |
| 2017/0040214 A1 | 2/2017 | Lai et al. |
| 2017/0053808 A1 | 2/2017 | Kamp et al. |
| 2017/0062184 A1 | 3/2017 | Tran et al. |
| 2016/0196985 A1 | 4/2017 | Tan et al. |
| 2017/0104061 A1 | 4/2017 | Peng et al. |
| 2017/0110290 A1 | 4/2017 | Kobayashi et al. |
| 2017/0110335 A1 | 4/2017 | Yang et al. |
| 2017/0110475 A1 | 4/2017 | Liu et al. |
| 2017/0121818 A1 | 5/2017 | Dunn et al. |
| 2017/0133202 A1 | 5/2017 | Berry |
| 2017/0154784 A1 | 6/2017 | Wada |
| 2017/0169995 A1 | 6/2017 | Kim et al. |
| 2017/0178894 A1 | 6/2017 | Stone et al. |
| 2017/0178899 A1 | 6/2017 | Kabansky et al. |
| 2017/0178915 A1 | 6/2017 | Ingle et al. |
| 2017/0178924 A1 | 6/2017 | Chen et al. |
| 2017/0194128 A1* | 7/2017 | Lai ................... C23C 16/45565 |
| 2017/0207088 A1 | 7/2017 | Kwon et al. |
| 2017/0221708 A1 | 8/2017 | Bergendahl et al. |
| 2017/0226637 A1 | 8/2017 | Lubomirsky et al. |
| 2017/0229287 A1 | 8/2017 | Xu et al. |
| 2017/0229289 A1 | 8/2017 | Lubomirsky et al. |
| 2017/0229291 A1 | 8/2017 | Singh et al. |
| 2017/0229293 A1 | 8/2017 | Park et al. |
| 2017/0229326 A1 | 8/2017 | Tran et al. |
| 2017/0229328 A1 | 8/2017 | Benjaminson et al. |
| 2017/0229329 A1 | 8/2017 | Benjaminson et al. |
| 2017/0236694 A1 | 8/2017 | Eason et al. |
| 2017/0250193 A1 | 8/2017 | Huo |
| 2017/0283947 A1 | 10/2017 | Rasheed et al. |
| 2017/0294445 A1 | 10/2017 | Son et al. |
| 2017/0306494 A1 | 10/2017 | Lin et al. |
| 2017/0309509 A1 | 10/2017 | Tran et al. |
| 2017/0316920 A1 | 11/2017 | Melikyan et al. |
| 2017/0316935 A1 | 11/2017 | Tan et al. |
| 2017/0330728 A1 | 11/2017 | Bravo et al. |
| 2017/0335457 A1 | 11/2017 | Nguyen et al. |
| 2017/0338133 A1 | 11/2017 | Tan et al. |
| 2017/0338134 A1 | 11/2017 | Tan et al. |
| 2017/0342556 A1 | 11/2017 | Crook et al. |
| 2017/0350011 A1 | 12/2017 | Marquardt |
| 2017/0362704 A1 | 12/2017 | Yamashita |
| 2017/0373082 A1 | 12/2017 | Sekine et al. |
| 2018/0005850 A1 | 1/2018 | Citla et al. |
| 2018/0005857 A1 | 1/2018 | Zhang et al. |
| 2018/0006041 A1 | 1/2018 | Xu et al. |
| 2018/0006050 A1 | 1/2018 | Watanabe et al. |
| 2018/0025900 A1 | 1/2018 | Park et al. |
| 2018/0033643 A1 | 2/2018 | Sharma et al. |
| 2018/0061618 A1 | 3/2018 | Nichols et al. |
| 2018/0069000 A1 | 3/2018 | Bergendahl et al. |
| 2018/0076031 A1 | 3/2018 | Yan et al. |
| 2018/0076048 A1 | 3/2018 | Gohira et al. |
| 2018/0080124 A1 | 3/2018 | Bajaj et al. |
| 2018/0096819 A1* | 4/2018 | Lubomirsky ......... H01J 37/3244 |
| 2018/0096821 A1* | 4/2018 | Lubomirsky ........ H01L 21/3065 |
| 2018/0096865 A1* | 4/2018 | Lubomirsky ..... H01L 21/67069 |
| 2018/0102255 A1 | 4/2018 | Chen et al. |
| 2018/0102256 A1 | 4/2018 | Chen et al. |
| 2018/0130818 A1 | 5/2018 | Kim et al. |
| 2018/0138049 A1 | 5/2018 | Ko et al. |
| 2018/0138055 A1 | 5/2018 | Xu et al. |
| 2018/0138075 A1 | 5/2018 | Kang et al. |
| 2018/0138085 A1 | 5/2018 | Wang et al. |
| 2018/0144970 A1 | 5/2018 | Chuang et al. |
| 2018/0151683 A1 | 5/2018 | Yeo et al. |
| 2018/0175051 A1 | 6/2018 | Lue et al. |
| 2018/0182633 A1 | 6/2018 | Pandit et al. |
| 2018/0182777 A1 | 6/2018 | Cui et al. |
| 2018/0211862 A1 | 7/2018 | Konkola et al. |
| 2018/0223437 A1 | 8/2018 | Geroge et al. |
| 2018/0226223 A1 | 8/2018 | Lubomirsky |
| 2018/0226230 A1 | 8/2018 | Kobayashi et al. |
| 2018/0226259 A1 | 8/2018 | Choi et al. |
| 2018/0226278 A1 | 8/2018 | Arnepalli et al. |

(56) References Cited

U.S. PATENT DOCUMENTS

| | | |
|---|---|---|
| 2018/0226425 A1 | 8/2018 | Purayath |
| 2018/0226426 A1 | 8/2018 | Purayath |
| 2018/0240654 A1 | 8/2018 | Park et al. |
| 2018/0261516 A1 | 9/2018 | Lin et al. |
| 2018/0261686 A1 | 9/2018 | Lin et al. |
| 2018/0337024 A1 | 11/2018 | Tan et al. |
| 2018/0337057 A1 | 11/2018 | Samir et al. |
| 2018/0342375 A1 | 11/2018 | Nguyen et al. |
| 2018/0350619 A1 | 12/2018 | Chen et al. |
| 2018/0366351 A1 | 12/2018 | Lubomirsky |
| 2019/0013211 A1 | 1/2019 | Wang et al. |
| 2019/0032211 A1 | 1/2019 | Tucker et al. |
| 2019/0037264 A1 | 1/2019 | Lyons et al. |
| 2019/0040529 A1 | 2/2019 | Verbaas et al. |
| 2019/0067006 A1 | 2/2019 | Hawrylchak et al. |
| 2019/0074191 A1 | 3/2019 | Nagatomo et al. |
| 2019/0252154 A1 | 8/2019 | Samir et al. |
| 2019/0252216 A1 | 8/2019 | Samir et al. |
| 2019/0271082 A1 | 9/2019 | Wang et al. |
| 2019/0272998 A1 | 9/2019 | Yang et al. |
| 2019/0311883 A1 | 10/2019 | Samir et al. |
| 2019/0333786 A1 | 10/2019 | Samir et al. |
| 2020/0060005 A1 | 2/2020 | Radermacher et al. |
| 2020/0087784 A1 | 3/2020 | Wu et al. |
| 2020/0215566 A1 | 7/2020 | Subbuswamy et al. |

FOREIGN PATENT DOCUMENTS

| | | |
|---|---|---|
| CN | 101236893 A | 8/2008 |
| CN | 101378850 A | 3/2009 |
| CN | 102893705 | 1/2013 |
| EP | 1675160 A1 | 6/2006 |
| JP | S59-126778 A | 7/1984 |
| JP | S62-45119 A | 2/1987 |
| JP | 63301051 A | 12/1988 |
| JP | H01-200627 A | 8/1989 |
| JP | H02-114525 A | 4/1990 |
| JP | H07-153739 A | 6/1995 |
| JP | H8-31755 A | 2/1996 |
| JP | H08-107101 A | 4/1996 |
| JP | H08-264510 A | 10/1996 |
| JP | H09-260356 A | 10/1997 |
| JP | 2001-313282 A | 11/2001 |
| JP | 2001-332608 A | 11/2001 |
| JP | 2002-075972 A | 3/2002 |
| JP | 2002-083869 A | 3/2002 |
| JP | 2003-174020 A | 6/2003 |
| JP | 2003-282591 A | 10/2003 |
| JP | 2004-508709 A | 3/2004 |
| JP | 2004-296467 A | 10/2004 |
| JP | 2005-050908 A | 2/2005 |
| JP | 2006-041039 A | 2/2006 |
| JP | 2006-066408 A | 3/2006 |
| JP | 2008-288560 A | 11/2008 |
| JP | 4191137 B2 | 12/2008 |
| JP | 2009-141343 A | 6/2009 |
| JP | 2009-530871 A | 8/2009 |
| JP | 2009-239056 A | 10/2009 |
| JP | 2010-180458 | 8/2010 |
| JP | 2011-508436 A | 3/2011 |
| JP | 2011-518408 A | 6/2011 |
| JP | 4763293 B2 | 8/2011 |
| JP | 2011-171378 A | 9/2011 |
| JP | 2012-19164 A | 1/2012 |
| JP | 2012-019194 A | 1/2012 |
| JP | 2012-512531 A | 5/2012 |
| JP | 2013-243418 A | 12/2013 |
| JP | 5802323 B2 | 10/2015 |
| JP | 2016-111177 A | 6/2016 |
| KR | 10-2000-008278 A | 2/2000 |
| KR | 10-2000-0064946 A | 11/2000 |
| KR | 10-2001-0056735 A | 7/2001 |
| KR | 2003-0023964 A | 3/2003 |
| KR | 10-2003-0054725 A | 7/2003 |
| KR | 10-2003-0083663 A | 10/2003 |
| KR | 100441297 B1 | 7/2004 |
| KR | 10-2005-0007143 A | 1/2005 |
| KR | 10-2005-0042701 A | 5/2005 |
| KR | 2005-0049903 A | 5/2005 |
| KR | 10-2006-0080509 A | 7/2006 |
| KR | 1006-41762 B1 | 11/2006 |
| KR | 10-2006-0127173 A | 12/2006 |
| KR | 100663668 B1 | 1/2007 |
| KR | 100678696 B1 | 1/2007 |
| KR | 100712727 B1 | 4/2007 |
| KR | 2007-0079870 A | 8/2007 |
| KR | 10-2008-0063988 A | 7/2008 |
| KR | 10-0843236 B1 | 7/2008 |
| KR | 10-2009-0040869 A | 4/2009 |
| KR | 10-2009-0128913 A | 12/2009 |
| KR | 10-2010-0013980 A | 2/2010 |
| KR | 10-2010-0093358 A | 8/2010 |
| KR | 10-2011-0086540 A | 7/2011 |
| KR | 10-2011-0114538 A | 10/2011 |
| KR | 10-2011-0126675 A | 11/2011 |
| KR | 10-2012-0022251 A | 3/2012 |
| KR | 10-2012-0082640 A | 7/2012 |
| KR | 10-2016-0002543 A | 1/2016 |
| TW | 2006-12480 A | 4/2006 |
| TW | 200709256 A | 3/2007 |
| TW | 2007-35196 A | 9/2007 |
| TW | 2011-27983 A1 | 8/2011 |
| TW | 2012-07919 | 2/2012 |
| TW | 2012-13594 A | 4/2012 |
| TW | 2012-33842 A1 | 8/2012 |
| WO | 2008-112673 A2 | 9/2008 |
| WO | 2009-009611 A2 | 1/2009 |
| WO | 2009-084194 A1 | 7/2009 |
| WO | 2010-010706 | 1/2010 |
| WO | 2010-113946 A1 | 10/2010 |
| WO | 2011-027515 A | 3/2011 |
| WO | 2011-031556 A | 3/2011 |
| WO | 2011070945 A1 | 6/2011 |
| WO | 2011-095846 A1 | 8/2011 |
| WO | 2011-149638 A | 12/2011 |
| WO | 2012-050321 A | 4/2012 |
| WO | 2012-118987 A1 | 9/2012 |
| WO | 2012-125656 A2 | 9/2012 |
| WO | 2012-148568 A1 | 11/2012 |
| WO | 2013-118260 A1 | 8/2013 |

OTHER PUBLICATIONS

International Search Report and Written Opinion of PCT/US2018/016648 dated May 18, 2018, all pages.
H. Xiao, Introduction to Semiconductor Manufacturing Technology, published by Prentice Hall, 2001, ISBN 0-13-022404-9, pp. 354-356.
Manual No. TQMA72E1. "Bayard-Alpert Pirani Gauge FRG-730: Short Operating Instructions" Mar. 2012. Agilent Technologies, Lexington, MA 02421, USA. pp. 1-45.
International Search Report and Written Opinion of PCT/US2016/045551 dated Nov. 17, 2016, all pages.
International Search Report and Written Opinion of PCT/US2016/045543 dated Nov. 17, 2016, all pages.
"Liang et al. Industrial Application of Plasma Process vol. 3, pp. 61-74, 2010".
Instrument Manual: Vacuum Gauge Model MM200, Rev D. TELEVAC (website: www.televac.com), A Division of the Fredericks Company, Huntingdon Valley, PA, US. 2008. pp. 162.
J.J. Wang and et al., "Inductively coupled plasma etching of bulk 1-20 6H-SiC and thin-film SiCN in NF3 chemistries," Journal of Vacuum Science & Technology A: Vacuum, Surfaces, and Films 16, 2204 (1998).
Won et al. Derwent 2006-065772; Sep. 7, 2014, 10 pages.
International Search Report and Written Opinion of PCT/US2017/060696 dated Jan. 25, 2018, all pages.
International Search Report and Written Opinion of PCT/US2017/055431 dated Jan. 19, 2018, all pages.
International Search Report and Written Opinion of PCT/US2017/047209 dated Nov. 24, 2017, all pages.

(56) References Cited

OTHER PUBLICATIONS

International Search Report and Written Opinion of PCT/US2017/033362 dated Aug. 24, 2017, all pages.

* cited by examiner

DUAL-CHANNEL SHOWERHEAD WITH IMPROVED PROFILE

CROSS-REFERENCES TO RELATED APPLICATIONS

This application is a continuation of U.S. patent application Ser. No. 15/285,331 filed Oct. 4, 2016, and titled "DUAL-CHANNEL SHOWERHEAD WITH IMPROVED PROFILE" which is hereby incorporated herein in its entirety by reference for all purposes.

TECHNICAL FIELD

The present technology relates to semiconductor systems, processes, and equipment. More specifically, the present technology relates to processing chambers that may include showerheads that may be used as a plasma electrode.

BACKGROUND

Integrated circuits are made possible by processes which produce intricately patterned material layers on substrate surfaces. Producing patterned material on a substrate requires controlled methods for removal of exposed material. Chemical etching is used for a variety of purposes including transferring a pattern in photoresist into underlying layers, thinning layers, or thinning lateral dimensions of features already present on the surface. Often it is desirable to have an etch process that etches one material faster than another facilitating, for example, a pattern transfer process. Such an etch process is said to be selective to the first material. As a result of the diversity of materials, circuits, and processes, etch processes have been developed with a selectivity towards a variety of materials.

Etch processes, deposition processes, and cleaning processes may be performed in a variety of chambers. These chambers may include components that may be used to form a capacitively-coupled plasma, or may be proximate internal chamber regions where other forms of plasma are produced, such as inductively-coupled plasma, for example. The chamber components may be configured in certain ways to reduce effects of plasma generation or precursor distribution through the chamber, but this may be at the cost of additional functionality.

Thus, there is a need for improved systems and methods that can be used to produce high quality devices and structures. These and other needs are addressed by the present technology.

SUMMARY

Semiconductor processing systems and methods of the present technology may include semiconductor processing chambers including a chamber housing at least partially defining an interior region of the semiconductor processing chamber, and the chamber housing may include a lid. The cambers may include a pedestal configured to support a substrate within a processing region of the semiconductor processing chamber. The chambers may include a first showerhead positioned between the lid and the processing region, and may include a faceplate positioned between the first showerhead and the processing region of the semiconductor processing chamber. The chambers may also include a second showerhead positioned within the chamber between the faceplate and the processing region of the semiconductor processing chamber. The second showerhead may include at least two plates coupled together to define a volume between the at least two plates. The at least two plates may at least partially define channels through the second showerhead, and each channel may be characterized by a first diameter at a first end of the channel and may be characterized by a plurality of ports at a second end of the channel.

In embodiments each port may be characterized by a diameter less than the first diameter. Additionally, the first showerhead may be coupled with an electrical source, and the faceplate may be coupled with electrical ground. Exemplary semiconductor processing chambers may also include a spacer between the first showerhead and the faceplate. The first showerhead, the faceplate, and the spacer may be configured to at least partially define a plasma processing region within the semiconductor processing chamber. In some embodiments the pedestal may be coupled with an electrical source, and the second showerhead may be coupled with electrical ground. The pedestal and the second showerhead may be configured to at least partially define a plasma processing region within the processing region of the semiconductor processing chamber. In embodiments the faceplate and the second showerhead may be in direct contact, and the faceplate and the second showerhead may both be coupled with electrical ground.

The second showerhead may be positioned within the chamber having the first end of each channel facing the faceplate, and having the second end of each channel proximate the processing region of the semiconductor processing chamber. Additionally, the second showerhead may be positioned within the chamber having the first end of each channel proximate the processing region of the semiconductor processing chamber, and having the second end of each channel facing the faceplate. A surface of the second showerhead may be adjacent the processing region of the semiconductor processing chamber, and the surface may be coated or treated. In some embodiments, the first diameter may be at least about 2.5 mm, and a diameter of each port may be less than or about 1.2 mm.

The present technology also encompasses showerheads. The showerheads may include a first plate defining a plurality of through-holes. The showerhead may also include a second plate coupled with the first plate. The second plate may define a first plurality of apertures and a second plurality of apertures, and the second plurality of apertures may be defined in the second plate in a plurality of groups of apertures including at least two apertures of the second plurality of apertures. In some embodiments, each through-hole of the first plate may be aligned with at least one group of apertures to produce a channel.

In embodiments the first plate and the second plate may be coupled with one another to define a volume between the first plate and the second plate. The volume may be fluidly accessible from the first plurality of apertures of the second plate, and the channels may be fluidly isolated from the volume defined between the first plate and the second plate. The first plurality of apertures may be defined in the second plate in a plurality of first groups of apertures including at least two apertures of the first plurality of apertures, and each first group of apertures may surround a group of apertures of the second plurality of apertures. In some embodiments each first group of apertures may include at least 4 apertures. In some embodiments each through-hole may be characterized by a diameter of at least about 5 mm. Each aperture of the second plurality of apertures may be characterized by a diameter of less than or about 1 mm. Each group of apertures of the second plurality of apertures may include at least about 6 apertures. In some embodiments the second plate may include a material resistant to plasma degradation.

The present technology may also encompass showerheads, which may include a first plate defining a first plurality of apertures. The first plurality of apertures may be defined in the first plate in a plurality of groups of apertures including at least two apertures of the first plurality of apertures. The showerheads may also include a second plate coupled with the first plate. The second plate may define a second plurality of apertures and a plurality of through-holes, and each through-hole of the second plate may be aligned with at least one group of apertures of the first plurality of apertures to produce a channel.

Such technology may provide numerous benefits over conventional systems and techniques. For example, showerheads of the present technology may provide an improved ground path that may limit plasma leakage. Additionally, the showerheads may limit reaction byproducts from back streaming and contacting other chamber components. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
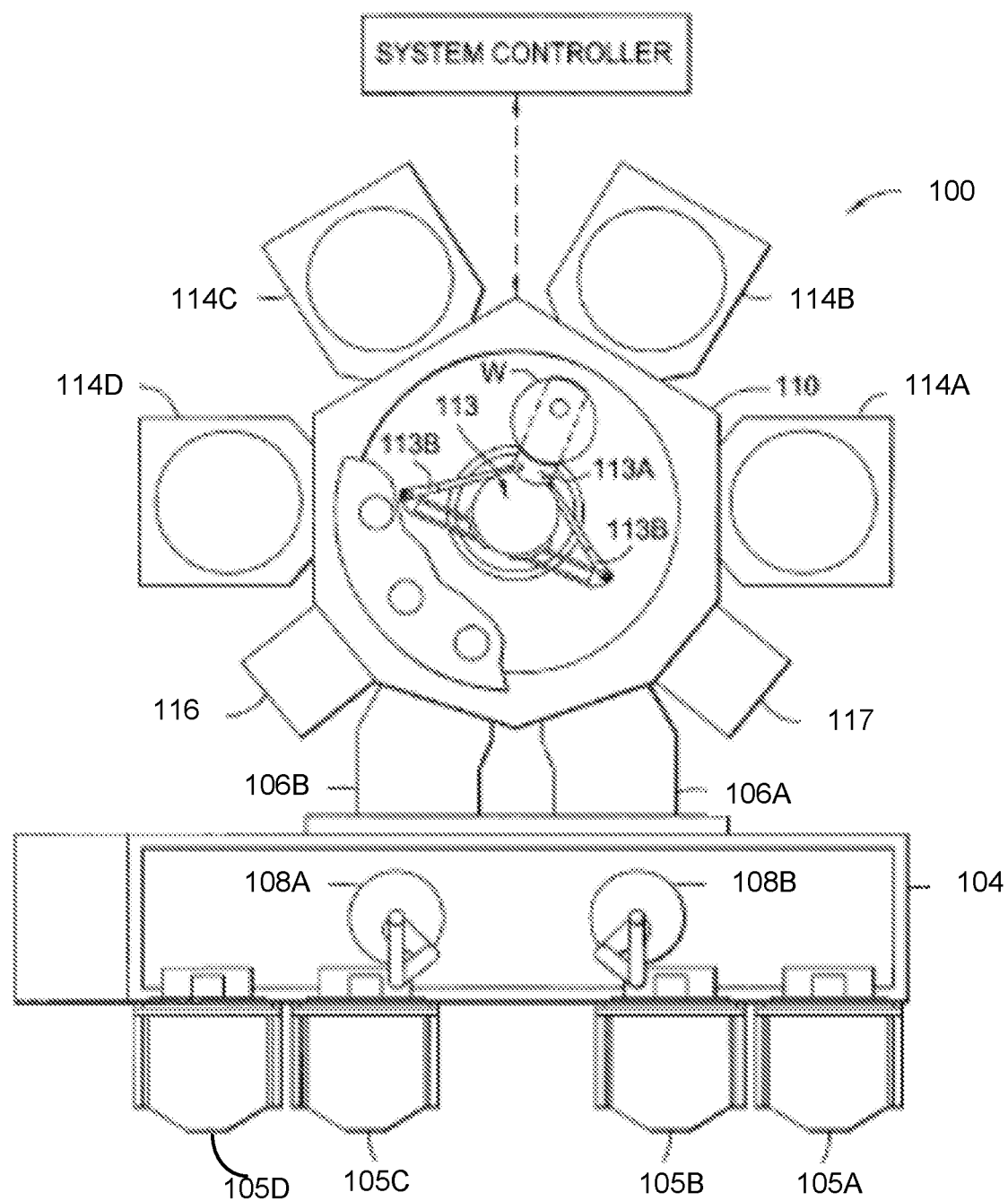
FIG. 1 shows a top plan view of an exemplary processing system according to embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include additional or exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

The present technology includes systems and components for semiconductor processing including tuned etch processes. Certain processing chambers available may include multiple plasma mechanisms, such as one at the wafer level as well as a remote plasma source. Plasma at the wafer level may often be formed via a capacitively-coupled plasma formed between two electrodes. One or both of these electrodes may be or include additional chamber components, such as showerheads, pedestals, or chamber walls. Showerheads may be configured in any number of ways to affect precursor distribution, and may also be used as an electrode in plasma generation. However, showerhead configurations to improve flow profiles in a processing chamber may impact the showerhead performance as an electrode.

For example, increased aperture diameter through the showerhead may allow improvements in radical recombination as well as flow uniformity through the showerhead. On the other hand, if the showerhead is also operating as an electrode, increased aperture diameter may allow plasma leakage through the showerhead, which may then interact with other components. For wafer level plasma, larger aperture diameters may also allow reaction byproducts from etching or deposition reactions to backflow through the apertures and contact, deposit, or react with other chamber components.

Conventional technologies may have dealt with these phenomena in a number of ways. In one example, an additional plate or showerhead was included in the processing region to prevent or reduce any backflow of materials through the showerhead. However, such a component may increase chamber flow paths for precursors. For radical precursors travelling through the chamber, this may allow recombination or loss of energy to occur, which may reduce the effectiveness of the precursor or plasma effluents. The present technology may overcome these deficiencies by providing improved showerheads that may be utilized in semiconductor processing chambers, including for use with wafer-level plasma generation. The showerheads may include channels having increased diameter on one end to allow adequate precursor flow, and may include ports at an opposite end to prevent plasma and reaction byproducts from flowing back through the showerhead. These designs may protect other chamber components, while also limiting the effect on radical recombination rates.

Although the remaining disclosure will routinely identify specific etching processes utilizing the disclosed technology, it will be readily understood that the systems and methods are equally applicable to deposition and cleaning processes as may occur in the described chambers. Accordingly, the technology should not be considered to be so limited as for use with etching processes alone.

FIG. 1 shows a top plan view of one embodiment of a processing system 100 of deposition, etching, baking, and curing chambers according to embodiments. The processing tool 100 depicted in FIG. 1 may contain a plurality of process chambers, 114A-D, a transfer chamber 110, a service chamber 116, an integrated metrology chamber 117, and a pair of load lock chambers 106A-B. The process chambers may include structures or components similar to those described in relation to FIG. 2, as well as additional processing chambers.

To transport substrates among the chambers, the transfer chamber 110 may contain a robotic transport mechanism 113. The transport mechanism 113 may have a pair of substrate transport blades 113A attached to the distal ends of extendible arms 113B, respectively. The blades 113A may be used for carrying individual substrates to and from the process chambers. In operation, one of the substrate transport blades such as blade 113A of the transport mechanism 113 may retrieve a substrate W from one of the load lock chambers such as chambers 106A-B and carry substrate W to a first stage of processing, for example, an etching process as described below in chambers 114A-D. If the chamber is occupied, the robot may wait until the processing is complete and then remove the processed substrate from the chamber with one blade 113A and may insert a new substrate with a second blade (not shown). Once the substrate is processed, it may then be moved to a second stage of processing. For each move, the transport mechanism 113 generally may have one blade carrying a substrate and one blade empty to execute a substrate exchange. The transport mechanism 113 may wait at each chamber until an exchange can be accomplished.

Once processing is complete within the process chambers, the transport mechanism 113 may move the substrate W from the last process chamber and transport the substrate W to a cassette within the load lock chambers 106A-B. From the load lock chambers 106A-B, the substrate may move into a factory interface 104. The factory interface 104 generally may operate to transfer substrates between pod loaders 105A-D in an atmospheric pressure clean environment and the load lock chambers 106A-B. The clean environment in factory interface 104 may be generally provided through air filtration processes, such as HEPA filtration, for example. Factory interface 104 may also include a substrate orienter/aligner (not shown) that may be used to properly align the substrates prior to processing. At least one substrate robot, such as robots 108A-B, may be positioned in factory interface 104 to transport substrates between various positions/locations within factory interface 104 and to other locations in communication therewith. Robots 108A-B may be configured to travel along a track system within enclosure 104 from a first end to a second end of the factory interface 104.

The processing system 100 may further include an integrated metrology chamber 117 to provide control signals, which may provide adaptive control over any of the processes being performed in the processing chambers. The integrated metrology chamber 117 may include any of a variety of metrological devices to measure various film properties, such as thickness, roughness, composition, and the metrology devices may further be capable of characterizing grating parameters such as critical dimensions, sidewall angle, and feature height under vacuum in an automated manner.

Figure 2:
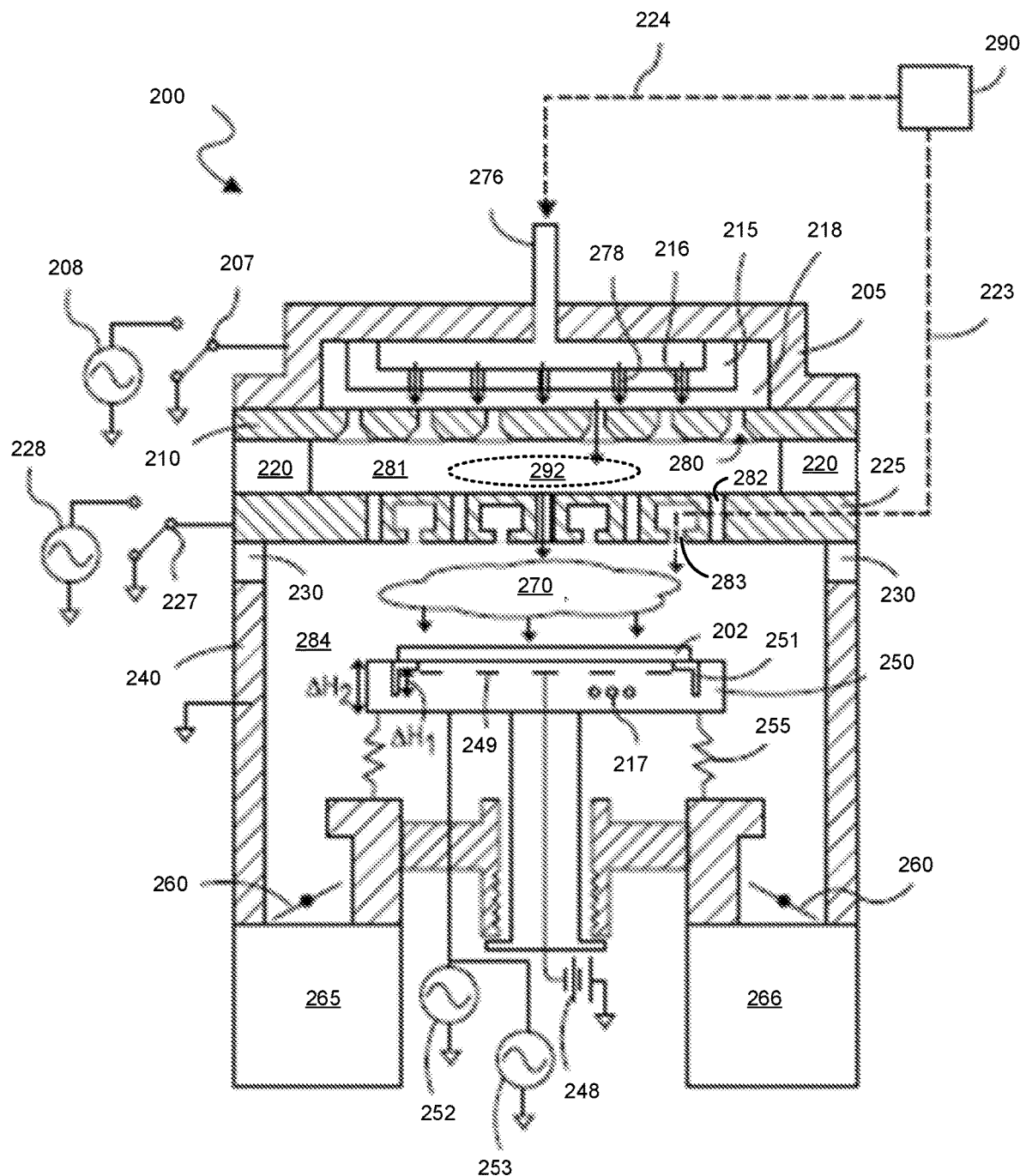
FIG. 2 shows a schematic cross-sectional view of an exemplary processing chamber according to embodiments of the present technology.

Turning now to FIG. 2 is shown a cross-sectional view of an exemplary process chamber system 200 according to the present technology. Chamber 200 may be used, for example, in one or more of the processing chamber sections 114 of the system 100 previously discussed. Generally, the etch chamber 200 may include a first capacitively-coupled plasma source to implement an ion milling operation and a second capacitively-coupled plasma source to implement an etching operation and to implement an optional deposition operation. The chamber 200 may include grounded chamber walls 240 surrounding a chuck 250. In embodiments, the chuck 250 may be an electrostatic chuck that clamps the substrate 202 to a top surface of the chuck 250 during processing, though other clamping mechanisms as would be known may also be utilized. The chuck 250 may include an embedded heat exchanger coil 217. In the exemplary embodiment, the heat exchanger coil 217 includes one or more heat transfer fluid channels through which heat transfer fluid, such as an ethylene glycol/water mix, may be passed to control the temperature of the chuck 250 and ultimately the temperature of the substrate 202.

The chuck 250 may include a mesh 249 coupled to a high voltage DC supply 248 so that the mesh 249 may carry a DC bias potential to implement the electrostatic clamping of the substrate 202. The chuck 250 may be coupled with a first RF power source and in one such embodiment, the mesh 249 may be coupled with the first RF power source so that both the DC voltage offset and the RF voltage potentials are coupled across a thin dielectric layer on the top surface of the chuck 250. In the illustrative embodiment, the first RF power source may include a first and second RF generator 252, 253. The RF generators 252, 253 may operate at any industrially utilized frequency, however in the exemplary embodiment the RF generator 252 may operate at 60 MHz to provide advantageous directionality. Where a second RF generator 253 is also provided, the exemplary frequency may be 2 MHz.

With the chuck 250 to be RF powered, an RF return path may be provided by a first showerhead 225, which may include a dual channel showerhead. The first showerhead 225 may be disposed above the chuck to distribute a first feed gas into a first chamber region 284 defined by the first showerhead 225 and the chamber wall 240. As such, the chuck 250 and the first showerhead 225 form a first RF coupled electrode pair to capacitively energize a first plasma 270 of a first feed gas within a first chamber region 284. A DC plasma bias, or RF bias, resulting from capacitive coupling of the RF powered chuck may generate an ion flux from the first plasma 270 to the substrate 202, e.g., Ar ions where the first feed gas is Ar, to provide an ion milling plasma. The first showerhead 225 may be grounded or alternately coupled with an RF source 228 having one or more generators operable at a frequency other than that of the chuck 250, e.g., 13.56 MHz or 60 MHz. In the illustrated embodiment the first showerhead 225 may be selectably coupled to ground or the RF source 228 through the relay 227 which may be automatically controlled during the etch process, for example by a controller (not shown). In disclosed embodiments, chamber 200 may not include showerhead 225 or dielectric spacer 220, and may instead include only baffle 215 and showerhead 210 described further below.

As further illustrated in the figure, the etch chamber 200 may include a pump stack capable of high throughput at low process pressures. In embodiments, at least one turbo molecular pump 265, 266 may be coupled with the first chamber region 284 through one or more gate valves 260 and disposed below the chuck 250, opposite the first showerhead 225. The turbo molecular pumps 265, 266 may be any commercially available pumps having suitable throughput and more particularly may be sized appropriately to maintain process pressures below or about 10 mTorr or below or about 5 mTorr at the desired flow rate of the first feed gas, e.g., 50 to 500 sccm of Ar where argon is the first feedgas. In the embodiment illustrated, the chuck 250 may form part of a pedestal which is centered between the two turbo pumps 265 and 266, however in alternate configurations chuck 250 may be on a pedestal cantilevered from the chamber wall 240 with a single turbo molecular pump having a center aligned with a center of the chuck 250.

Disposed above the first showerhead 225 may be a second showerhead 210. In one embodiment, during processing, the first feed gas source, for example, Argon delivered from gas distribution system 290 may be coupled with a gas inlet 276, and the first feed gas flowed through a plurality of apertures 280 extending through second showerhead 210, into the second chamber region 281, and through a plurality of apertures 282 extending through the first showerhead 225 into the first chamber region 284. An additional flow distributor or baffle 215 having apertures 278 may further distribute a first feed gas flow 216 across the diameter of the etch chamber 200 through a distribution region 218. In an alternate embodiment, the first feed gas may be flowed directly into the first chamber region 284 via apertures 283 which are isolated from the second chamber region 281 as denoted by dashed line 223.

Chamber 200 may additionally be reconfigured from the state illustrated to perform an etching operation. A secondary electrode 205 may be disposed above the first showerhead 225 with a second chamber region 281 there between. The secondary electrode 205 may further form a lid or top plate of the etch chamber 200. The secondary electrode 205 and the first showerhead 225 may be electrically isolated by a dielectric ring 220 and form a second RF coupled electrode pair to capacitively discharge a second plasma 292 of a second feed gas within the second chamber region 281. Advantageously, the second plasma 292 may not provide a significant RF bias potential on the chuck 250. At least one electrode of the second RF coupled electrode pair may be coupled with an RF source for energizing an etching plasma. The secondary electrode 205 may be electrically coupled with the second showerhead 210. In an exemplary embodiment, the first showerhead 225 may be coupled with a ground plane or floating and may be coupled to ground through a relay 227 allowing the first showerhead 225 to also be powered by the RF power source 228 during the ion milling mode of operation. Where the first showerhead 225 is grounded, an RF power source 208, having one or more RF generators operating at 13.56 MHz or 60 MHz, for example, may be coupled with the secondary electrode 205 through a relay 207 which may allow the secondary electrode 205 to also be grounded during other operational modes, such as during an ion milling operation, although the secondary electrode 205 may also be left floating if the first showerhead 225 is powered.

A second feed gas source, such as nitrogen trifluoride, and a hydrogen source, such as ammonia, may be delivered from gas distribution system 290, and coupled with the gas inlet 276 such as via dashed line 224. In this mode, the second feed gas may flow through the second showerhead 210 and may be energized in the second chamber region 281. Reactive species may then pass into the first chamber region 284 to react with the substrate 202. As further illustrated, for embodiments where the first showerhead 225 is a multi-channel showerhead, one or more feed gases may be provided to react with the reactive species generated by the second plasma 292. In one such embodiment, a water source may be coupled with the plurality of apertures 283. Additional configurations may also be based on the general illustration provided, but with various components reconfigured. For example, flow distributor or baffle 215 may be a plate similar to the second showerhead 210, and may be positioned between the secondary electrode 205 and the second showerhead 210.

As any of these plates may operate as an electrode in various configurations for producing plasma, one or more annular or other shaped spacer may be positioned between one or more of these components, similar to dielectric ring 220. Second showerhead 210 may also operate as an ion suppression plate in embodiments, and may be configured to reduce, limit, or suppress the flow of ionic species through the second showerhead 210, while still allowing the flow of neutral and radical species. One or more additional showerheads or distributors may be included in the chamber between first showerhead 225 and chuck 250. Such a showerhead may take the shape or structure of any of the distribution plates or structures previously described. Also, in embodiments a remote plasma unit (not shown) may be coupled with the gas inlet to provide plasma effluents to the chamber for use in various processes.

In an embodiment, the chuck 250 may be movable along the distance H2 in a direction normal to the first showerhead 225. The chuck 250 may be on an actuated mechanism surrounded by a bellows 255, or the like, to allow the chuck 250 to move closer to or farther from the first showerhead 225 as a means of controlling heat transfer between the chuck 250 and the first showerhead 225, which may be at an elevated temperature of 80° C.-150° C., or more. As such, an etch process may be implemented by moving the chuck 250 between first and second predetermined positions relative to the first showerhead 225. Alternatively, the chuck 250 may include a lifter 251 to elevate the substrate 202 off a top surface of the chuck 250 by distance H1 to control heating by the first showerhead 225 during the etch process. In other embodiments, where the etch process is performed at a fixed temperature such as about 90-110° C. for example, chuck displacement mechanisms may be avoided. A system controller (not shown) may alternately energize the first and second plasmas 270 and 292 during the etching process by alternately powering the first and second RF coupled electrode pairs automatically.

The chamber 200 may also be reconfigured to perform a deposition operation. A plasma 292 may be generated in the second chamber region 281 by an RF discharge which may be implemented in any of the manners described for the second plasma 292. Where the first showerhead 225 is powered to generate the plasma 292 during a deposition, the first showerhead 225 may be isolated from a grounded chamber wall 240 by a dielectric spacer 230 so as to be electrically floating relative to the chamber wall. In the exemplary embodiment, an oxidizer feed gas source, such as molecular oxygen, may be delivered from gas distribution system 290, and coupled with the gas inlet 276. In embodiments where the first showerhead 225 is a multi-channel showerhead, any silicon-containing precursor, such as OMCTS for example, may be delivered from gas distribution system 290, and directed into the first chamber region 284 to react with reactive species passing through the first showerhead 225 from the plasma 292. Alternatively the silicon-containing precursor may also be flowed through the gas inlet 276 along with the oxidizer. Chamber 200 is included as a general chamber configuration that may be utilized for various operations discussed in reference to the present technology.

Figure 3:
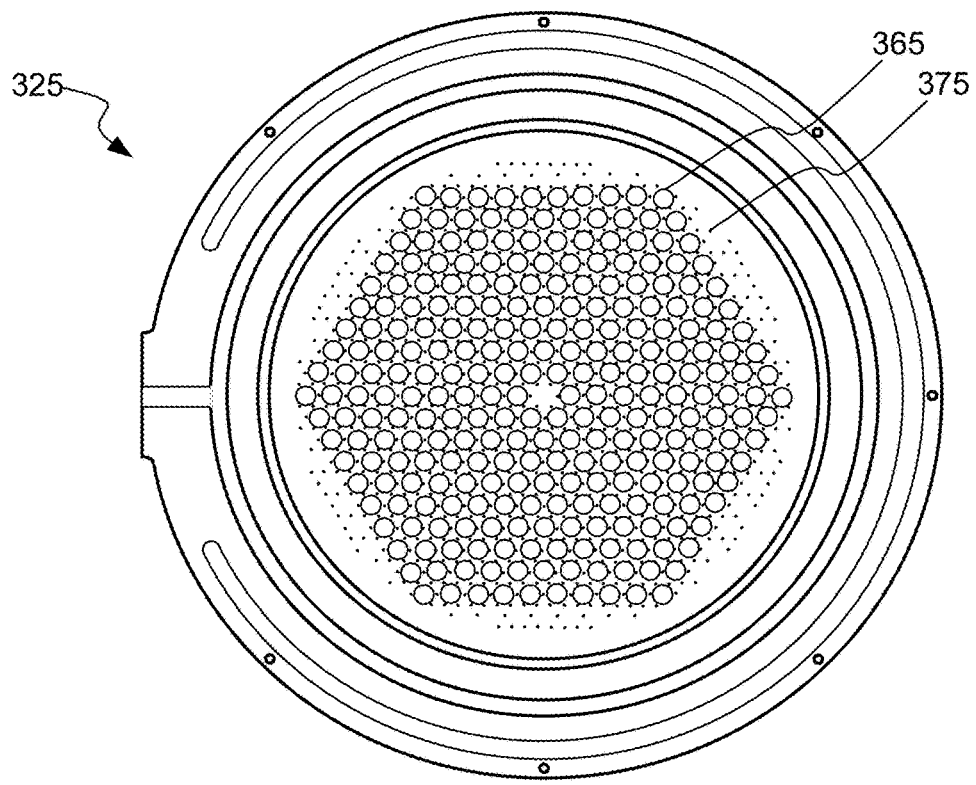
FIG. 3 shows a bottom plan view of an exemplary showerhead according to embodiments of the disclosed technology.

FIG. 3 is a bottom view of a showerhead 325 for use with a processing chamber according to embodiments. Showerhead 325 may correspond with showerhead 225 shown in FIG. 2. Through-holes 365, which may be a view of first fluid channels or apertures 282, may have a plurality of shapes and configurations in order to control and affect the flow of precursors through the showerhead 225. Small holes 375, which may be a view of second fluid channels or apertures 283, may be distributed substantially evenly over the surface of the showerhead, even amongst the through-holes 365, and may provide more even mixing of the precursors as they exit the showerhead than other configurations.

Figure 4:
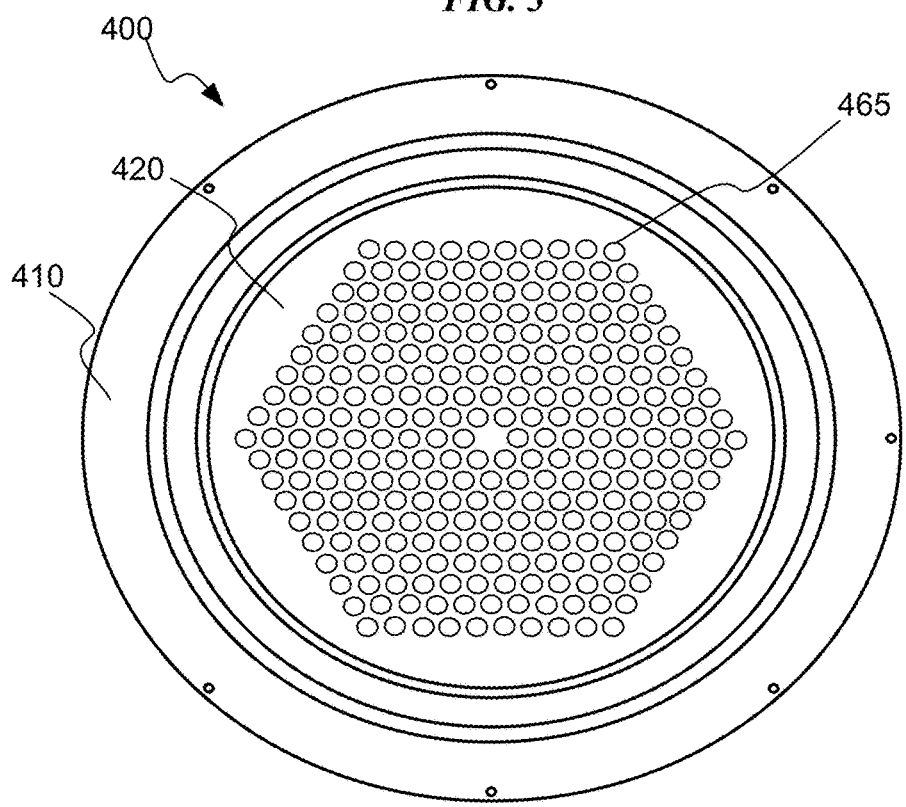
FIG. 4 shows a plan view of an exemplary faceplate according to embodiments of the disclosed technology.

An arrangement for a faceplate according to embodiments is shown in FIG. 4. As shown, the faceplate 400 may include a perforated plate or manifold. The assembly of the faceplate may be similar to the showerhead as shown in FIG. 3, or may include a design configured specifically for distribution patterns of precursor gases. Faceplate 400 may include an annular frame 410 positioned in various arrangements within an exemplary processing chamber, such as the chamber as shown in FIG. 2. On or within the frame may be coupled a plate 420, which may be similar in embodiments to ion suppressor plate 523 as described below. In embodiments faceplate 400 may be a single-piece design where the frame 410 and plate 420 are a single piece of material.

The plate may have a disc shape and be seated on or within the frame 410. The plate may be a conductive material such as a metal including aluminum, as well as other conductive materials that allow the plate to serve as an electrode for use in a plasma arrangement as previously described. The plate may be of a variety of thicknesses, and may include a plurality of apertures 465 defined within the plate. An exemplary arrangement as shown in FIG. 4 may include a pattern as previously described with reference to the arrangement in FIG. 3, and may include a series of rings of apertures in a geometric pattern, such as a hexagon as shown. As would be understood, the pattern illustrated is exemplary and it is to be understood that a variety of patterns, hole arrangements, and hole spacing are encompassed in the design.

The apertures 465 may be sized or otherwise configured to allow fluids to be flowed through the apertures during operation. The apertures may be sized less than about 2 inches in various embodiments, and may be less than or about 1.5 inches, about 1 inch, about 0.9 inches, about 0.8 inches, about 0.75 inches, about 0.7 inches, about 0.65 inches, about 0.6 inches, about 0.55 inches, about 0.5 inches, about 0.45 inches, about 0.4 inches, about 0.35 inches, about 0.3 inches, about 0.25 inches, about 0.2 inches, about 0.15 inches, about 0.1 inches, about 0.05 inches, about 0.04 inches, about 0.035 inches, about 0.03 inches, about 0.025 inches, about 0.02 inches, about 0.015 inches, about 0.01 inches, etc. or less.

In some embodiments faceplate 400 may operate as an ion suppressor that defines a plurality of apertures throughout the structure that are configured to suppress the migration of ionically-charged species out of a chamber plasma region while allowing uncharged neutral or radical species to pass through the ion suppressor into an activated gas delivery region downstream of the ion suppressor. In embodiments, the ion suppressor may be a perforated plate with a variety of aperture configurations. These uncharged species may include highly reactive species that are transported with less reactive carrier gas through the apertures. As noted above, the migration of ionic species through the holes may be reduced, and in some instances completely suppressed. For example, the aspect ratio of the holes, or the hole diameter to length, and/or the geometry of the holes may be controlled so that the flow of ionically-charged species in the activated gas passing through the ion suppressor is reduced.

Figure 5:
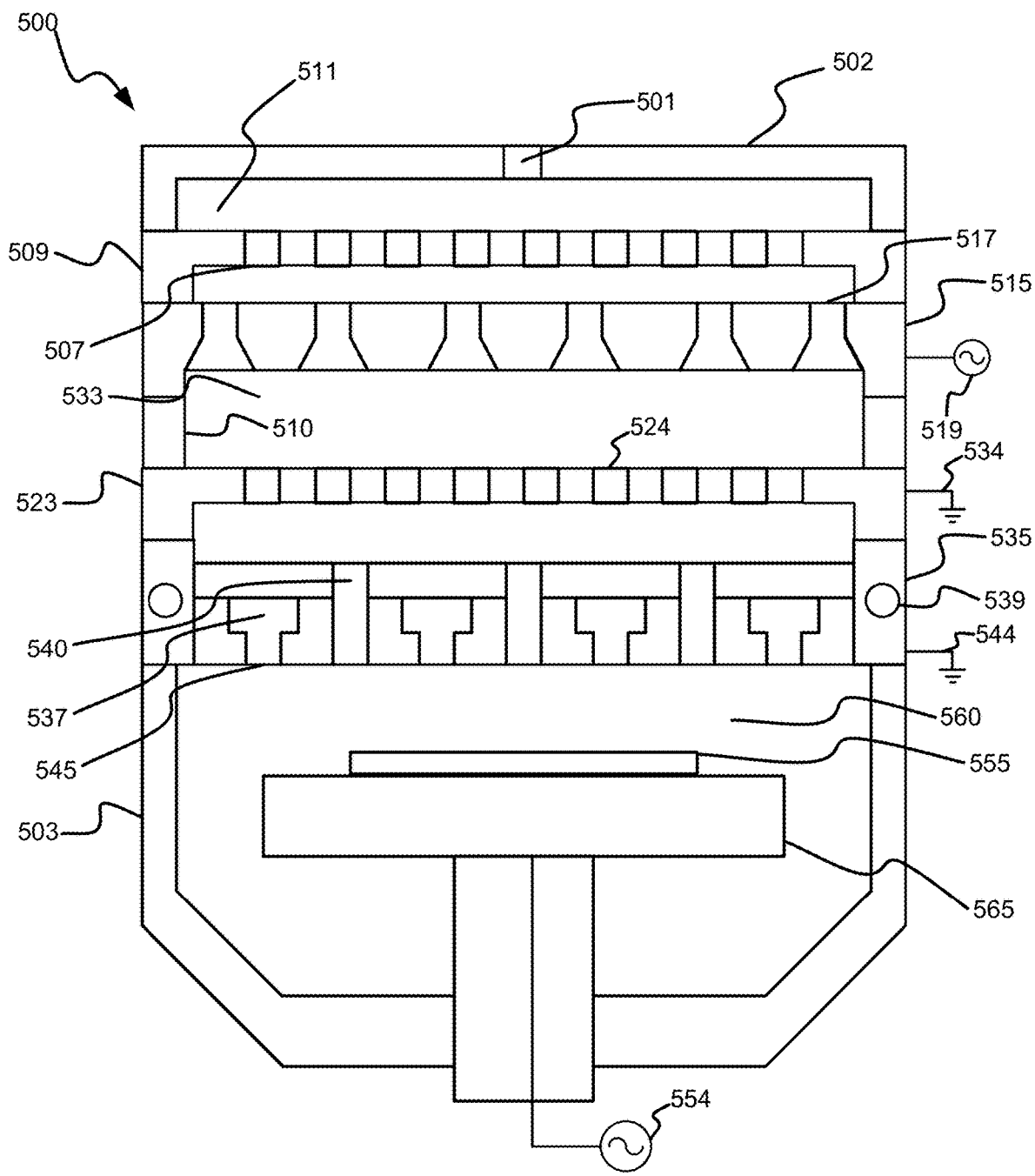
FIG. 5 shows a cross-sectional view of a processing chamber according to embodiments of the present technology.

Turning to FIG. 5 is shown a simplified schematic of processing system 500 according to the present technology. The chamber of system 500 may include any of the components as previously discussed with relation to FIGS. 2-4, and may be configured to house a semiconductor substrate 555 in a processing region 560 of the chamber. The chamber housing 503 may at least partially define an interior region of the chamber. For example, the chamber housing 503 may include lid 502, and may at least partially include any of the other plates or components illustrated in the figure. For example, the chamber components may be included as a series of stacked components with each component at least partially defining a portion of chamber housing 503. The substrate 555 may be located on a pedestal 565 as shown. Processing chamber 500 may include a remote plasma unit (not shown) coupled with inlet 501. In other embodiments, the system may not include a remote plasma unit.

With or without a remote plasma unit, the system may be configured to receive precursors or other fluids through inlet 501, which may provide access to a mixing region 511 of the processing chamber. The mixing region 511 may be separate from and fluidly coupled with the processing region 560 of the chamber. The mixing region 511 may be at least partially defined by a top of the chamber of system 500, such as chamber lid 502 or lid assembly, which may include an inlet assembly for one or more precursors, and a distribution device, such as faceplate 509 below. Faceplate 509 may be similar to the showerhead or faceplate illustrated in FIGS. 3-4 in disclosed embodiments. Faceplate 509 may include a plurality of channels or apertures 507 that may be positioned and/or shaped to affect the distribution and/or residence time of the precursors in the mixing region 511 before proceeding through the chamber.

For example, recombination may be affected or controlled by adjusting the number of apertures, size of the apertures, or configuration of apertures across the faceplate 509. As illustrated, faceplate 509 may be positioned between the mixing region 511 and the processing region 560 of the chamber, and the faceplate 509 may be configured to distribute one or more precursors through the chamber 500. The chamber 500 may include one or more of a series of components that may optionally be included in disclosed embodiments. For example, although faceplate 509 is described, in some embodiments the chamber may not include such a faceplate. In disclosed embodiments, the precursors that are at least partially mixed in mixing region 511 may be directed through the chamber via one or more of the operating pressure of the system, the arrangement of the chamber components, or the flow profile of the precursors.

Chamber 500 may additionally include a first showerhead 515. Showerhead 515 may have any of the features or characteristics of the plates discussed with respect to FIGS. 3-4. Showerhead 515 may be positioned within the semiconductor processing chamber as illustrated, and may be included or positioned between the lid 502 and the processing region 560. In embodiments, showerhead 515 may be or include a metallic or conductive component that may be a coated, seasoned, or otherwise treated material. Exemplary materials may include metals, including aluminum, as well as metal oxides, including aluminum oxide. Depending on the precursors being utilized, or the process being performed within the chamber, the showerhead may be any other metal or material that may provide structural stability as well as conductivity as may be utilized.

Showerhead 515 may define one or more apertures 517 to facilitate uniform distribution of precursors through the showerhead. The apertures 517 may be included in a variety of configurations or patterns, and may be characterized by any number of geometries that may provide precursor distribution as may be desired. Showerhead 515, may be electrically coupled with a power source in embodiments. For example, showerhead 515 may be coupled with an RF source 519 as illustrated. When operated, RF source 519 may provide a current to showerhead 515 allowing a capacitively-coupled plasma ("CCP") to be formed between the showerhead 515 and another component.

An additional faceplate or device 523 may be disposed below the showerhead 515. Faceplate 523 may include a similar design as faceplate 509, and may have a similar arrangement as is illustrated at FIG. 3 or 4, for example. In embodiments, faceplate 523 may be positioned within the semiconductor processing chamber between the showerhead 515 and the processing region 560. Spacer 510 may be positioned between the showerhead 515 and plate 523, and may include a dielectric material. Apertures 524 may be defined in plate 523, and may be distributed and configured to affect the flow of ionic species through the plate 523. For example, the apertures 524 may be configured to at least partially suppress the flow of ionic species directed toward the processing region 560, and may allow plate 523 to operate as an ion suppressor as previously described. The apertures 524 may have a variety of shapes including channels as previously discussed, and may include a tapered portion extending outward away from the processing region 560 in disclosed embodiments.

Faceplate 523 may be coupled with an electrical ground 534, which may allow a plasma to be generated in embodiments. For example, showerhead 515, faceplate 523, and spacer 510 may at least partially define a plasma processing region 533 within the semiconductor processing chamber. Precursors may be provided through the inlet 501 and distributed through faceplate 509 and showerhead 515 to plasma processing region 533. Showerhead 515 may be charged relative to ground at faceplate 523, and the precursors may be energized to produce a plasma within the plasma processing region 533. The plasma effluents may then be flowed through faceplate 523 towards processing region 560 to interact with substrate or wafer 555, or materials on the substrate.

The chamber 500 may further include a gas distribution assembly 535, which may also be a second showerhead, within the chamber. For example, gas distribution assembly 535 may at least partially define processing region 560, and may distribute precursors to that region. In order to provide uniform processing on substrate 555, gas distribution assembly 535 may be configured to provide a more uniform flow of precursors into processing region 560. The gas distribution assembly 535, which may be similar in aspects to the dual-channel showerheads as previously described, may be located within the chamber above the processing region 560, such as between the processing region 560 and the lid 502, and may be positioned between the processing region 560 and the faceplate 523. The gas distribution assembly 535 may be configured to deliver both a first and a second precursor into the processing region 560 of the chamber. In embodiments, the gas distribution assembly 535 may at least partially divide the interior region of the chamber into a remote region and a processing region in which substrate 555 is positioned.

Although the exemplary system of FIG. 5 includes a dual-channel showerhead, it is understood that alternative distribution assemblies may be utilized that maintain a precursor fluidly isolated from species introduced through inlet 501. For example, a perforated plate and tubes underneath the plate may be utilized, although other configurations may operate with reduced efficiency or may not provide as uniform processing as the dual-channel showerhead as described. By utilizing one of the disclosed designs, a precursor may be introduced into the processing region 560 that is not previously excited by a plasma prior to entering the processing region 560, or may be introduced to avoid contacting an additional precursor with which it may react. Although not shown, an additional spacer may be positioned between the faceplate 523 and the showerhead 535, such as an annular spacer, to isolate the plates from one another. In embodiments in which an additional precursor may not be included, the gas distribution assembly 535 may have a design similar to any of the previously described components, and may include characteristics similar to the faceplate illustrated in FIG. 4.

In embodiments, gas distribution assembly 535 may include an embedded heater 539, which may include a resistive heater or a channel for a temperature controlled fluid, for example. The gas distribution assembly 535 may include an upper plate and a lower plate in embodiments, and may include a plurality of plates coupled with one another, which may include more than or about 2 plates, more than or about 3 plates, more than or about 4 plates, more than or about 5 plates, or more depending on the configuration or spacing within the gas distribution assembly 535. The plates may be coupled with one another to define a volume 537 between the plates. The coupling of the plates may be such as to provide first fluid channels 540 through the upper and lower plates, and second fluid channels 545 through the lower plate. The second formed channels may be configured to provide fluid access from the volume 537 through the lower plate, and the first fluid channels 540 may be fluidly isolated from the volume 537 between the plates and the second fluid channels 545. The volume 537 may be fluidly accessible through a side of the gas distribution assembly 535, such as channel 223 as previously discussed. The channel may be coupled with an access in the chamber separate from the inlet 501 of the chamber 500.

Gas distribution assembly 535 may be utilized in a plasma processing operation as well, and in examples may be electrically coupled with a source or electrical ground, such as electrical ground 544, for example. By coupling gas distribution assembly 535 with electrical ground, the gas distribution assembly 535 may be of a similar potential as faceplate 523, and thus may prevent plasma from being formed between the two components. In some embodiments, faceplate 523 and gas distribution assembly 535 may be in direct contact as illustrated, and may be both coupled with electrical ground. Pedestal 565 may be coupled with an electrical source 554, which in combination with a grounded gas distribution assembly 535 may at least partially define an additional plasma processing region within processing region 560 of the semiconductor processing chamber. By providing plasma processing capabilities at the wafer level, additional operations may be performed, such as material modification as discussed previously, as well as etching and deposition operations that may benefit from plasma processing.

In some embodiments, a plasma as described above may be formed in a region of the chamber remote from the processing region, such as in plasma processing region 533, as well as within a plasma processing region within the processing region 560. Each of these plasma regions may be capacitively-coupled plasma configurations in embodiments, although other plasma generation components may be included, such as coils to provide an inductively-coupled plasma region. The faceplates, showerheads, chamber walls, spacers, and pedestal, which may each be contacted by plasma may additionally be coated or seasoned in order to minimize the degradation of the components between which the plasma may be formed. The plates may additionally include compositions that may be less likely to degrade or be affected including ceramics, metal oxides, or other conductive materials.

Operating a conventional capacitively-coupled plasma ("CCP") may degrade the chamber components, which may remove particles that may be inadvertently distributed on a substrate. Such particles may affect performance of devices formed from these substrates due to the metal particles that may provide short-circuiting across semiconductor substrates. However, the CCP of the disclosed technology may be operated at reduced or substantially reduced power in embodiments, and may be utilized to maintain the plasma as may be produced by a remote plasma unit, instead of ionizing species within the plasma region. In other embodiments the CCP may be operated to ionize precursors delivered into the region. For example, the CCP may be operated at a power level below or about 1 kW, 500 W, 250 W, 100 W, 50 W, 20 W, etc. or less. Moreover, the CCP may produce a flat plasma profile which may provide a uniform plasma distribution within the space. As such, a more uniform flow of plasma effluents may be delivered downstream to the processing region of the chamber.

Forming plasma at the wafer level may be beneficial for processing operations as discussed previously. However, when a component such as gas distribution assembly 535 is incorporated as part of the plasma processing equipment, additional considerations for plasma formation may be involved. First fluid channels 540 may be included to allow plasma effluents to be provided to the chamber region. In order to provide adequate flow, and to reduce interaction with plasma effluents, the channels may be characterized by an increased diameter, such as greater than or about 2.5 mm, for example. However, when gas distribution assembly 535 is involved in a capacitively-coupled plasma operation, these aperture sizes may pose issues.

For example, plasma may generally be formed in regions having a length greater than a Debye length. When the first fluid channels 540 are characterized by increased diameter, then the surface of the assembly facing the plasma processing region may not provide RF continuity across the surface. Consequently, plasma may be generated within first fluid channels 540, and may also leak back through these channels toward the faceplate 523. One or more of the surfaces of gas distribution assembly 535 may be coated or treated to reduce degradation from plasma. Similarly, one or more surfaces of faceplate 523 may be coated or treated to reduce degradation from plasma. However, the surfaces coated or treated on each component may not be facing one another.

For example, as illustrated in FIG. 5, the surfaces of gas distribution assembly 535 that are facing, proximate, or adjacent processing region 560 may be treated, but the surfaces facing faceplate 523 may not be coated or treated. Similarly, the surfaces of faceplate 523 that are facing, proximate, or adjacent plasma processing region 533 may be coated or treated, but the surfaces facing gas distribution assembly 535 may not be coated or treated. Accordingly, plasma leaking into the region between faceplate 523 and gas distribution assembly 535 may be able to degrade untreated portions of the components. Although first fluid channels 540 may be reduced in diameter to prevent this interaction, such a reduction may increase recombination and interaction with plasma effluents produced in plasma processing region 533. Another solution may include incorporating an additional showerhead having smaller apertures between the gas distribution assembly 535 and the pedestal 565 to reduce backflow of plasma. However, this solution may be unacceptable in certain situations due to the increased travel length for precursors, and because the additional showerhead may produce the same recombination being avoided with the gas distribution assembly. For example, in certain deposition operations residence time of certain precursors, such as trisilylamine or NH radicals or ions, may be controlled to provide acceptable deposition, and the flow path may be relatively unimpeded to prevent deposition on components. By incorporating an additional showerhead, both the flow path length may be increased, and the flow path may be impeded.

Accordingly, the present technology may improve on these situations by adjusting the first fluid channels 540 themselves. For example, showerheads or gas distribution assemblies according to the present technology may include fluid channels where each channel may be characterized by a first diameter at a first end of the channel, and may be characterized by a plurality of ports at a second end of the channel. The following figures will discuss exemplary showerheads or gas distribution assemblies that may be used within chambers according to the present technology, such as may be used as gas distribution assembly 535 of chamber 500, for example. The showerheads may also be used in any other chamber, including other plasma chambers, that may benefit from the improved control discussed throughout the present disclosure.

Figure 6A:
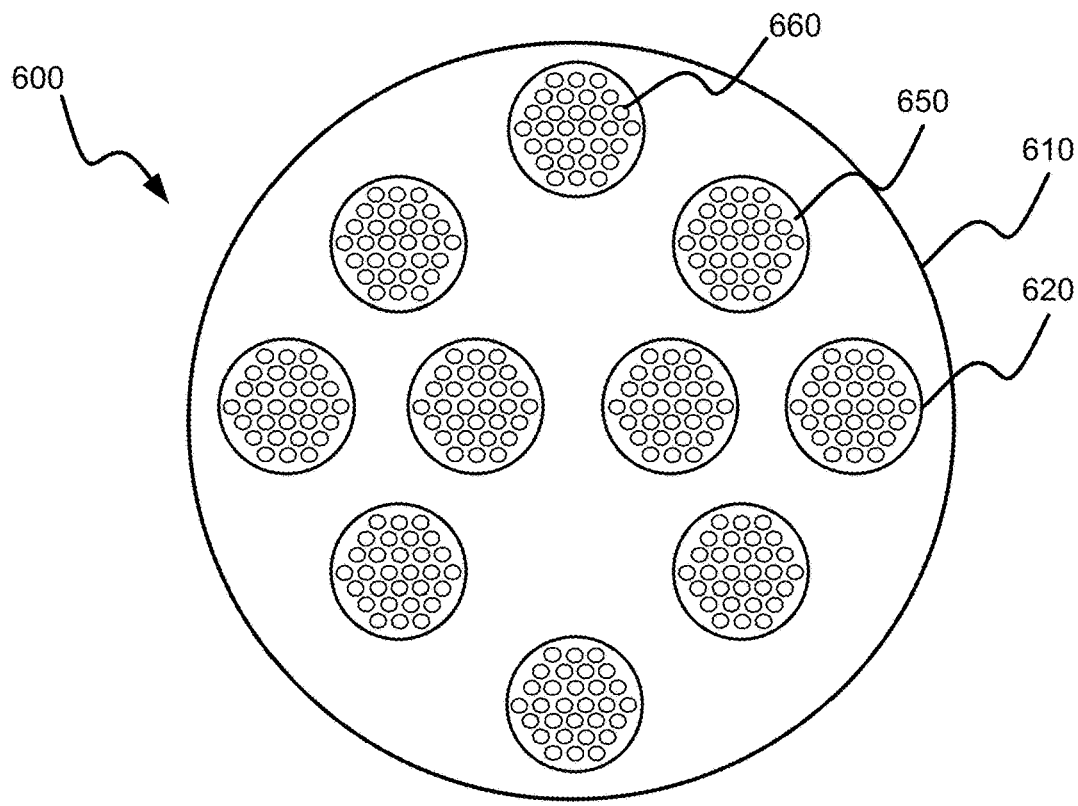
FIG. 6A shows a top plan view of an exemplary showerhead according to embodiments of the present technology.

FIG. 6A shows a top plan view of an exemplary showerhead 600 according to embodiments of the present technology. Showerhead 600 may include any of the components or characteristics of any of the previous showerheads or faceplates discussed throughout the present disclosure. As illustrated, showerhead 600 may include a first plate 610 defining a plurality of through-holes 620 across a surface of the first plate 610. First plate 610 may be or include a conductive material, which may include aluminum, aluminum oxide, other metals, other metal oxides such as yttrium oxide, for example, or other treated or coated materials. Through-holes 620 may illustrate a first end of first fluid channels 540 as previously described, for example. The through-holes 620 may be characterized by a diameter less than or about 50 mm, for example, and may be characterized by a diameter less than or about 40 mm, less than or about 30 mm, less than or about 20 mm, less than or about 15 mm, less than or about 12 mm, less than or about 10 mm, less than or about 9 mm, less than or about 8 mm, less than or about 7 mm, less than or about 6 mm, less than or about 5 mm, less than or about 4 mm, less than or about 3 mm, less than or about 2 mm, or less in embodiments.

Through-holes 620 may be characterized by a diameter greater than or about 4 mm in embodiments, in order to provide adequate flow capabilities for precursors. For example, diameters less than or about 5 mm may impact recombination or other characteristics of precursors flowing through the chamber, including plasma effluents produced in a remote region of the chamber. Accordingly, in some embodiments the diameter of through-holes 620 may be maintained above or about 2.5 mm, greater than or about 3 mm, greater than or about 3.5 mm, greater than or about 4 mm, greater than or about 4.5 mm, greater than or about 5 mm, greater than or about 5.5 mm, greater than or about 6 mm, greater than or about 6.5 mm, greater than or about 7 mm, or greater to prevent a greater impact on precursors or plasma effluents. The diameters may also be a combination of any of the numbers provided or encompassed, and may be ranges included within any of the defined ranges. Depending on the size of showerhead 600 and apertures 620, first plate 610 may define up to, greater than, or about 500 apertures, and may define up to, greater than, or about 1,000 apertures, about 2,000 apertures, about 3,000 apertures, about 4,000 apertures, about 5,000 apertures, about 6,000 apertures, about 7,000 apertures, about 8,000 apertures, about 9,000 apertures, about 10,000 apertures, or more in embodiments.

Figure 6B:
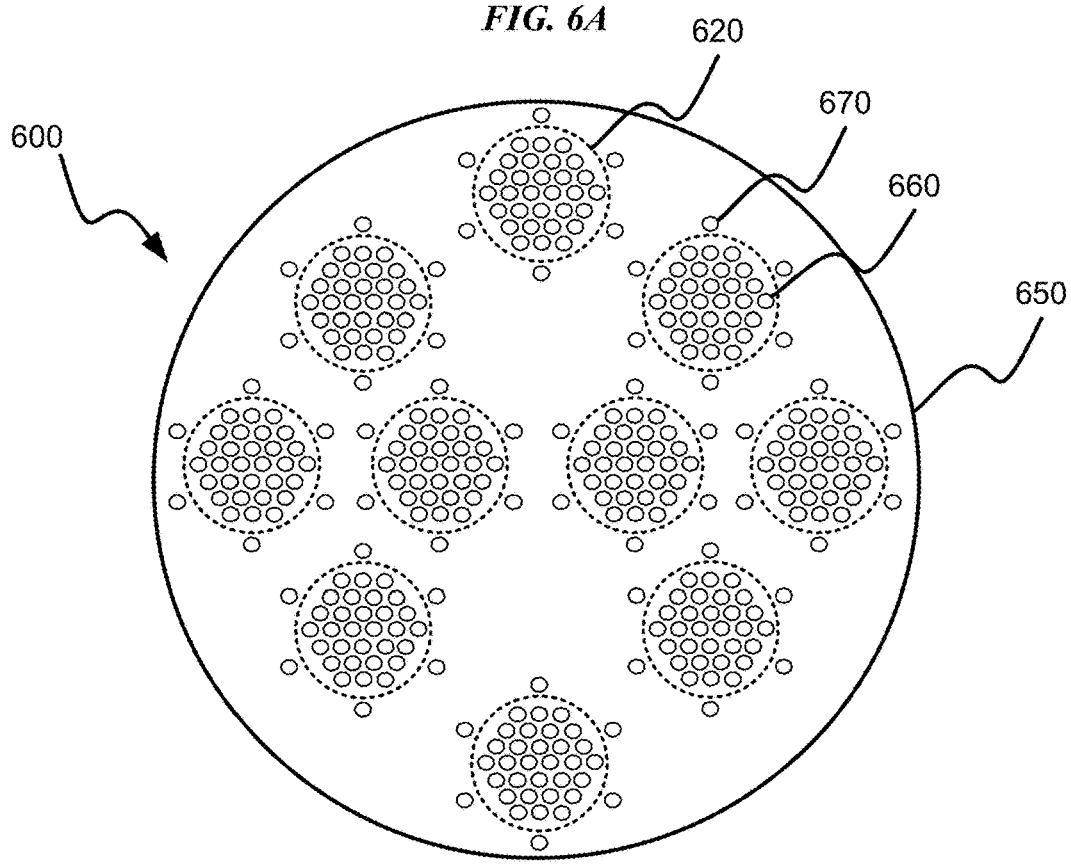
FIG. 6B shows a bottom plan view of an exemplary showerhead according to embodiments of the present technology.

Through-holes 620 may also provide a view through the formed channel to a second plate 650 that may be coupled with the first plate 610. In some embodiments, the showerhead 600 may include more than two plates, or only a single plate with defined features. Second plate 650 may include defined ports 660 as viewed through through-holes 620 of first plate 610. Turning to FIG. 6B shows a bottom plan view of exemplary showerhead 600 according to embodiments of the present technology. The figure shows a view of second plate 650 of showerhead 600. As noted, second plate 650 may include ports 660 defined throughout the second plate 650, which may be included at a second end of a fluid channel produced through the showerhead 600. In embodiments, each port 660 may be characterized by a diameter of less than the diameter of through-holes 620.

As explained previously, ports 660 may prevent plasma from leaking through showerhead 600 and may also prevent byproducts of local plasma operations from flowing upstream through showerhead 600. Accordingly, ports 660 may be characterized by a diameter less than or about 2 mm in embodiments, and may be characterized by a diameter of less than or about 1.5 mm, less than or about 1.2 mm, less than or about 1.0 mm, less than or about 0.9 mm, less than or about 0.8 mm, less than or about 0.7 mm, less than or about 0.6 mm, less than or about 0.5 mm, less than or about 0.4 mm, less than or about 0.3 mm, less than or about 0.2 mm, less than or about 0.1 mm, or less in embodiments. For example, ports 660 may be characterized by a diameter of between about 0.1 mm and about 1.2 mm in embodiments, and may be characterized by a diameter of between about 0.2 mm and about 1 mm in embodiments. The smaller ports 660 may provide improved RF continuity across the showerhead 600, which may be operating as a ground electrode, for example. The improved RF continuity may allow plasma to be contained below showerhead 600, or substantially contained below showerhead 600 in embodiments. Additionally, smaller ports 660 may also prevent reaction byproducts from flowing up through through-holes 620 and contacting additional components.

As illustrated, ports 660 may be defined in groups of ports across the surface of plate 650. Each group of ports may include at least or about 2 ports in embodiments, and may include at least or about 3 ports, at least or about 4 ports, at least or about 5 ports, at least or about 6 ports, at least or about 7 ports, at least or about 8 ports, at least or about 9 ports, at least or about 10 ports, at least or about 11 ports, at least or about 12 ports, at least or about 13 ports, at least or about 14 ports, at least or about 15 ports, at least or about 16 ports, at least or about 17 ports, at least or about 18 ports, at least or about 20 ports, at least or about 25 ports, at least or about 30 ports, at least or about 40 ports, at least or about 50 ports, or more ports in embodiments. Ports 660 or groups of ports 660 may be aligned with through-holes 620 in embodiments to provide fluid channels. In embodiments, each group of ports 660 may be axially aligned with a central axis of a through-hole 620.

Second plate 650 may also define additional apertures 670 positioned relative to through-holes 620, shown hidden as the sidewalls may not be visible through ports 660. Apertures 670 may be defined about through-holes 620 and ports 660 in embodiments. Apertures 670 may be similar to the second fluid channels 545 previously described, which may provide fluid access from an internal volume showerhead 600. Accordingly, a precursor flowed through the volume defined between the first plate and the second plate may exit the showerhead 600 through apertures 670, where the precursor, which may be an excited or unexcited precursor, may then interact with one or more precursors that have been flowed through ports 660, which may include plasma effluents produced upstream. In embodiments, apertures 670 may be the same size or within the same ranges of sizes as ports 660, which may also maintain RF continuity across the plate 650. Accordingly, apertures 670 may be a first plurality of apertures defined in plate 650, and ports 660 may be a second plurality of apertures defined in plate 650. As illustrated, apertures 670 may be defined as groups across the showerhead 600 to provide uniformity of flow of a precursor from the volume defined within the showerhead 600. In embodiments each group of apertures 670 may be formed about groups of ports 660 to provide more uniform contact of precursors flowing from the apertures 670 and ports 660. In embodiments, each group may include any of the numbers of apertures within the groups as discussed above with respect to ports 660.

Showerhead 600 may be included in a chamber, such as chamber 500, and may be positioned similar to gas distribution assembly 535 as discussed previously. Accordingly, showerhead 600 may be positioned so that first plate 610 faces towards a lid of the chamber, or towards components such as faceplate 523. Second plate 650 may face towards a processing region or may be adjacent a processing region, and may at least partially define a plasma processing region within the processing region, such as with a pedestal or other component. Accordingly, second plate 650 may be exposed to plasma, and thus exposed surfaces of second plate 650 may be coated or treated in embodiments to protect the second plate of showerhead 600 from plasma degradation. In other embodiments second plate 650 may be or include a material designed to be resistant to plasma degradation, and may not have an additional coating, which may ease manufacturing depending on the material used.

Figure 7A:
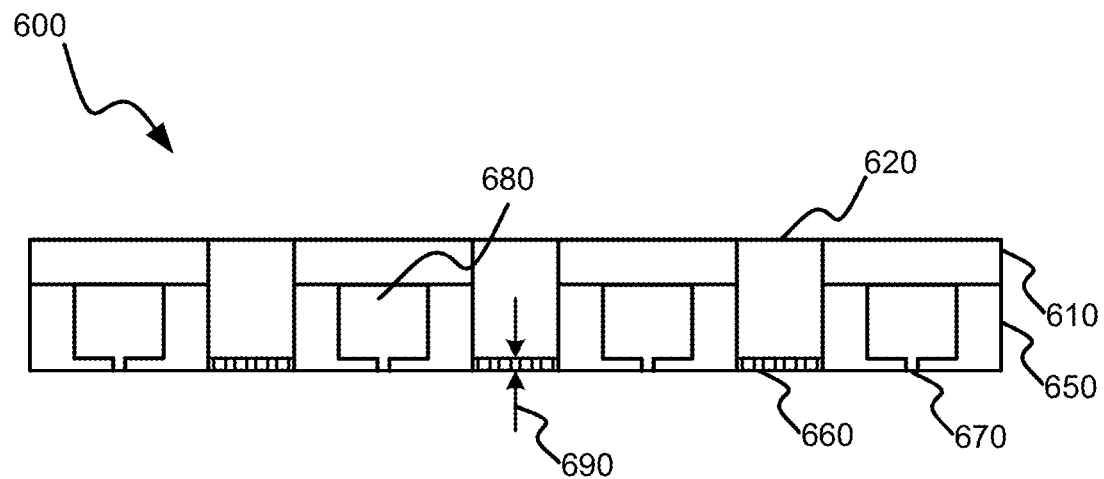
FIG. 7A shows a cross-sectional view of an exemplary showerhead according to embodiments of the present technology.

FIG. 7A shows a cross-sectional view of exemplary showerhead 600 according to embodiments of the present technology. The illustrated showerhead may include any of the features or characteristics previously described. As illustrated, showerhead 600 may include a first plate 610 and a second plate 650. First plate 610 may define through-holes 620, which may align with ports 660 defined in second plate 650 to produce fluid channels through showerhead 600. The ports 660 may be surrounded or have apertures 670 about the ports 660 as previously described. First plate 610 and second plate 650 may be coupled with one another to define a volume 680 between the first plate 610 and the second plate 650. As illustrated, the volume 680 may be fluidly accessible from the apertures 670. Additionally, the channels formed by the through-holes 620 and ports 660 may be fluidly isolated from the volume defined between the first plate 610 and the second plate 650.

Showerhead 600 may include channels formed from through-holes 620 and ports 660, which may include a first end of each channel at the through-holes 620 in first plate 610, and a second end of each channel at the ports 660 in the second plate 650. Accordingly, if showerhead 600 may be incorporated within chamber 500, such as included as a gas distribution assembly like assembly 535, the first ends of the channels formed may face towards the lid 502 or faceplate 523. Additionally, the second ends of each channel formed may face towards the pedestal, and may be proximate the processing region 660, for example.

Second plate 650 may define ports 660 through the structure of the second plate 650, but the thickness of ports 660 may not be equal to the thickness of second plate 650 in embodiments. However, in other embodiments the length of the ports 660 may be equal to the thickness of second plate 650. In embodiments in which the lengths of the ports 660 are not equal to the thickness of the second plate 650, a portion of the channel formed may be included in the second plate 650, and may resemble a counterbore structure in some ways, although multiple ports 660 may be included in the structure. Second plate 650 may be characterized by a thickness 690 through which ports 660 are defined. This thickness may be less than the thickness of second plate 650 to reduce an effect on plasma effluents that may be flowed through the formed channels.

For example, if the ports were formed through the entire thickness of the second plate 650, they may impact precursors or plasma effluents flowing through the formed channels, which may increase recombination, cause deposition to occur prematurely, or other consequences. Accordingly, the thickness 690 of second plate 650 in regions where ports 660 are defined may be less than or about 3 mm in embodiments, and may be less than or about 2.5 mm, less than or about 2 mm, less than or about 1.8 mm, less than or about 1.6 mm, less than or about 1.5 mm, less than or about 1.4 mm, less than or about 1.3 mm, less than or about 1.2 mm, less than or about 1.1 mm, less than or about 1.0 mm, less than or about 0.9 mm, less than or about 0.8 mm, less than or about 0.7 mm, less than or about 0.6 mm, less than or about 0.5 mm, less than or about 0.4 mm, less than or about 0.3 mm, less than or about 0.2 mm, or less in embodiments. Additionally, the thickness of second plate 650 in regions where ports 660 are formed may be between about 0.1 mm and about 2 mm, or may be between about 0.4 mm and about 1.6 mm in embodiments, along with a smaller range within any of the discussed ranges, or some range formed from any of the numbers discussed. In this way, the ports may have a reduced or minimal impact on precursors or plasma effluents flowing through the channels formed through the showerhead 600. This may provide an additional benefit over including another showerhead as discussed previously, because such a showerhead may not be capable of being machined to such reduced thicknesses, and therefore may provide more of an impact on the precursors or plasma effluents than the ports described throughout the present disclosure.

Figure 7B:
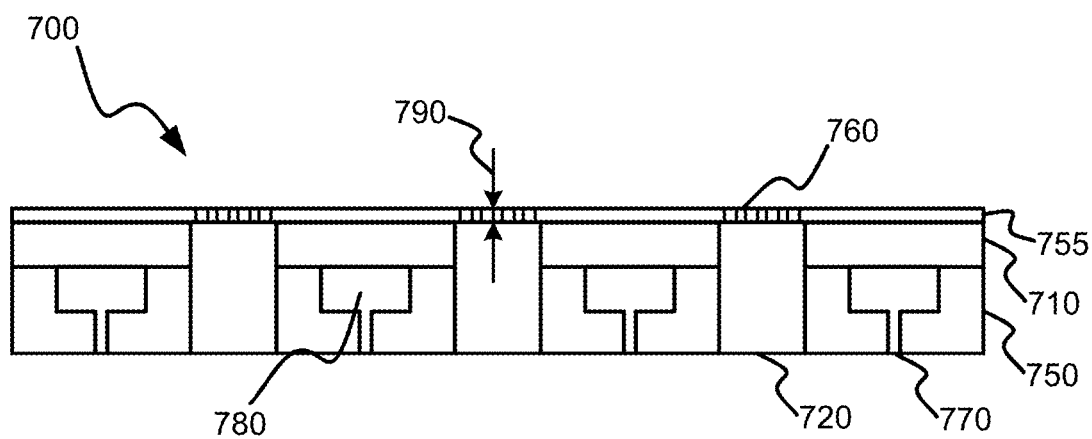
FIG. 7B shows a cross-sectional view of an exemplary showerhead according to embodiments of the present technology.

Turning to FIG. 7B is shown a cross-sectional view of an exemplary showerhead 700 according to embodiments of the present technology. Showerhead 700 may be similar in some ways to showerhead 600, and may include any of the features or characteristics discussed for that showerhead or for any of the other showerheads or faceplates discussed. Showerhead 700 may differ from showerhead 600 in that ports 760 may be included on the opposite end of the formed channels through the plates. For example, showerhead 700 may include a first plate 710 and a second plate 750, which when coupled may define a volume 780 between the first plate 710 and second plate 750. First plate 710 may define a portion of through-holes 720 and second plate 750 may define a second portion of through-holes 720. Second plate 750 may also define apertures 770. Apertures 770 and through-holes 720 may be characterized by any of the dimensions or features previously discussed for various faceplates and showerheads.

In some embodiments, showerhead 700 may be characterized by a third plate 755, which may be coupled with first plate 710 on a surface opposite the surface with which it may be coupled with second plate 750. In other embodiments, third plate 755 may be a portion of first plate 710, which may include a counter-bore-like structure similar to that described previously. Third plate 755 may define ports 760, which may have any of the features or characteristics of previously described ports. Similarly, the thickness 790 of third plate 755, or the regions of first plate 710 in which ports 760 may be formed, may be similar to the thicknesses described previously to limit interaction with produced plasma effluents or precursors, while providing improved RF continuity across showerhead 700 to reduce or eliminate plasma leakage through the showerhead 700. In this exemplary showerhead 700, the assembly may be included in a chamber, such as chamber 500, similarly to gas distribution assembly 535. Showerhead 700 may be positioned within the chamber where the first ends of the channels formed through the showerhead may be facing the processing region 560, while the second ends of the channels may be facing towards lid 502 or faceplate 523.

Figure 8A:
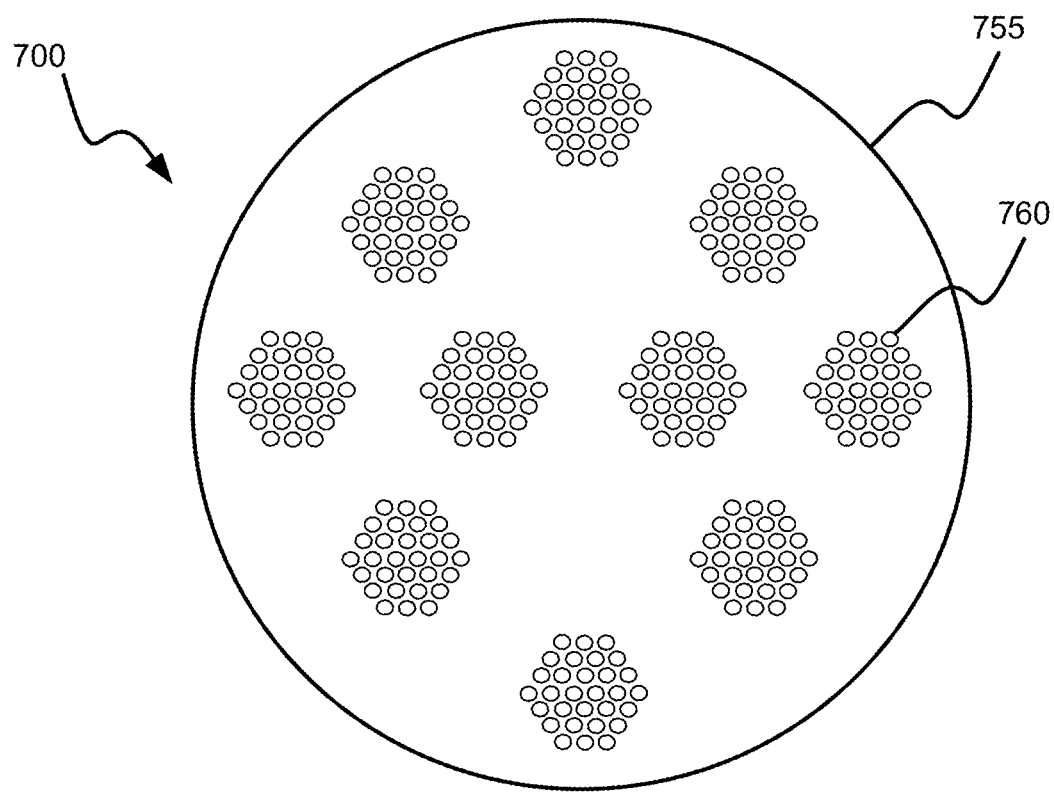
FIG. 8A shows a top plan view of an exemplary showerhead according to embodiments of the present technology.

FIG. 8A shows a top plan view of exemplary showerhead 700 according to embodiments of the present technology. As illustrated, instead of including the through-holes, third plate 755, which may be a portion of first plate 710, may define a plurality of apertures 760 through the plate, which may be ports as previously discussed. The plurality of apertures 760 may be defined in a first plurality of groups of apertures, which may include at least two apertures of the first plurality of apertures. The groups may include any number of apertures as previously described.

Figure 8B:
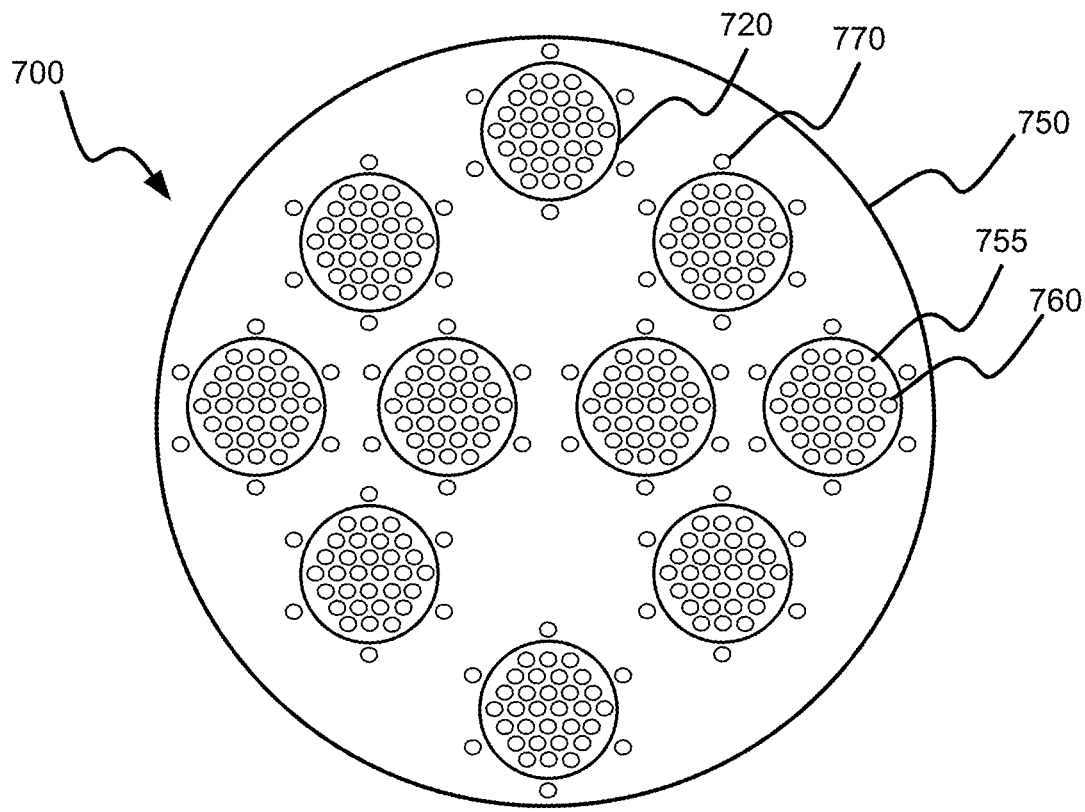
FIG. 8B shows a bottom plan view of an exemplary showerhead according to embodiments of the present technology.

FIG. 8B shows a bottom plan view of exemplary showerhead 700 according to embodiments of the present technology. The illustrated view includes second plate 750, which may be coupled with the first and/or third plate in embodiments. Second plate 750 may define a plurality of through-holes 720, which may provide access to ports 760 defined in third plate 755 as illustrated. Each through-hole may be aligned with at least one group of apertures from the first plurality of apertures to produce a channel, which may include any of the characteristics previously described. Second plate 750 may also define a plurality of second apertures 770, which may provide access to an internal volume of the showerhead. The apertures may be defined or arranged in any of the patterns previously discussed.

Figure 9:
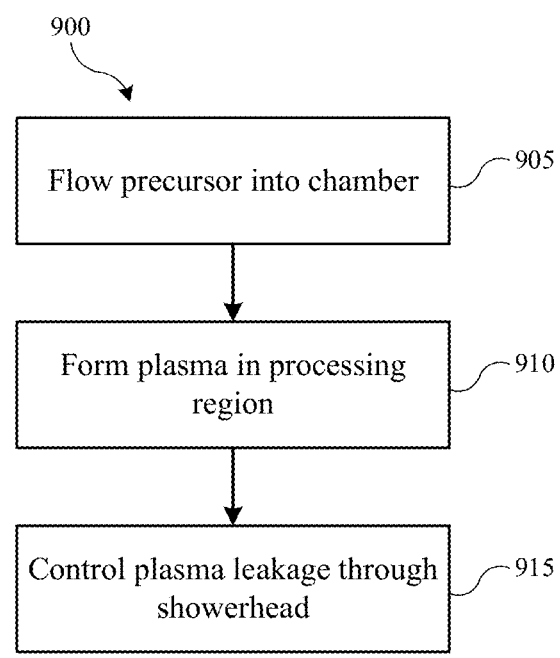
FIG. 9 shows operations of an exemplary method according to embodiments of the present technology.

The chambers and plasma sources described above may be used in one or more methods. FIG. 9 shows operations of an exemplary method 900 according to embodiments of the present technology. Method 900 may include flowing one or more precursors into a chamber at operation 905. The chamber may be similar to any of the chambers previously described, and may include a showerhead such as any of the showerheads discussed. The precursors may be flowed from an inlet assembly or from an additional access, such as from an access to the volume between plates of a showerhead, for example. The precursors may be flowed into a processing region in which a plasma may be formed at operation 910. The plasma may be formed as a capacitively-coupled plasma in embodiments, and the electrodes may include the pedestal on which a substrate is positioned as well as a showerhead, such as previously described. The formed plasma may be contained, substantially contained, or essentially contained within the processing region at least partially defined by the showerhead. For example, the showerhead may have features or characteristics such as previously described so that plasma leakage is controlled or eliminated through the showerhead at operation 915.

The chambers and showerheads may also be used in operations in which precursors are provided or plasma effluents are generated remotely, such as either external to the chamber, or within a chamber region upstream of the processing region of the chamber. For example, the plasma effluents may be generated between a showerhead and faceplate as previously described. The plasma effluents may be flowed through a showerhead including channels defined through the showerhead. The channels may be characterized by a first end having a first diameter, and a second end including a number of ports, where each port may be characterized by a diameter less than the first diameter. Either end of the channel may be proximate the processing region in which a substrate may be positioned. The plasma effluents may flow through the channels, which may have a limited impact on recombination at least in part due to the channel dimensions and the port lengths. Additionally, the effluents may perform etching and/or deposition within the processing region, and byproducts may be prevented from flowing upstream through the channels to the faceplate. By including ports within a defined thickness of material at an end of larger channels, showerheads of the present technology may improve on any of these operations compared to conventional showerheads, which may provide plasma and byproduct leakage through the channels of the showerhead.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "an apertures" includes a plurality of such apertures, and reference to "the precursor" includes reference to one or more precursors and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A semiconductor processing chamber comprising:
a chamber housing at least partially defining an interior region of the semiconductor processing chamber, wherein the chamber housing comprises a lid;
a pedestal configured to support a substrate within a processing region of the semiconductor processing chamber; and
a first showerhead positioned within the semiconductor processing chamber comprising at least two plates coupled together to define a volume between the at least two plates, wherein the at least two plates at least partially define channels through the first showerhead, wherein the volume between the at least two plates is fluidly isolated from the channels, wherein each channel is characterized by a first diameter at a first end of the channel and is characterized by a plurality of ports at a second end of the channel, wherein the first showerhead defines a plurality of apertures defining fluid access from the volume between the at least two plates, wherein each channel is individually circumscribed by a subset of apertures of the plurality of apertures, and wherein each subset of apertures comprises an equal number of apertures.

2. The semiconductor processing chamber of claim 1, wherein each port is characterized by a diameter less than the first diameter.

3. The semiconductor processing chamber of claim 1, further comprising a second showerhead coupled with an electrical source, wherein the second showerhead is positioned within the semiconductor processing chamber between the lid and the processing region.

4. The semiconductor processing chamber of claim 3, further comprising a faceplate coupled with electrical ground, wherein the faceplate is positioned within the semiconductor processing chamber between the first showerhead and the processing region.

5. The semiconductor processing chamber of claim 4, wherein the faceplate and the second showerhead are in direct contact, and wherein the faceplate and the second showerhead are coupled with electrical ground.

6. The semiconductor processing chamber of claim 4, wherein the semiconductor processing chamber further comprises a spacer between the first showerhead and the faceplate, and wherein the first showerhead, the faceplate, and the spacer are configured to at least partially define a plasma processing region within the semiconductor processing chamber.

7. The semiconductor processing chamber of claim 3, wherein the pedestal is coupled with an electrical source, and wherein the second showerhead is coupled with electrical ground.

8. The semiconductor processing chamber of claim 7, wherein the pedestal and the second showerhead are configured to at least partially define a plasma processing region within the processing region of the semiconductor processing chamber.

9. The semiconductor processing chamber of claim 1, wherein the first showerhead is positioned within the semiconductor processing chamber having the first end of each channel facing a faceplate, and having the second end of each channel proximate a processing region of the semiconductor processing chamber.

10. The semiconductor processing chamber of claim 1, wherein the first showerhead is positioned within the semiconductor processing chamber having the first end of each channel proximate a processing region of the semiconductor processing chamber, and having the second end of each channel facing a faceplate.

11. The semiconductor processing chamber of claim 1, wherein a surface of the first showerhead is adjacent the processing region of the semiconductor processing chamber, and wherein the surface is coated.

12. The semiconductor processing chamber of claim 1, wherein the first diameter is at least about 2.5 mm, and wherein a diameter of each port is less than or about 1.2 mm.

13. The semiconductor processing chamber of claim 1, wherein the plurality of ports at the second end of the channel associated with each channel are each defined within a diameter of the channel.

14. The semiconductor processing chamber of claim 1, wherein the apertures of each subset of apertures are equally spaced about the channel associated with the subset of apertures.

15. The semiconductor processing chamber of claim 1, wherein each subset of apertures comprises six apertures, and wherein each subset of apertures is free of overlap with each other subset of apertures.

16. A plasma processing chamber comprising:
a showerhead comprising:
a first plate defining a plurality of through-holes; and
a second plate coupled with the first plate, wherein the second plate defines a first plurality of apertures and a second plurality of apertures, wherein the second plurality of apertures are defined in the second plate in a plurality of groups of apertures including at least two apertures of the second plurality of apertures, wherein each through-hole of the first plate is aligned with at least one group of the plurality of groups of apertures to produce a channel, wherein the first plate and the second plate are coupled with one another to define a volume between the first plate and the second plate, wherein the volume is fluidly accessible from the first plurality of apertures of the second plate, wherein the channels are fluidly isolated from the volume defined between the first plate and the second plate, wherein the first plurality of apertures are defined in the second plate in a plurality of first groups of apertures, wherein each first group of apertures includes at least four apertures of the first plurality of apertures, wherein each first group of apertures surrounds a separate channel.

17. The plasma processing chamber of claim 16, wherein each through-hole is characterized by a diameter of at least about 5 mm.

18. The plasma processing chamber of claim 16, wherein each aperture of the second plurality of apertures is characterized by a diameter of less than or about 1 mm.

19. The plasma processing chamber of claim 16, wherein each group of apertures of the second plurality of apertures includes at least about 6 apertures.

20. The plasma processing chamber of claim 16, wherein the second plate comprises a material resistant to plasma degradation.

\* \* \* \* \*